United States Patent
Onozawa et al.

(10) Patent No.: US 7,579,593 B2
(45) Date of Patent: Aug. 25, 2009

(54) NIGHT-VISION IMAGING APPARATUS, CONTROL METHOD OF THE SAME, AND HEADLIGHT MODULE

(75) Inventors: Kazutoshi Onozawa, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 94 days.

(21) Appl. No.: 11/774,088

(22) Filed: Jul. 6, 2007

(65) Prior Publication Data

US 2008/0029701 A1 Feb. 7, 2008

(30) Foreign Application Priority Data

| Jul. 25, 2006 | (JP) | ................ 2006-201839 |
| Jan. 23, 2007 | (JP) | ................ 2007-012958 |
| Mar. 29, 2007 | (JP) | ................ 2007-089401 |

(51) Int. Cl.
*H01L 31/12* (2006.01)

(52) U.S. Cl. ...................................... 250/332

(58) Field of Classification Search ................... 250/332
See application file for complete search history.

(56) References Cited

U.S. PATENT DOCUMENTS 7,150,552 B2    12/2006 Weidel

| 2003/0066965 A1* | 4/2003 | Abel et al. ................. 250/330 |
| 2003/0155513 A1* | 8/2003 | Remillard et al. ......... 250/341.8 |
| 2003/0230705 A1* | 12/2003 | Stephan et al. ......... 250/214 VT |
| 2006/0285228 A1 | 12/2006 | Ishii et al. |
| 2007/0035721 A1 | 2/2007 | Toshikiyo et al. |

FOREIGN PATENT DOCUMENTS

| DE | 4007646 | 9/1991 |
| JP | 200345210 | 2/2003 |

OTHER PUBLICATIONS

English language Abstract of JP 2003-45210.
English language Abstract of DE 4007646.

* cited by examiner

*Primary Examiner*—David P Porta
*Assistant Examiner*—Marcus H Taningco
(74) *Attorney, Agent, or Firm*—Greenblum & Bernstein P.L.C.

(57) ABSTRACT

The invention provides a night-vision imaging apparatus including: a light emission unit that emits infrared light; a solid-state imaging device that converts the infrared light into a first signal; a light-emission control unit that allows the light emission unit to emit the infrared light which is modulated according to a temporally pseudo-random first modulation; and an extraction unit that extracts, according to the first modulation, a signal corresponding to the infrared light emitted by the light emission unit from the first signal.

21 Claims, 53 Drawing Sheets

NIGHT-VISION IMAGING APPARATUS, CONTROL METHOD OF THE SAME, AND HEADLIGHT MODULE

BACKGROUND OF THE INVENTION (1) Field of the Invention

The present invention relates to a night-vision imaging apparatus, a headlight module, and a control method of the night-vision imaging apparatus. In particular, the present invention relates to a night-vision imaging apparatus which emits infrared light.

(2) Description of the Related Art

It is dangerous for a driver to drive a vehicle at nighttime due to poor visibility. An incidence of accidents during nighttime hours is much higher than an incidence of accidents during daytime hours at which the driver is good in visibility.

At nighttime, for example, a visible distance obtained by a low beam is short in bidirectional traffic, and most drivers fail in visible judgment. Consequently, the drivers are late with recognition of unilluminated obstacles, pedestrians, unlit bicycles and animals, leading to accidents. Under bad weather conditions such as rain, fog and snow, further, the visibility of the driver becomes worse.

In night driving, conventionally, a headlight for a vehicle switches between a low beam and a high beam in consideration of dazzling of a driver on an oncoming vehicle. Herein, the low beam is used for illuminating a road surface while the high beam is used for extending a visible distance. However, the switching operation between the low beam and the high beam is burdensome. In addition, use of the high beam disadvantageously causes dazzling of a pedestrian or a driver on an oncoming vehicle.

In order to solve such a problem, there has been proposed a night-vision imaging apparatus for a vehicle. According to this apparatus, far-infrared light generated from human beings and animals is captured by a far-infrared camera, and an image taken from the captured light is displayed. However, such a far-infrared camera capable of capturing far-infrared light is considerably expensive.

There has been also proposed a night-vision imaging apparatus for a vehicle. According to this apparatus, a bundle of near-infrared light at a wavelength of about 1 μm is emitted to a forward area of a vehicle, a bundle of the light reflected from an object on the forward area of the vehicle is received by a camera, and an image is taken from the received light.

For example, Japanese Unexamined Patent Application Publication No. 2003-045210 discloses a night-vision imaging apparatus for a vehicle. According to this apparatus, a camera receives a bundle of light reflected from an object on a forward area of a vehicle to take an image from the received light.

In Japanese Unexamined Patent Application Publication No. 2003-045210, a headlight disclosed in DE4007646A1 is described as the prior art. As disclosed in DE4007646A1, the headlight including a night-vision imaging apparatus has two headlights each using, as a light source, a laser diode which emits near-infrared light, in addition to a configuration of a normal headlight. In the headlight disclosed in DE4007646A1, an imaging CCD camera is placed on a roof region of a vehicle. In addition, a visible-light source such as a halogen lamp has a wide spectrum of several hundreds of nanometers in width.

In the case of using the aforementioned headlight including the night-vision imaging apparatus, it is necessary to reduce an influence of light emitted by an oncoming vehicle. In the headlight disclosed in DE4007646A1, for example, an optical bandpass filter is disposed forward an objective lens of the camera. The optical bandpass filter having a narrow transmission band can considerably attenuate visible light emitted by an oncoming vehicle. A spectrum of a laser beam is several nanometers in width; therefore, the optical bandpass filter having the narrow transmission band transmits such a laser beam. In the conventional headlight, further, the laser diode is driven by a pulse and a video camera to be used has an electronic lock operated in synchronization with a laser beam emitted by the laser diode; thus, the light emitted by the oncoming vehicle can be attenuated.

SUMMARY OF THE INVENTION

As described above, a conventional headlight including a night-vision imaging apparatus uses an optical filter in order to reduce an influence of light emitted by an oncoming vehicle. Consequently, if the headlight is identical in structure to a headlight of the oncoming vehicle (that is, if the head light modules use a laser with the same spectrum and an optical filter with the same transmission band), the influence of the light (near-infrared light) emitted by the oncoming vehicle cannot be reduced. In order to reduce the influence of the light emitted by the oncoming vehicle, additionally, the spectrum of the laser and the transmission band of the optical filter must be changed for each vehicle. However, it is actually difficult to implement such a change.

The present invention is devised in view of the aforementioned problems. An object of the present invention is to provide a night-vision imaging apparatus, a headlight module, a vehicle, and a control method of the night-vision imaging apparatus, each of which can readily reduce an influence of light emitted by an oncoming vehicle.

In order to achieve the aforementioned object, the night-vision imaging apparatus according to the present invention includes: a light emission unit that emits infrared light; a solid-state imaging device that converts the infrared light into a first signal; a light-emission control unit that allows the light emission unit to emit the infrared light which is modulated according to a temporally pseudo-random first modulation; and an extraction unit that extracts, according to the first modulation, a signal corresponding to the infrared light emitted by the light emission unit from the first signal.

According to the present invention, the night-vision imaging apparatus emits infrared light modulated in a temporally pseudo-random manner, and extracts a signal according to the modulation. As a result, infrared-light emission patterns become unique to each vehicle. Therefore, the night-vision imaging apparatus can extract only the infrared light emitted thereby. Thus, the night-vision imaging apparatus according to the present invention can reduce an influence of light emitted by a headlight of an oncoming vehicle.

Furthermore, it is possible that the night-vision imaging apparatus further includes a pulse generation unit that generates a pulse signal modulated in a temporally pseudo-random manner using a spread spectrum system, wherein the light-emission control unit allows the light emission unit to emit the infrared light at a timing of change of the pulse signal, and the extraction unit extracts the signal corresponding to the infrared light emitted by the light emission unit from the first signal at the timing of change of the pulse signal.

According to the present invention, the night-vision imaging apparatus emits infrared light modulated using a spread spectrum system, and receives the infrared light which is modulated using the spread spectrum system and is reflected from an object. Using the spread spectrum system, the infrared light is spread out over a wide band. Therefore, the night-vision image apparatus can readily separate light in a narrow band, which is emitted by a headlight of an oncoming vehicle, from the infrared light emitted thereby. Thus, the night-vision imaging apparatus according to the present invention can readily reduce an influence of the light emitted by the headlight of the oncoming vehicle. Using the light modulated using the spread spectrum system, further, it is possible to measure relative positions of moving objects on the basis of a difference in arrival time of light.

Furthermore, it is possible that the light emission unit emits first infrared light and second infrared light, the solid-state imaging device includes: a first pixel which converts the first infrared light into the first signal; and a second pixel which converts the second infrared light into a second signal, the light-emission control unit allows the light emission unit to emit the first infrared light which is modulated according to the temporally pseudo-random first modulation, and allows the light emission unit to emit the second infrared light which is modulated according to a temporally pseudo-random second modulation different from the first modulation, and the extraction unit extracts, according to the first modulation, a signal corresponding to the first infrared light emitted by the light emission unit from the first signal, and extracts, according to the second modulation, a signal corresponding to the second infrared light emitted by the light emission unit from the second signal.

According to the present invention, the night-vision imaging apparatus emits first infrared light and second infrared light each modulated in a temporally pseudo-random manner, and receives the first infrared light and the second infrared light each reflected from an object. In the case of using single infrared light modulated in a temporally pseudo-random manner, there arises a period during which no infrared light is emitted due to the modulation. Consequently, there is a loss in an image to be taken. On the other hand, the night-vision imaging apparatus according to the present invention emits two pieces of different infrared light. Therefore, the second infrared light can be emitted when the first infrared light is not emitted, and the first infrared light can be emitted when the second infrared light is not emitted. Accordingly, it is possible to reduce a period during which no infrared light is emitted. Thus, it is possible to take a high-quality image without loss.

Furthermore, it is possible that the first modulation and the second modulation are temporally opposite to each other.

According to the present invention, the night-vision imaging apparatus emits second infrared light when the night-vision imaging apparatus does not emit first infrared light. On the other hand, the night-vision imaging apparatus emits the first infrared light when the night-vision imaging apparatus does not emit the second infrared light. Accordingly, the night-vision imaging apparatus according to the present invention can constantly emit the infrared light and receive the reflected light. Thus, the night-vision imaging apparatus according to the present invention can take a high-quality image without loss.

Furthermore, it is possible that the light emission unit includes: a first infrared LED which emits the first infrared light which is infrared light at a first wavelength; and a second infrared LED which emits the second infrared light which is infrared light at a second wavelength different from the first wavelength, wherein the first pixel converts the infrared light at the first wavelength into the first signal, and the second pixel converts the infrared light at the second wavelength into the second signal.

According to the present invention, the night-vision imaging apparatus emits first infrared light and second infrared light which are different in wavelength from each other, thereby selectively receiving either the first infrared light or the second infrared light emitted thereby.

Furthermore, the night-vision imaging apparatus according to the present invention uses an LED. Therefore, there is no possibility of blindness even when light emitted by the LED gets in eyes of a pedestrian.

Furthermore, it is possible that the light emission unit emits the first infrared light linearly polarized in a first direction, and the second infrared light linearly polarized in a second direction different from the first direction, the first pixel converts, into the first signal, the infrared light linearly polarized in the first direction, and the second pixel converts, into the second signal, the infrared light linearly polarized in the second direction.

According to the present invention, the night-vision imaging apparatus emits first infrared light and second infrared light which are different in direction of polarization from each other, thereby selectively receiving either the first infrared light or the second infrared light emitted thereby. Furthermore, the night-vision imaging apparatus according to the present invention uses polarized light as detection light (probe light), thereby eliminating an influence of ambient light having various directions of polarization.

Furthermore, it is possible that the first direction is orthogonal to the second direction.

According to the present invention, a direction of polarization of first infrared light is orthogonal to a direction of polarization of second infrared light, so that a ratio of polarization becomes largest. Thus, it is possible to improve an S/N ratio.

Furthermore, it is possible that the light emission unit includes: a first infrared LED which emits infrared light; a first polarization unit that linearly polarizes, in the first direction, the infrared light emitted by the first infrared LED; a second infrared LED which emits infrared light; and a second polarization unit that linearly polarizes, in the second direction, the infrared light emitted by the second infrared LED.

According to the present invention, the first polarization device and the second polarization device can generate infrared light linearly polarized in the first direction and infrared light linearly polarized in the second direction, respectively.

Furthermore, it is possible that the light emission unit includes: an infrared LED which emits infrared light; and a polarization unit that linearly polarizes, in one of the first direction and the second direction, the infrared light emitted by the infrared LED.

According to the present invention, infrared light linearly polarized in the first direction and infrared light linearly polarized in the second direction can be generated from infrared light emitted by the single infrared LED.

Furthermore, it is possible that the polarization unit includes: a polarization device that linearly polarizes the infrared light emitted by the infrared LED; and a rotation unit that rotates the polarization device to change a direction polarized by the polarization device to one of the first direction and the second direction.

According to the present invention, infrared light linearly polarized in the first direction and infrared light linearly polarized in the second direction can be generated by rotation of the polarization device.

Furthermore, it is possible that the rotation unit rotates the polarization device at a blanking period.

According to the present invention, a direction of polarization of infrared light can be changed without exerting an influence on an imaging operation.

Furthermore, it is possible that the polarization unit includes: a polarization device that linearly polarizes the infrared light emitted by the infrared LED; a liquid crystal device that shifts a phase of the infrared light linearly polarized by the polarization device; and a voltage application unit that changes a voltage to be applied to the liquid crystal device to change an amount of shift of the phase shifted by the liquid crystal device.

According to the present invention, a direction of polarization can be readily changed at a high speed when a voltage to be applied to the liquid crystal device is changed.

Furthermore, it is possible that the voltage application unit changes the voltage to be applied to the liquid crystal device at a blanking period.

According to the present invention, a direction of polarization of infrared light can be changed without exerting an influence on an imaging operation.

Furthermore, it is possible that the night-vision imaging apparatus further includes: a detection unit that determines whether an intensity of at least one of the first signal and the second signal is equal to or more than a predetermined intensity; and a light attenuation unit that attenuates infrared light received by the solid-state imaging device when the detection unit determines that the intensity of at least one of the first signal and the second signal is equal to or more than the predetermined intensity.

According to the present invention, if a generated signal is saturated due to light emitted by a headlight of an oncoming vehicle, light to be received by the solid-state imaging device can be attenuated. Accordingly, the night-vision imaging apparatus can reduce an influence of the light emitted by the headlight of the oncoming vehicle and extract only the infrared light reflected from an object.

Furthermore, it is possible that the light attenuation unit includes: a polarization device that transmits infrared light having a predetermined linear polarization component; and a rotation unit that rotates the polarization device to attenuate the infrared light received by the solid-state imaging device.

According to the present invention, light can be readily attenuated when a direction polarized by the polarization device is changed.

Furthermore, it is possible that the light attenuation unit includes: a liquid crystal device that shifts a phase of infrared light received by the solid-state imaging device; and a voltage application unit that changes a voltage to be applied to the liquid crystal device to change an amount of shift of the phase shifted by the liquid crystal device.

According to the present invention, a direction of polarization can be readily changed at a high speed and light can be readily attenuated when a voltage to be applied to the liquid crystal device is changed.

Furthermore, it is possible that the night-vision imaging apparatus further includes a white LED which emits white light, wherein the light emission unit lights up when the white LED is on.

According to the present invention, when a user switches a headlight (white LED) on as in the conventional operation, the headlight lights up and, simultaneously, an image taken from infrared light is displayed. This improves user's convenience.

Furthermore, it is possible that the solid-state imaging device includes: a first pixel which converts the infrared light into the first signal; and a second pixel which converts light at a visible wavelength into a second signal.

According to the present invention, it is possible to take an image from visible light during daytime hours and an image from infrared light by means of the pixel having a sensitivity at a wavelength of the visible light and the pixel having a sensitivity at a wavelength of the infrared light. Furthermore, it is possible to readily synthesize the image taken from the infrared light and the image taken from the visible light.

Furthermore, it is possible that the solid-state imaging device includes: a first pixel which has a sensitivity at a wavelength of infrared light; a second pixel which has a sensitivity at a wavelength of red light; a third pixel which has a sensitivity at a wavelength of green light; and a fourth pixel which has a sensitivity at a wavelength of blue light.

According to the present invention, it is possible to take a color image from visible light and an image from infrared light. Furthermore, it is possible to readily synthesize the color image taken from the visible light and the image taken from the infrared light.

Furthermore, it is possible that the light emission unit is used as a light source for a high beam.

According to the present invention, it is possible to stably take an image of a far area even in night driving. Furthermore, infrared light used as a high beam is modulated in a temporally pseudo-random manner and, therefore, does not interfere with a driver on an oncoming vehicle.

Furthermore, it is possible that the solid-state imaging device includes a plurality of pixels, and each of the pixels includes: a light receiving device that receives at least one of infrared light and visible light; and a light transmitting film having refractive index distribution formed on the light receiving device.

According to the present invention, a microlens in the solid-state imaging device can be made of an inorganic material, leading to improvement in light resistance and heat resistance of the night-vision imaging apparatus.

Furthermore, a headlight module according to the present invention is a headlight module mounted on a vehicle, and includes: a light emission unit that emits infrared light; a solid-state imaging device that converts the infrared light into a first signal; a light-emission control unit that allows the light emission unit to emit the infrared light which is modulated according to a temporally pseudo-random first modulation; and an extraction unit that extracts, according to the first modulation, a signal corresponding to the infrared light emitted by the light emission unit from the first signal.

According to the present invention, the headlight module emits infrared light modulated in a temporally pseudo-random manner, and extracts a signal according to the modulation. As a result, infrared-light emission patterns become unique to each vehicle. Therefore, the headlight module can extract only the infrared light emitted thereby. Thus, the headlight module according to the present invention can reduce an influence of light emitted by a headlight of an oncoming vehicle.

Furthermore, the infrared LED emitting infrared light and the solid-state imaging device are integrated into one module. Accordingly, the headlight module can be reduced in size and realized at low cost.

Furthermore, it is possible that the light emission unit includes: a first infrared LED which emits first infrared light; and a second infrared LED which emits second infrared light, the solid-state imaging device includes: a first pixel which converts the first infrared light into the first signal; and a second pixel which converts the second infrared light into a second signal, the light-emission control unit allows the first infrared LED to emit the first infrared light which is modulated according to the temporally pseudo-random first modulation, and allows the second infrared LED to emit the second infrared light which is modulated according to a temporally pseudo-random second modulation different from the first modulation, and the extraction unit extracts, according to the first modulation, a signal corresponding to the first infrared light emitted by the light emission unit from the first signal, and extracts, according to the second modulation, a signal corresponding to the second infrared light emitted by the light emission unit from the second signal, the headlight module further includes: a first module which includes the first infrared LED and the second pixel and is installed in one of a right front side and a left front side of the vehicle; and a second module which includes the second infrared LED and the first pixel and is installed in other than the right front side and the left front side of the vehicle.

According to the present invention, the first module emits first infrared light and the second module receives the reflected first infrared light. Furthermore, the second module emits second infrared light and the first module receives the reflected second infrared light. Furthermore, the first module and the second module are mounted on a front side of a vehicle so as to be spaced away from each other. This prevents the first infrared light and the second infrared light from being received by a pixel before the first infrared light and the second infrared light emitted by the first module and the second module are reflected from an object. Thus, the headlight module according to the present invention can reduce an influence to be exerted, on an image to be taken, by infrared light emitted thereby before the infrared light is reflected from the object.

Furthermore, the first module and the second module are arranged in stereo. Therefore, it is possible to measure relative positions of moving objects on the basis of a difference in arrival time of light.

Furthermore, a control method according to the present invention is a control method of a night-vision imaging apparatus including a light emission unit which emits infrared light and a solid-state imaging device which converts the infrared light into a first signal, the control method includes: allowing the light emission unit to emit the infrared light which is modulated according to a temporally pseudo-random first modulation; and extracting, according to the first modulation, a signal corresponding to the infrared light emitted by the light emission unit from the first signal.

According to the present invention, by the control method of the night-vision imaging apparatus, the night-vision imaging apparatus emits infrared light modulated in a temporally pseudo-random manner, and extracts a signal according to the modulation. As a result, infrared-light emission patterns become unique to each vehicle. Therefore, with the control method of the night-vision imaging apparatus according to the present invention, the night-vision imaging apparatus can extract only the infrared light emitted thereby. Thus, the control method of the night-vision imaging apparatus according to the present invention can reduce an influence of light emitted by a headlight of an oncoming vehicle.

Thus, the present invention can provide a night-vision imaging apparatus, a headlight module, and a control method of the night-vision imaging apparatus, each of which can reduce an influence of light emitted by an oncoming vehicle.

FURTHER INFORMATION ABOUT TECHNICAL
BACKGROUND TO THIS APPLICATION

The disclosure of Japanese Patent Application No. 2006-201839 filed on Jul. 25, 2006, No. 2007-012958 filed on Jan. 23, 2007 and No. 2007-089401 filed on Mar. 29, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

Hereinafter, preferred embodiments of a headlight module according to the present invention are described in detail with reference to the drawings.

First Embodiment

The headlight module according to the first embodiment of the present invention emits infrared light modulated in a temporally pseudo random manner, and captures a signal according to the modulation. As a result, infrared-light emission patterns become unique to each vehicle. Therefore, the headlight module can extract only the infrared light emitted thereby. Thus, it is possible to reduce an influence of light emitted by a headlight of an oncoming vehicle.

First, a configuration of the headlight module according to the first embodiment of the present invention is described.

Figure 1:
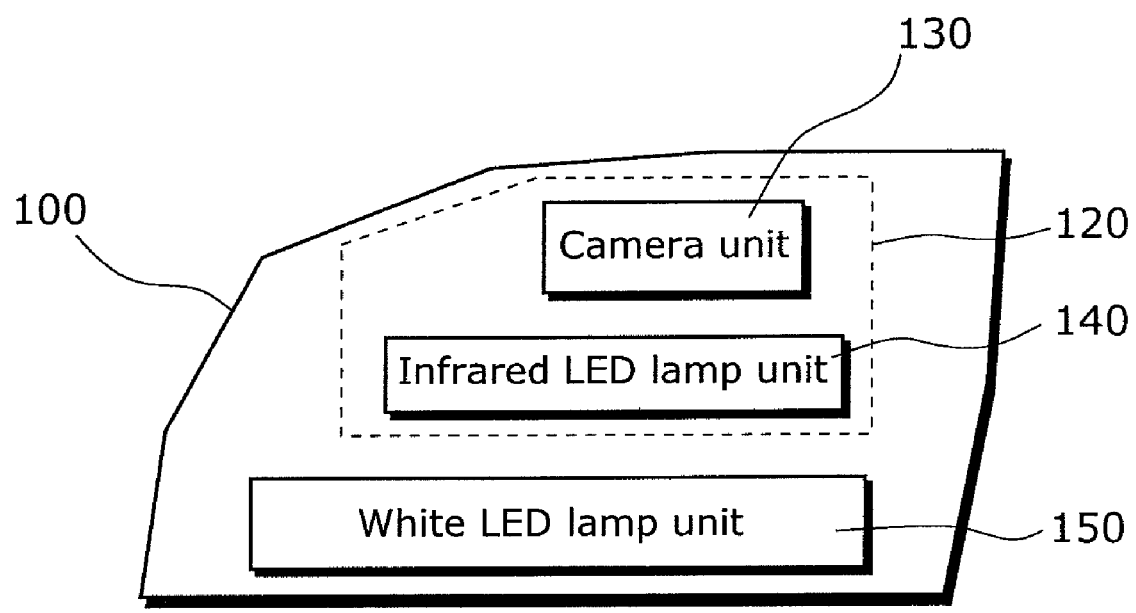
FIG. 1 shows a schematic configuration of a headlight module according to a first embodiment of the present invention.

FIG. 1 shows a schematic configuration of the headlight module according to the first embodiment of the present invention. As shown in FIG. 1, the headlight module 100 includes a night-vision imaging apparatus 120 and a white LED lamp unit 150. The night-vision imaging apparatus 120 includes a camera unit 130 and an infrared LED lamp unit 140.

The infrared LED lamp unit 140 emits infrared light to a forward area of a vehicle on which the headlight module 100 is mounted. Then, the camera unit 130 receives a bundle of the infrared light reflected from an object on the forward area of the vehicle to take an image from the received infrared light. Moreover, the camera unit 130 receives visible light to take an image from the received visible light.

The infrared LED lamp unit 140 emits near-infrared light as a high beam.

The white LED lamp unit 150 emits white light as a low beam. Moreover, the white LED lamp unit 150 changes an angle of emission of the white light so as to use the white light as a high beam. The infrared LED lamp unit 140 constantly lights up when the white LED lamp unit 150 is on. In other words, infrared light is emitted when white light is emitted through a user's operation. As a result, an image taken from the infrared light is displayed to the user. Accordingly, when the user switches the headlight on as in the conventional operation, it is possible that the headlight lights up and, simultaneously, the image taken from the infrared light is displayed. This improves user's convenience.

Herein, the camera unit 130, the infrared LED lamp unit 140 and the white LED lamp unit 150 are provided in this order from above as shown in FIG. 1; however, a placement order and a position of the aforementioned units are not limited to those shown in FIG. 1.

Figure 2:
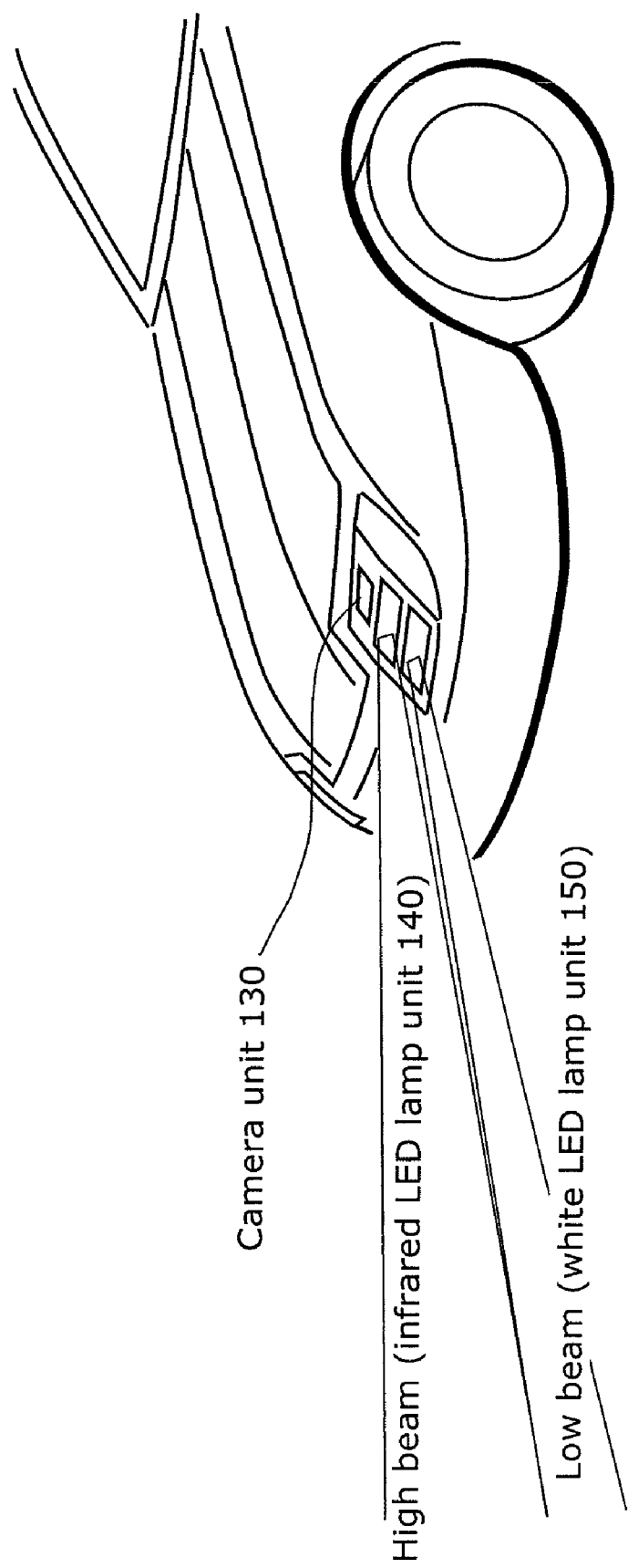
FIG. 2 shows an example that the headlight module according to the first embodiment of the present invention is mounted on an automobile.

FIG. 2 shows an exemplary case that the headlight module 100 according to the first embodiment of the present invention is mounted on an automobile. Moreover, FIG. 2 shows a state that the headlight module 100 emits white light as a low beam and near-infrared light as a high beam. Herein, the camera unit 130 takes an image of a forward area of the automobile. The headlight module 100 according to the first embodiment of the present invention may be mounted on a vehicle such as an automobile, a bus or a truck.

Figure 3:
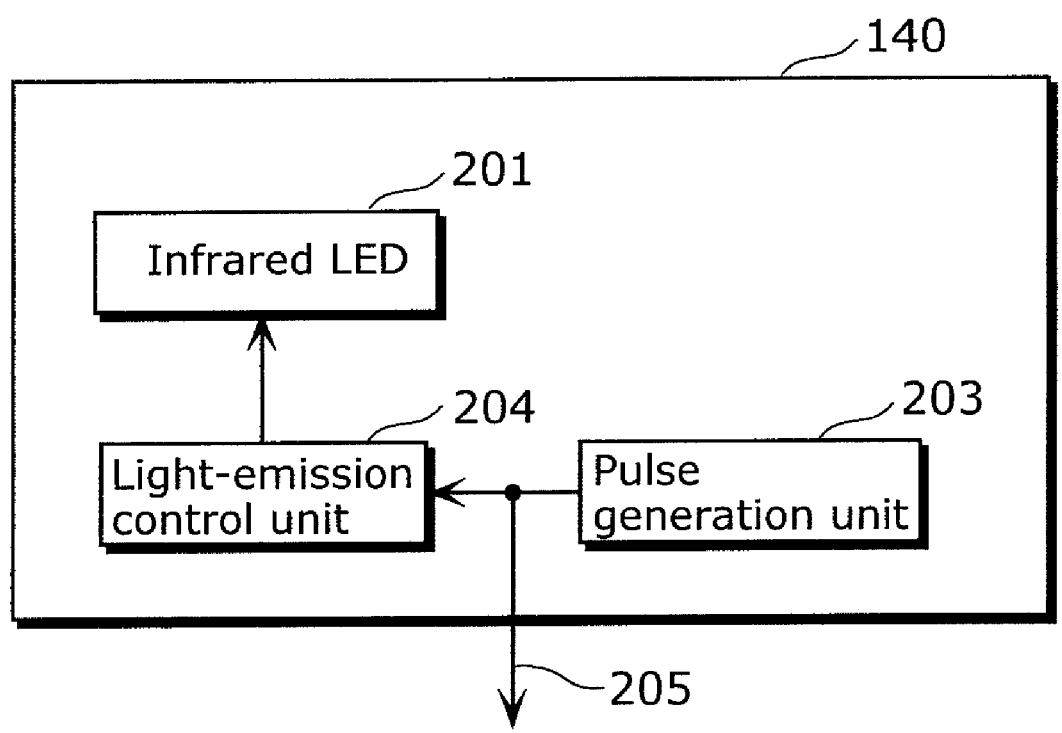
FIG. 3 shows a schematic configuration of an infrared LED lamp unit according to the first embodiment of the present invention.

FIG. 3 shows a block diagram of a configuration of the infrared LED lamp unit 140. As shown in FIG. 3, the infrared LED lamp unit 140 includes an infrared LED 201, a pulse generation unit 203 and a light-emission control unit 204.

The infrared LED 201 emits near-infrared light under control of the light-emission control unit 204.

The pulse generation unit 203 generates a pulse signal 205 modulated in the temporally pseudo-random manner. The pulse generation unit 203 outputs the pulse signal 205 to each of the light-emission control unit 204 and the camera unit 130.

At a timing indicated by the pulse signal 205 from the pulse generation unit 203, the light-emission control unit 204 allows the infrared LED 201 to emit the infrared light modulated in the temporally pseudo-random manner.

Figure 4:
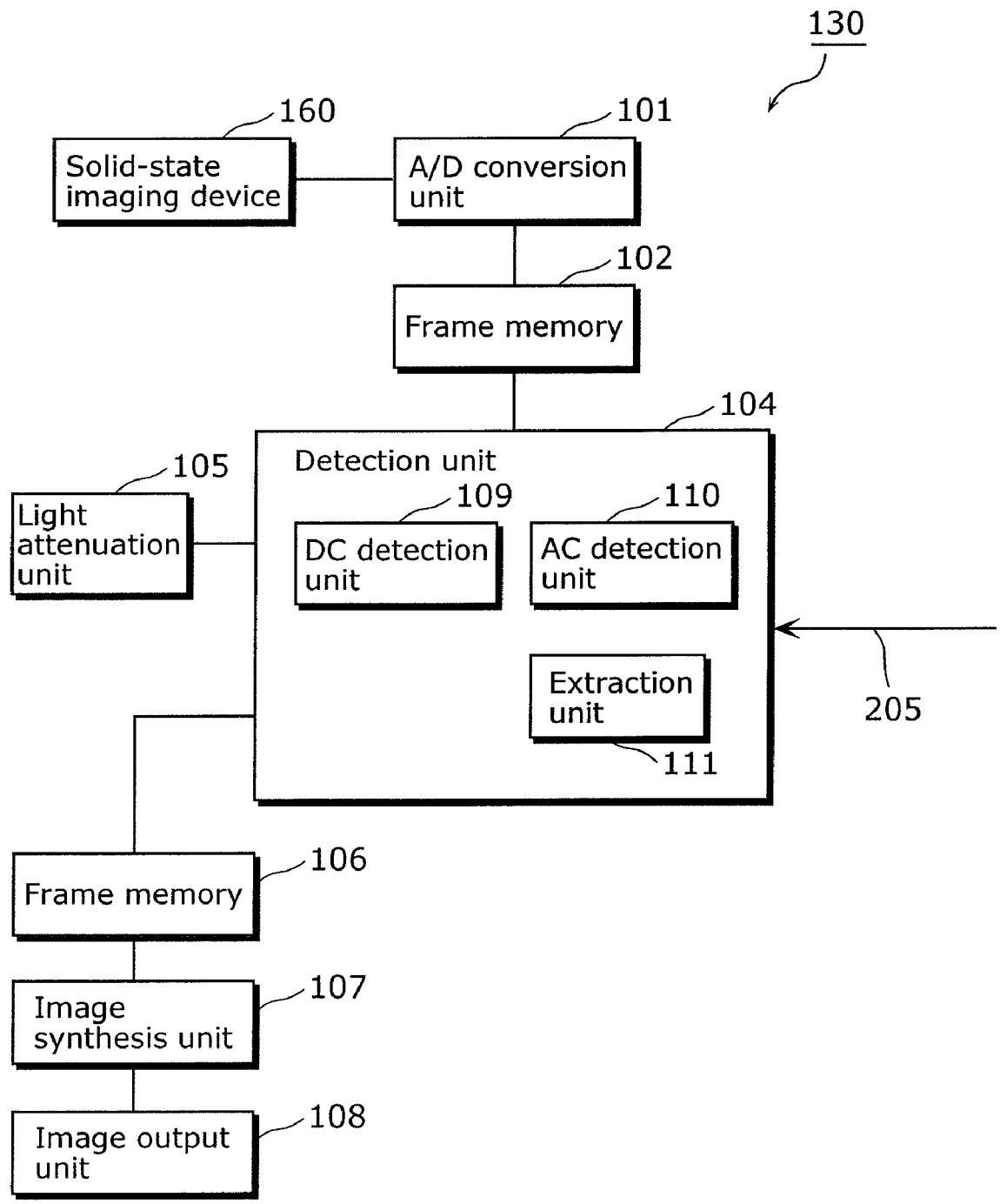
FIG. 4 shows a schematic configuration of a camera unit according to the first embodiment of the present invention.

FIG. 4 shows a block diagram of a configuration of the camera unit 130. As shown in FIG. 4, the camera unit 130 includes a solid-state imaging device 160, an A/D conversion unit 101, a frame memory 102, a detection unit 104, a light attenuation unit 105, a frame memory 106, an image synthesis unit 107 and an image output unit 108.

When the infrared LED lamp unit 140 emits the infrared light to the forward area of the vehicle, the solid-state imaging device 160 receives the infrared light reflected from the object on the forward area, converts the received infrared light into a first signal which is an analog signal, and outputs the first signal to the A/D conversion unit 101. Moreover, the solid-state imaging device 160 receives visible light, converts the received visible light into a second signal which is an analog signal, and outputs the second signal to the A/D conversion unit 101.

The A/D conversion unit 101 receives the first signal and the second signal from the solid-state imaging device 160, and converts each of the first signal and the second signal into a digital signal.

The frame memory 102 receives the digital signal from the A/D conversion unit 101, and stores the digital signal therein.

The detection unit 104 extracts the signal stored in the frame memory 102, at a timing indicated by the pulse signal 205 from the pulse generation unit 203. Moreover, the detection unit 104 removes, for example, the influence of the light emitted by the headlight of the oncoming vehicle, from the signal stored in the frame memory 102. The detection unit 104 includes a DC detection unit 109, an AC detection unit 110 and an extraction unit 111.

The DC detection unit 109 detects a signal having a DC component, which is generated due to the influence of the light emitted by the headlight of the oncoming vehicle, from the signal generated by the solid-state imaging device 160 and stored in the frame memory 102. Moreover, the DC detection unit 109 determines whether an intensity of the signal, which is generated by the solid-state imaging device 160 and is stored in the frame memory 102, is equal to or more than a predetermined intensity.

If the DC detection unit 109 determines that the intensity is equal to or more than the predetermined intensity, the light attenuation unit 105 attenuates the light to be received by the solid-state imaging device 160.

The AC detection unit 110 detects, from the signal stored in the frame memory 102 or a signal obtained from the light attenuation by the light attenuation unit 105, a signal having a component, which is different in timing (frequency characteristic) from a component of the pulse signal 205.

At a timing of change of the pulse signal 205, the extraction unit 111 extracts a signal corresponding to the infrared light emitted by the headlight module 100 from the signal stored in the frame memory 102 or the signal obtained from the light attenuation by the light attenuation unit 105. In other words, the extraction unit 111 extracts, according to the temporally pseudo-random modulation of the infrared light emitted by the infrared LED lamp unit 140, the signal corresponding to the infrared light emitted by the infrared LED lamp unit 140 from the first signal generated by the solid-state imaging device 160. Accordingly, the extraction unit 111 can extract only the signal corresponding to the infrared light emitted by the headlight module 100. Moreover, the extraction unit 111 subtracts the signals, which correspond to the light emitted by the headlight of the oncoming vehicle and are detected by the DC detection unit 109 and the AC detection unit 110, from the signal stored in the frame memory 102 or the signal obtained from the light attenuation by the light attenuation unit 105, thereby extracting the signal corresponding to the infrared light emitted by the headlight module 100.

The frame memory 106 stores therein the signal which corresponds to the infrared light emitted by the headlight module 100, and is extracted by the extraction unit 111.

The image synthesis unit 107 performs correction on an image at a period (frame) during which the headlight module 100 does not emit the infrared light, on the basis of the signal stored in the frame memory 106.

The image output unit 108 outputs the image corrected by the image synthesis unit 107 to, for example, a display unit (display) mounted on an interior of the vehicle, and the display unit displays the image outputted from the image output unit 108.

Herein, the light attenuation unit 105 may be a neutral filter or an aperture.

Next, a configuration of a pixel in the solid-state imaging device 160 and an arrangement of pixels in the solid-state imaging device 160 are described.

Figure 5:
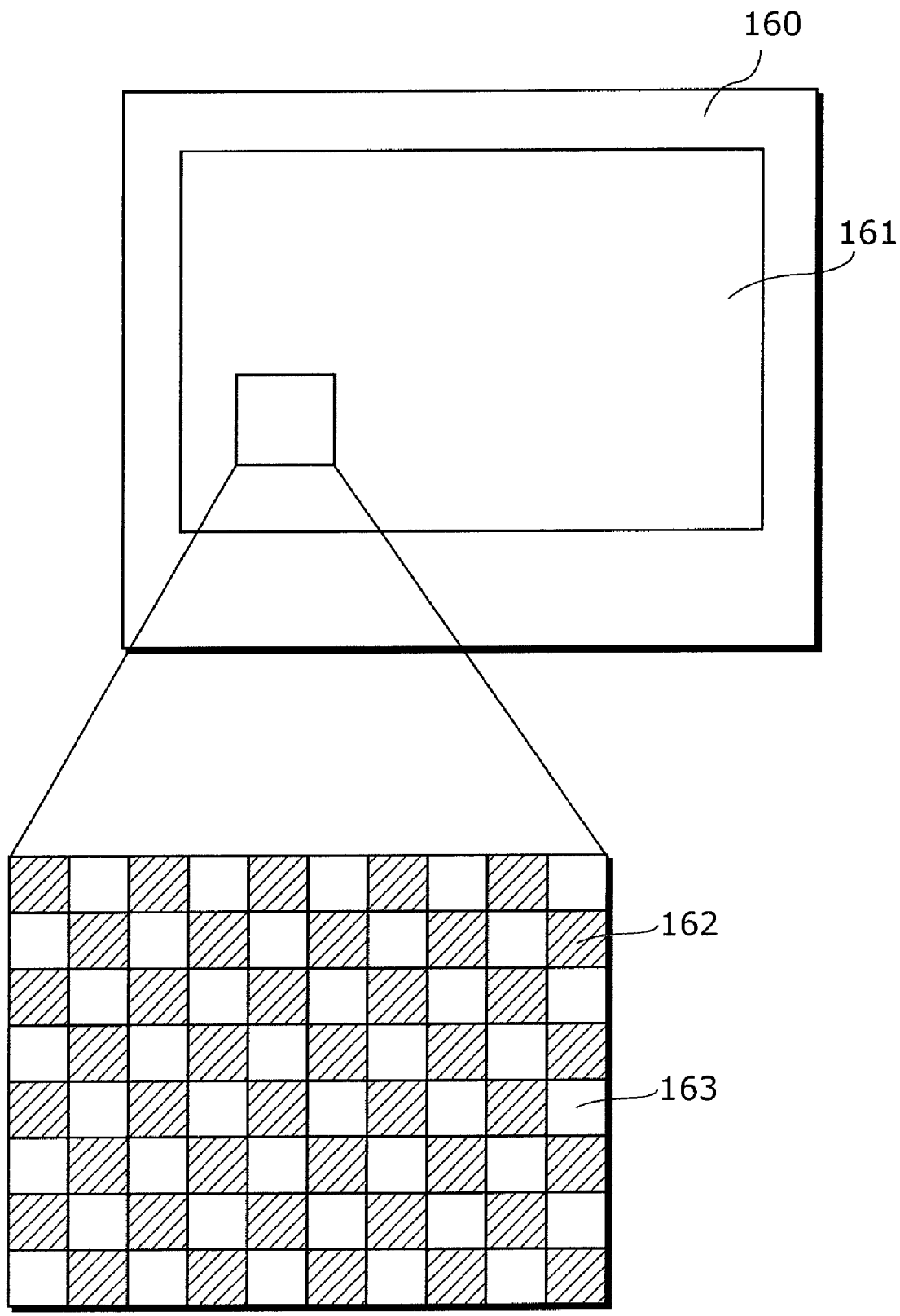
FIG. 5 shows a schematic configuration of a solid-state imaging device according to the first embodiment of the present invention.

FIG. 5 shows a schematic configuration of the solid-state imaging device 160 in the camera unit 130, and an arrangement of pixels in the solid-state imaging device 160. The solid-state imaging device 160 is an imaging device applicable to a digital camera or a cellular phone with a camera function. The solid-state imaging device 160 includes an imaging region 161 on which a plurality of unit pixels (pixel size: 5.6 µm square, for example) are arranged two-dimensionally. The unit pixels arranged on the imaging region 161 include unit pixels 162 each transmitting only infrared light and having a sensitivity at a wavelength of infrared light and unit pixels 163 each transmitting visible light and the infrared light and having a sensitivity at a wavelength of visible light and the wavelength of the infrared light. On the imaging region 161, the unit pixels 162 each transmitting only the infrared light and the unit pixels 163 each transmitting the visible light and the infrared light are arranged in a staggered pattern. Since the unit pixels 162 and the unit pixels 163 are arranged on the imaging region 161, the solid-state imaging device 160 can take an image from the visible light and an image from the infrared light. Furthermore, when the unit pixels 162 and the unit pixels 163 are arranged in the staggered pattern, the image taken from the visible light and the image taken from the infrared light can be synthesized readily.

Figure 6:
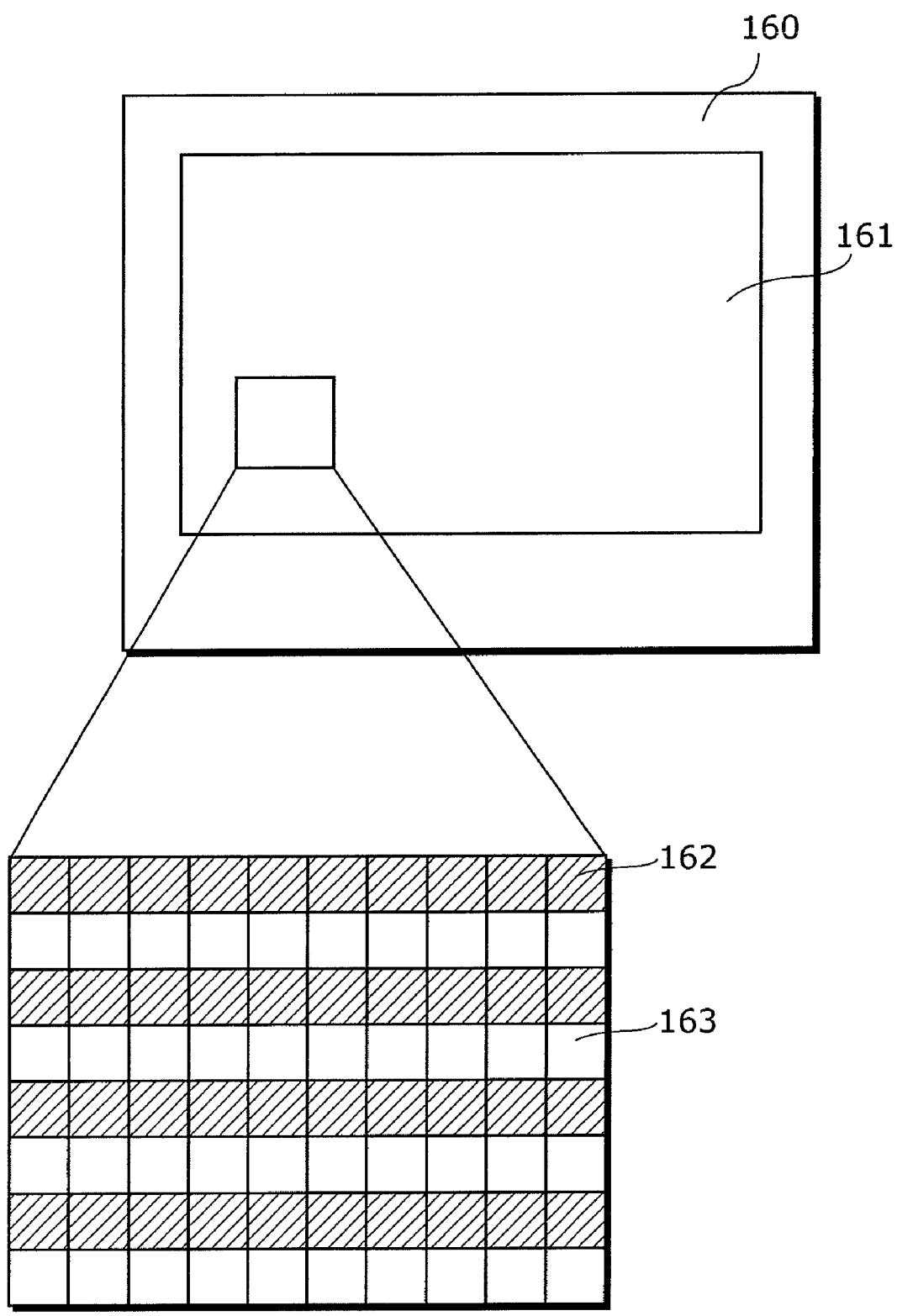
FIG. 6 shows a modified schematic configuration of the solid-state imaging device according to the first embodiment of the present invention.

Herein, the unit pixels 162 and the unit pixels 163 may be arranged in a stripe pattern. FIG. 6 shows the unit pixels 162 and the unit pixels 163 which are arranged in a horizontal stripe pattern. When the unit pixels 162 and the unit pixels 163 are arranged in the horizontal stripe pattern on the imaging region 161, similarly, the images can be synthesized readily. Herein, the unit pixels 162 and the unit pixels 163 may be arranged in a vertical stripe pattern.

Figure 7:
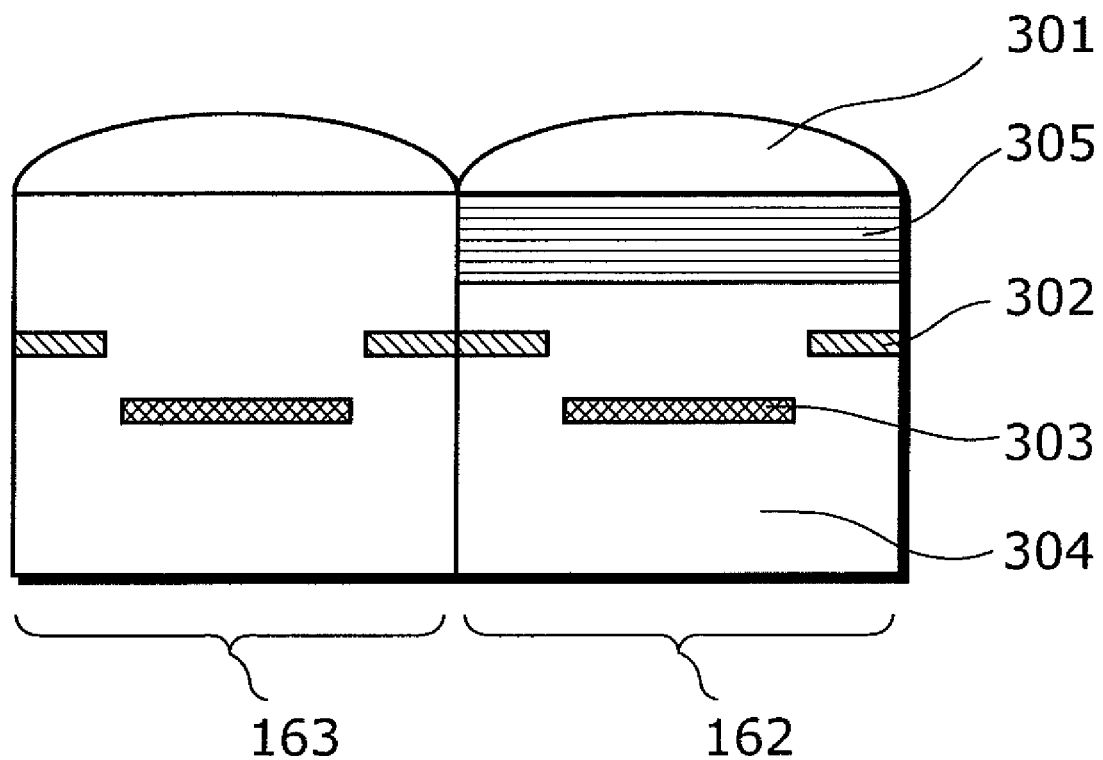
FIG. 7 shows a sectional structure of the solid-state imaging device according to the first embodiment of the present invention.

FIG. 7 shows a sectional structure of the unit pixel 162 having the sensitivity at the wavelength of the infrared light and a sectional structure of the unit pixel 163 having the sensitivity at the wavelength of the visible light and the wavelength of the infrared light.

As shown in FIG. 7, the unit pixel 163 having the sensitivity at the wavelength of the visible light and the wavelength of the infrared light includes a microlens 301, a wiring 302, a light receiving device (Si photodiode) 303 for receiving the visible light and the infrared light, and an Si substrate 304. The unit pixel 162 having the sensitivity at the wavelength of the infrared light includes a visible-light cutting filter 305 in addition to the aforementioned configuration of the unit pixel 163. The visible-light cutting filter 305 cuts off light at the wavelength of the visible light. The visible-light cutting filter 305 is made up of, for example, a lamination film in which $TiO_2$ films and $SiO_2$ films are laminated alternately.

Next, operations performed by the headlight module 100 according to the first embodiment of the present invention are described.

Figure 8:
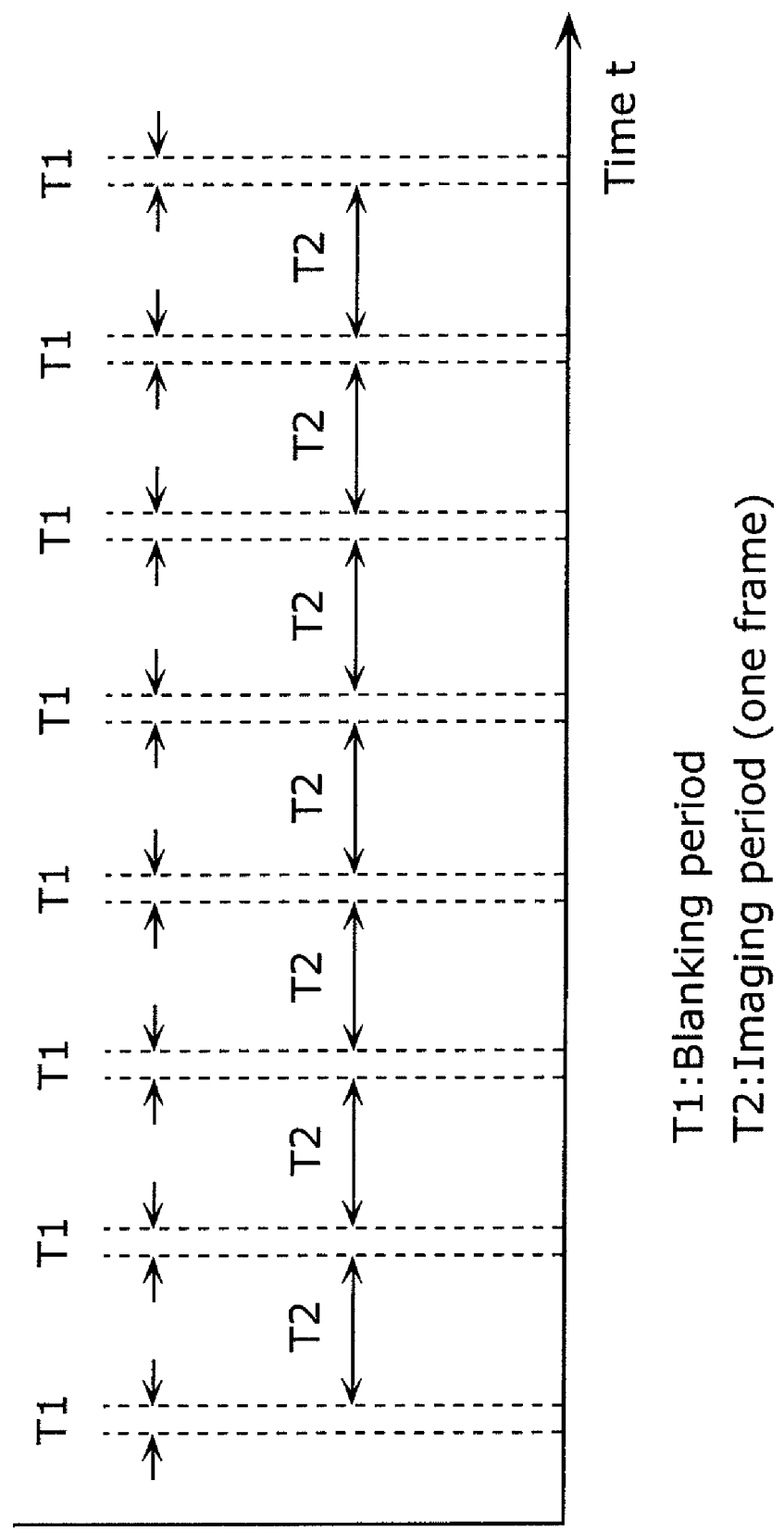
FIG. 8 shows a typical timing chart of a solid-state imaging device.

FIG. 8 shows a typical timing chart of a solid-state imaging device. In FIG. 8, "T1" denotes a blanking period during which the solid-state imaging device captures no signal, and "T2" denotes an imaging period (one frame) during which the solid-state imaging device captures a signal. In the typical timing chart, blanking periods T1 are equal in length to each other and imaging periods T2 are equal in length to each other.

Figure 9:
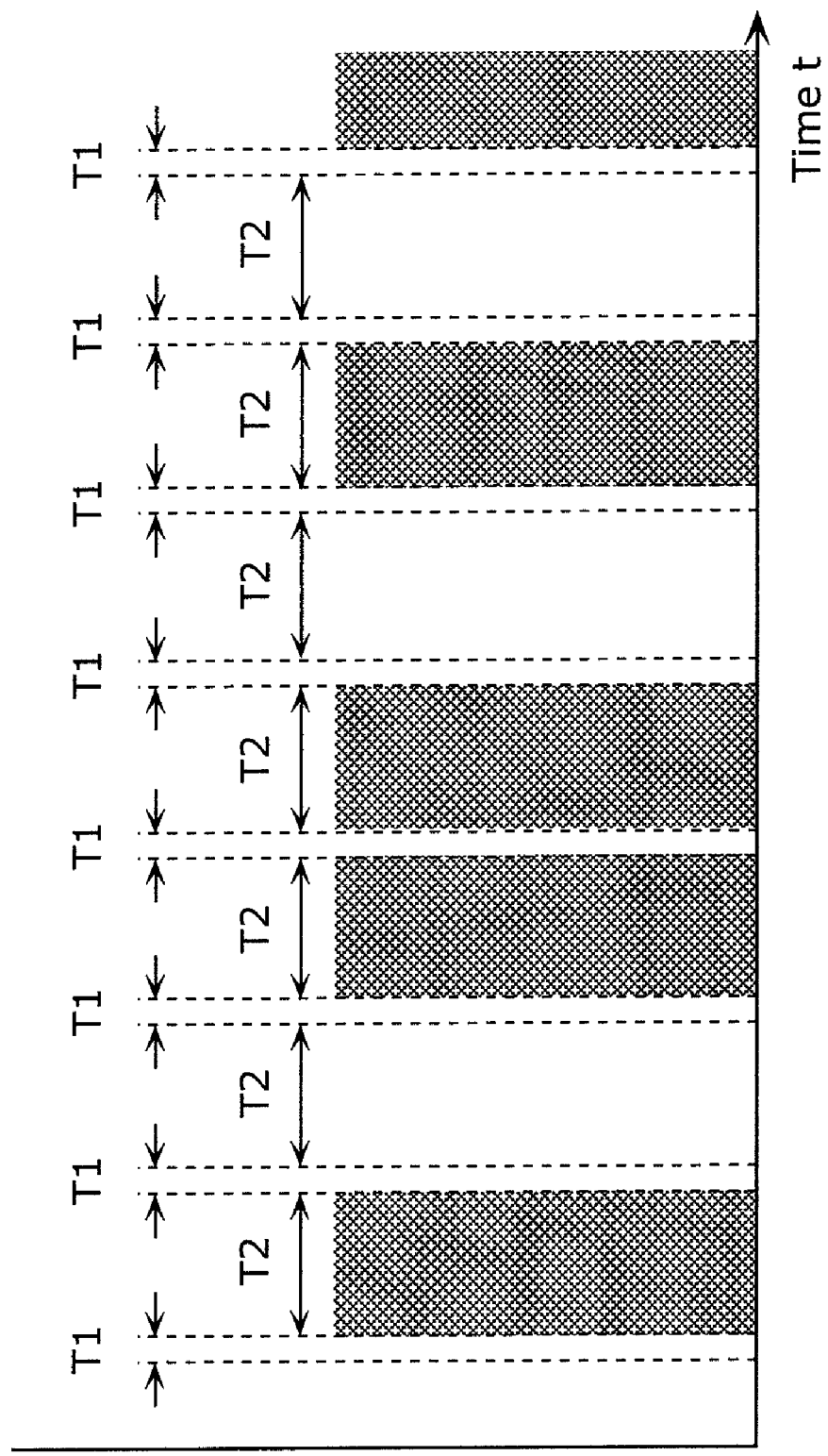
FIG. 9 shows a timing of emission of infrared light by an infrared LED according to the first embodiment of the present invention.

FIG. 9 shows a timing of emission of the infrared light by the infrared LED lamp unit 140 in the headlight module 100 according to the first embodiment of the present invention. As shown in FIG. 9, the infrared LED lamp unit 140 emits the infrared light modulated in the temporally pseudo-random manner. Accordingly, it is possible to reduce the influence of the light emitted by the headlight of the oncoming vehicle. As shown in FIG. 9, the infrared LED lamp unit 140 selects, in the temporally pseudo-random manner, either a frame during which the infrared LED 201 emits the infrared light or a frame during which the infrared LED 201 does not emit the infrared light. For example, the infrared LED 201 of the infrared LED lamp unit 140 emits the infrared light at the timing indicated by the pulse signal 205 from the pulse generation unit 203.

Figure 10:
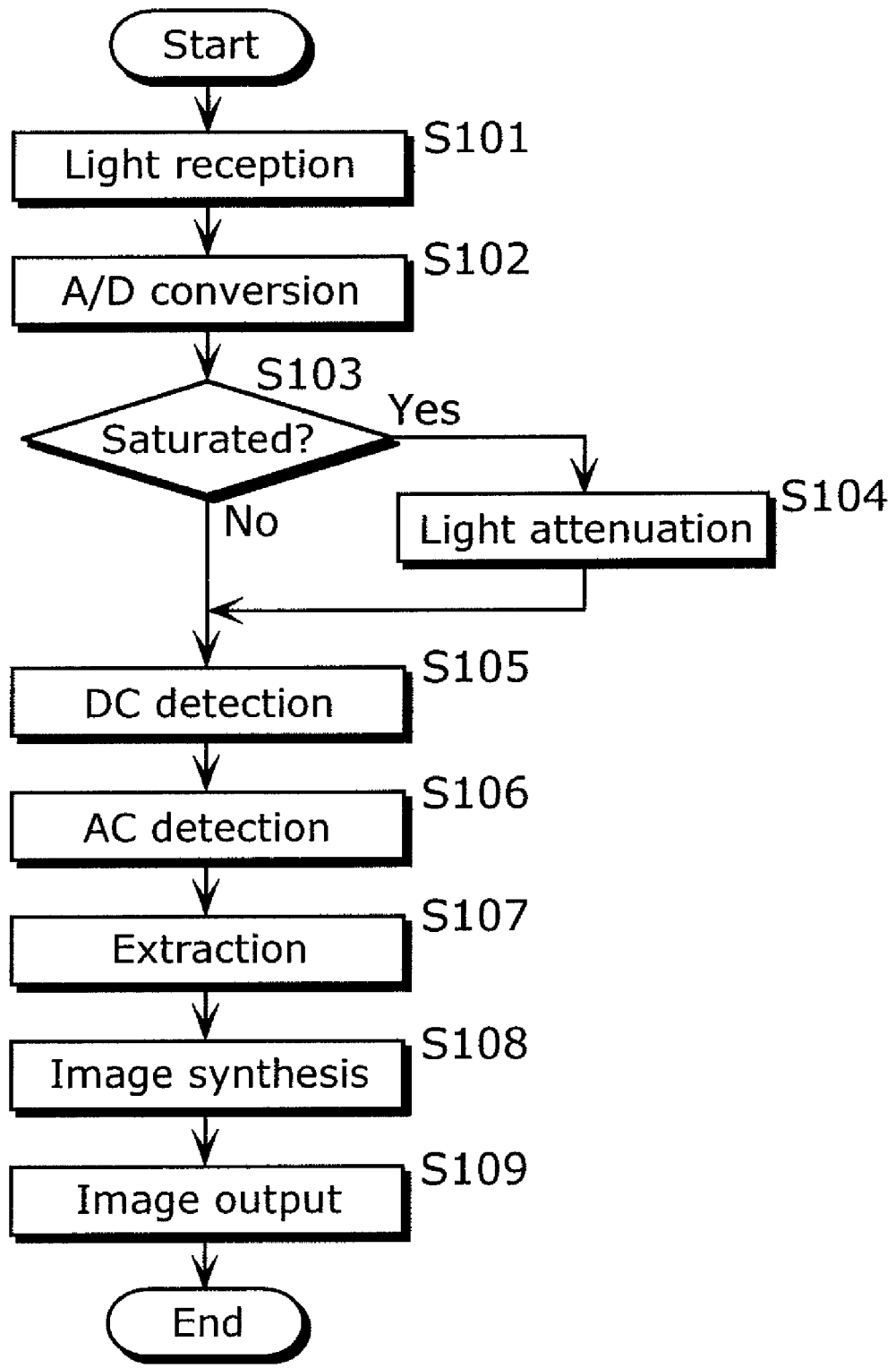
FIG. 10 shows a flow chart of processes performed by the camera unit according to the first embodiment of the present invention.

FIG. 10 shows a flow chart of operations performed by the camera unit 130 of the headlight module 100 according to the first embodiment of the present invention.

When the infrared LED lamp unit 140 emits the infrared light to the forward area of the vehicle on which the headlight module 100 is mounted, first, the solid-state imaging device 160 receives the infrared light reflected from the object on the forward area (S101).

Figure 11:
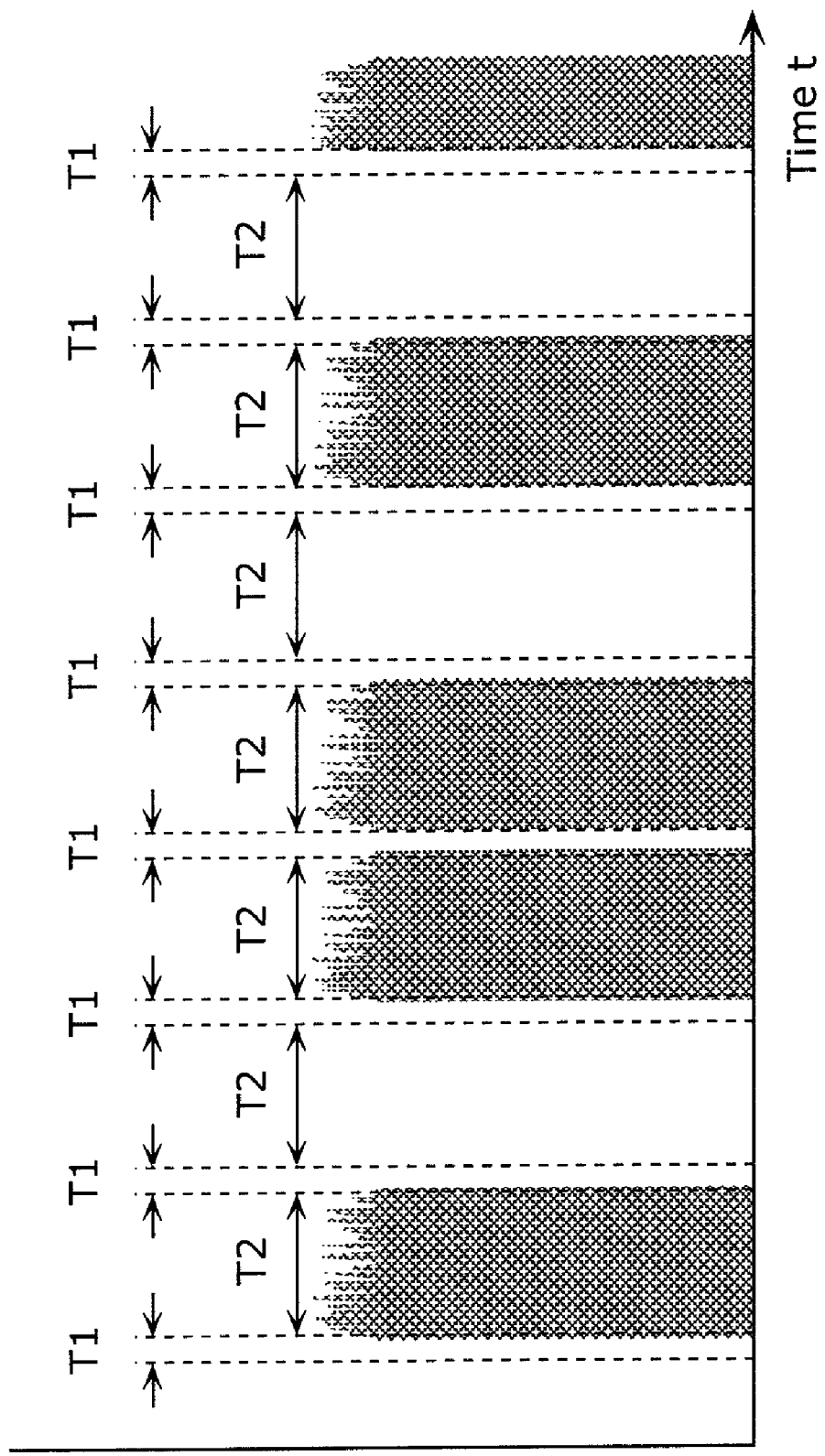
FIG. 11 shows an exemplary output signal from a unit pixel, which transmits only infrared light, in the solid-state imaging device according to the first embodiment of the present invention.

FIG. 11 shows an output signal IR1 outputted from the unit pixel 162 having the sensitivity at the wavelength of the infrared light modulated in the temporally pseudo-random manner and emitted at the timing shown in FIG. 9. As shown in FIG. 11, the unit pixel 162 outputs the output signal IR1 modulated in the temporally pseudo-random manner, at the timing when the infrared LED lamp unit 140 emits the infrared light. Herein, timings of emission and modulation of the light emitted by the headlight of the oncoming vehicle are different in pattern from those shown in FIGS. 9 and 11. Accordingly, the camera unit 130 captures the output signal IR1 outputted from the unit pixel 162 of the solid-state imaging device 160 at the timing when the infrared LED lamp unit 140 emits the infrared light. As a result, the headlight module 100 can readily reduce the influence of the light emitted by the headlight of the oncoming vehicle. Thus, the headlight module 100 can extract only the first infrared light emitted thereby.

Specifically, the solid-state imaging device 160 outputs the output signal IR1 at the timing shown in FIG. 11. The A/D conversion unit 101 receives the analog signal (output signal IR1) from the solid-state imaging device 160, and converts the analog signal into a digital signal (S102). The frame memory 102 stores therein the digital signal obtained from the A/D conversion by the A/D conversion unit 101. The DC detection unit 109 of the detection unit 104 determines whether or not the signal stored in the frame memory 102 is saturated due to, for example, the light emitted by the headlight of the oncoming vehicle (S103). In other words, the DC detection unit 109 determines whether a signal level of the signal generated by the solid-state imaging device 160 is equal to or more than a predetermined signal level.

Figure 12:
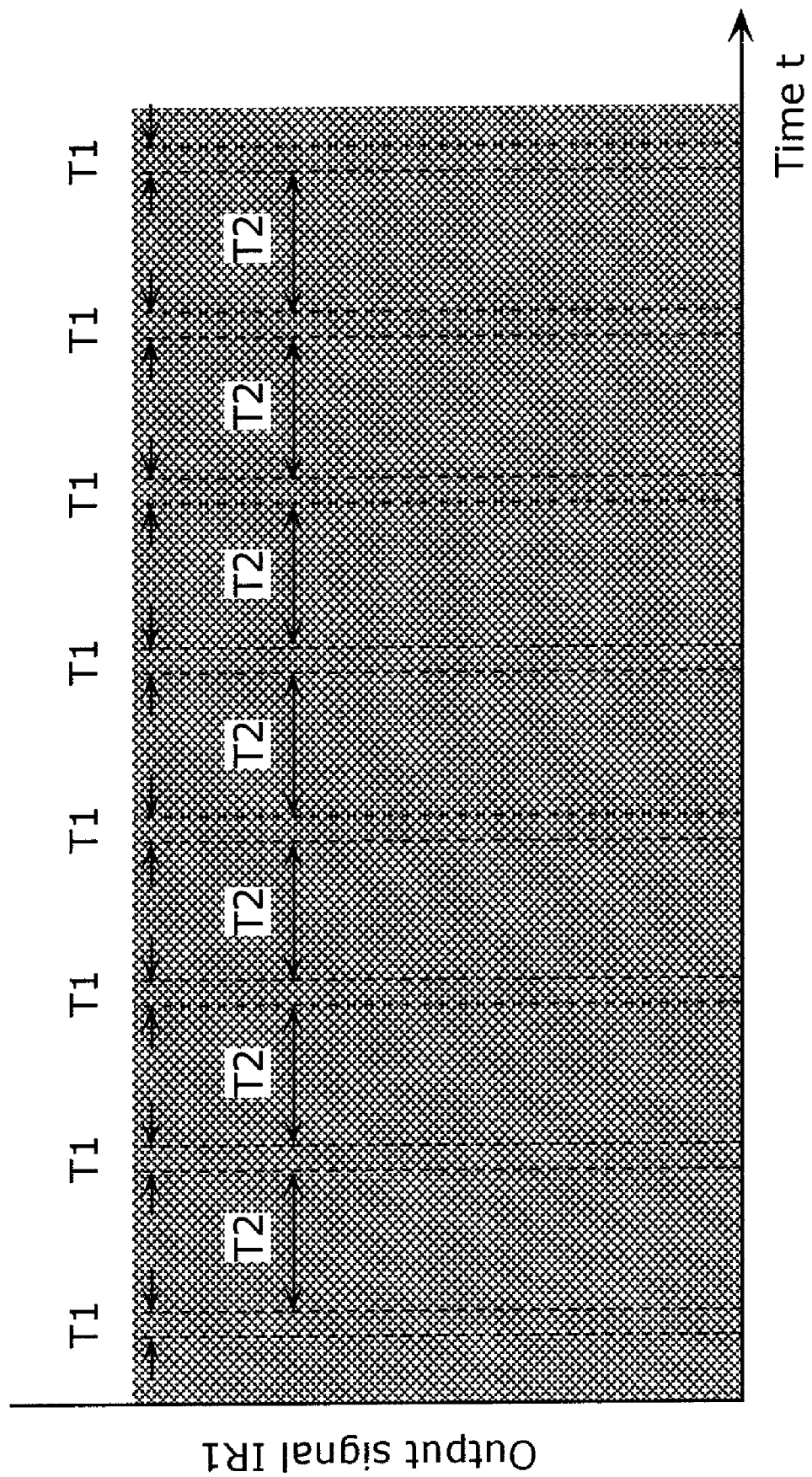
FIG. 12 shows an exemplary saturated state of an output signal from the solid-state imaging device according to the first embodiment of the present invention.

FIG. 12 shows an exemplary case that the output signal IR1 from the solid-state imaging device 160 is saturated. As shown in FIG. 12, if the output signal IR1 is saturated ("Yes" in S103), the light attenuation unit 105 attenuates the light to be received by the solid-state imaging device 160 until the signal stored in the frame memory 102 has a predetermined intensity (S104). Examples of the light attenuation unit 105 include an optical aperture, an ND (Neutral Density) filter and the like.

Figure 13:
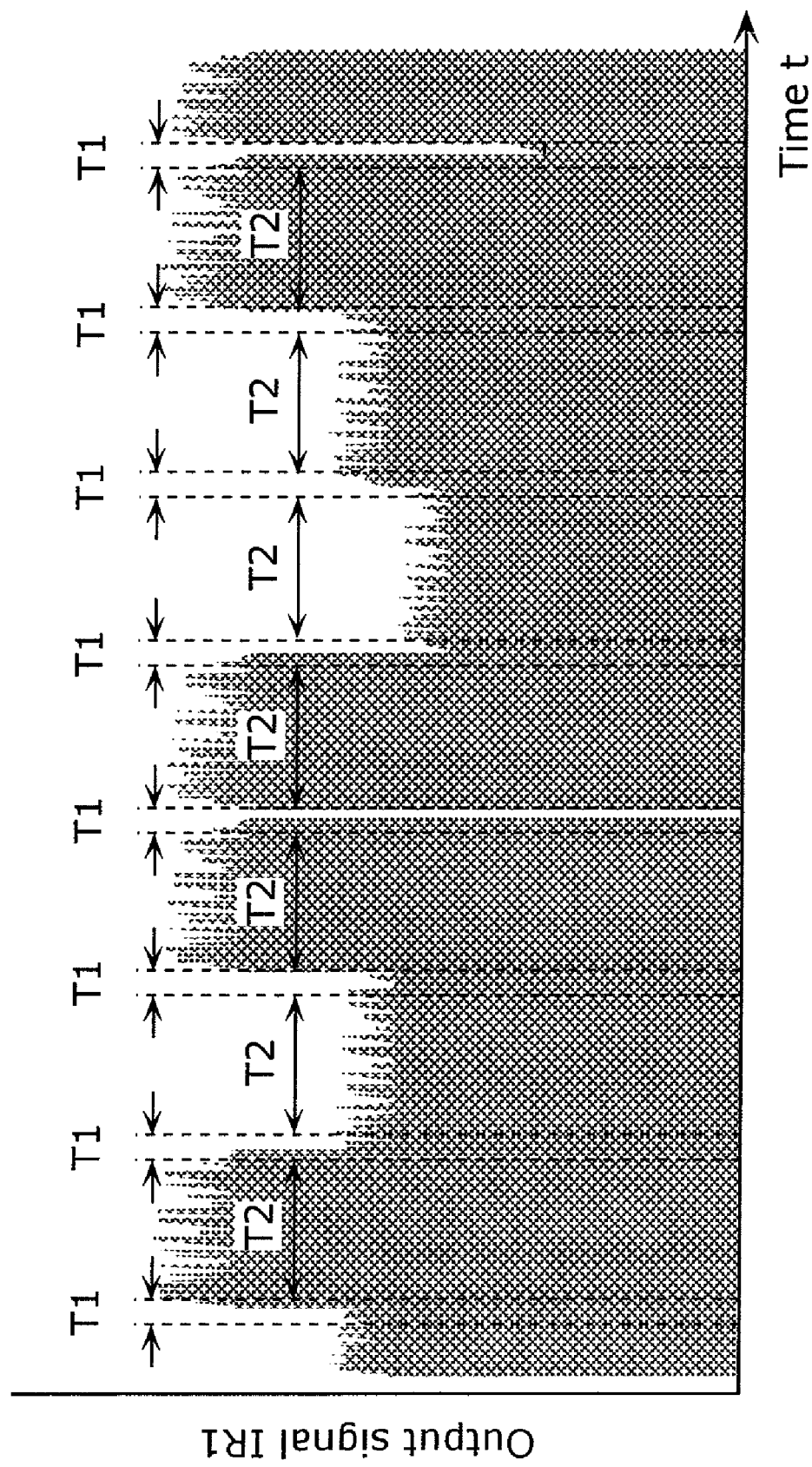
FIG. 13 shows an output signal from the solid-state imaging device according to the first embodiment of the present invention after performance of light attenuation.

FIG. 13 shows a case where the saturated output signal IR1 shown in FIG. 12 is subjected to light attenuation by the light attenuation unit 105. As shown in FIG. 13, a signal can be extracted from the output signal IR1 by the light attenuation even when the output signal IR1 is saturated due to the light emitted by the headlight of the oncoming vehicle.

If the DC detection unit 109 determines that the output signal IR1 is not saturated ("No" in S103) or after the light attenuation (S104), the DC detection unit 109 detects a signal having a DC component, which is generated due to the influence of the light emitted by the headlight of the oncoming vehicle (S105). For example, the DC detection unit 109 detects a signal level of the signal outputted from the unit pixel 162 at a period during which the infrared LED lamp unit 140 does not emit the infrared light, thereby detecting the signal having the DC component, which is generated due to the influence of the light emitted by the headlight of the oncoming vehicle.

Next, the AC detection unit 110 detects a signal corresponding to light different in frequency component from the infrared light emitted by the infrared LED lamp unit 140, on the basis of the pulse signal 205 (S106). Herein, an order of the DC detection (S105) and the AC detection (S106) may be optional. For example, the DC detection may be performed after the AC detection. Alternatively, the DC detection and the AC detection may be performed simultaneously.

The extraction unit 111 removes the signal having the DC component, which is generated due to the light emitted by the headlight of the oncoming vehicle and is detected by the DC detection unit 109 in Step S105, and the signal having the AC component, which is generated due to the light emitted by the headlight of the oncoming vehicle and is detected by the AC detection unit 110 in Step S106, from the signal stored in the frame memory 102, and extracting only a component of the infrared light emitted by the infrared LED lamp unit 140 (S107). The frame memory 106 stores therein a signal corresponding to the component, which is extracted by the extraction unit 111, of the infrared light emitted by the infrared LED lamp unit 140.

The image synthesis unit 107 synthesizes an image in a frame during which the infrared LED lamp unit 140 does not emit the infrared light, on the basis of the signal stored in the frame memory 106 (S108). For example, the image synthesis unit 107 inserts, to the frame during which the infrared LED lamp unit 140 does not emit the infrared light, an image obtained in an immediately preceding frame during which the infrared LED lamp unit 140 emits the infrared light. When the image synthesis unit 107 synthesizes an image, the image to be displayed gives no uncomfortable feeling to the user.

The image output unit 108 outputs the image synthesized by the image synthesis unit 107 (S109). For example, the image output unit 108 outputs the image to the display unit (display) mounted on the interior of the vehicle, so that the user (driver) can see the image taken from the infrared light and displayed on the display unit.

Figure 14:
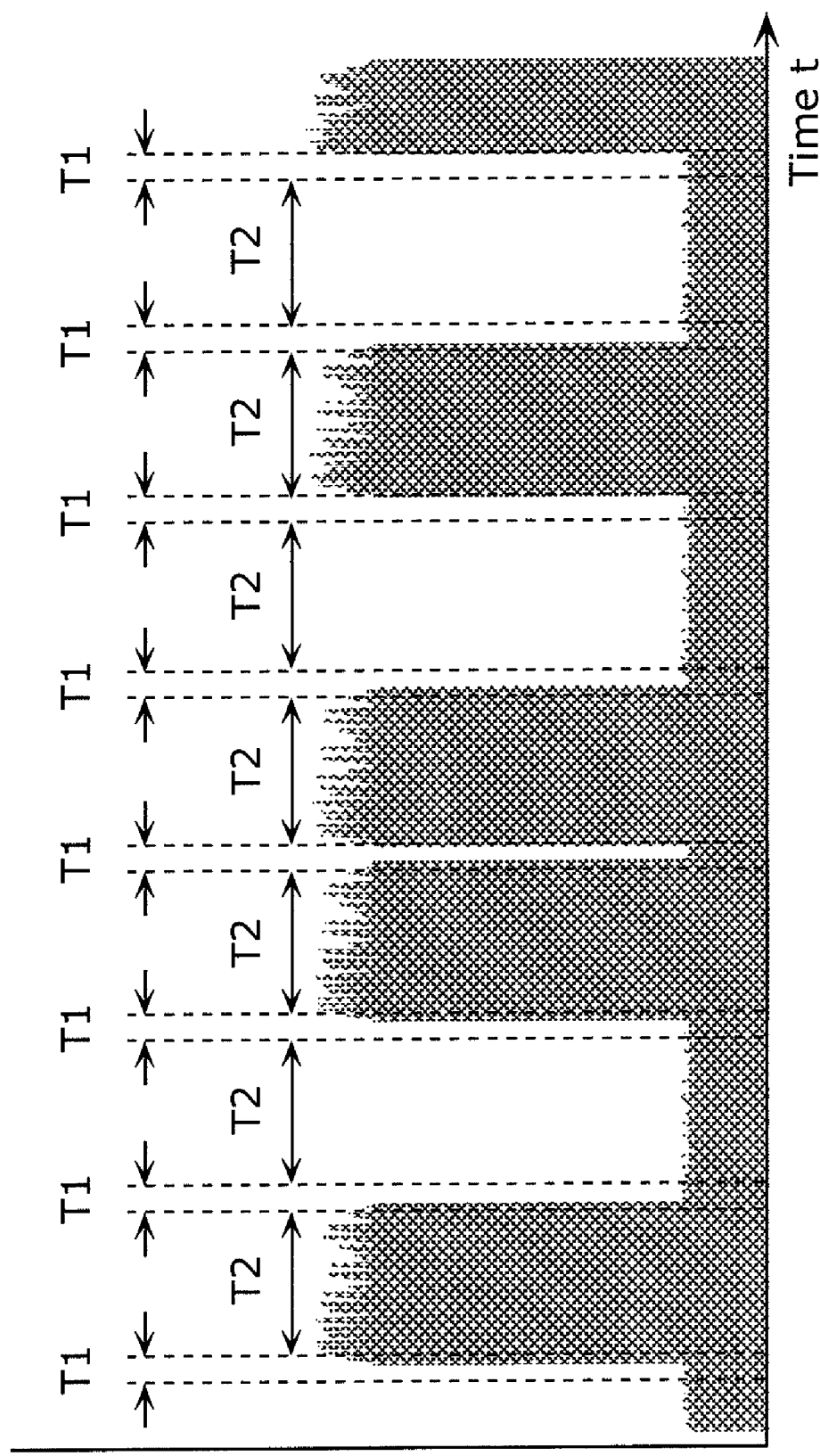
FIG. 14 shows an output signal from a unit pixel, which transmits visible light and infrared light, in the solid-state imaging device according to the first embodiment of the present invention.

FIG. 14 shows an output signal IRGB outputted from the unit pixel 163, having the sensitivity at the wavelength of the visible light and the wavelength of the infrared light, in the solid-state imaging device 160 when the solid-state imaging device 160 receives the infrared light modulated in the temporally pseudo-random manner and emitted at the timing shown in FIG. 9. As shown in FIG. 14, the unit pixel 163 outputs the output signal IRGB which suffers an influence of the visible light and the like and is modulated in the temporally pseudo-random manner as in the infrared light. As in the case of the unit pixel 162, accordingly, the camera unit 130 captures the output signal IRGB according to the temporally pseudo-random modulation. As a result, even in the case of reception of the light emitted by the headlight of the oncoming vehicle, the solid-state imaging device 160 can separate, from the output signal IRGB, the light emitted by the headlight of the oncoming vehicle.

Herein, the light emitted by the headlight of the oncoming vehicle may be separated from the signal obtained by synthesizing the output signal IRGB outputted from the unit pixel 163 and the output signal IR1 outputted from the unit pixel 162 according to the temporally pseudo-random modulation.

Herein, the solid-state imaging device 160 may be a CCD sensor or a MOS sensor. Since the solid-state imaging device 160 reads out a signal at a high speed in a pseudo-random manner, a MOS sensor is preferably used as the solid-state imaging device 160.

In the headlight module 100 according to the first embodiment of the present invention, as described above, the infrared LED lamp unit 140 emits the infrared light modulated in the temporally pseudo-random manner. Accordingly, the timing of emission of the infrared light by the headlight module 100 of the vehicle differs from the timing of emission of the light emitted by the headlight of the oncoming vehicle. As a result, the headlight module 100 can readily reduce the influence of the light emitted by the headlight of the oncoming vehicle and extract only the infrared light emitted thereby. Furthermore, the camera unit 130 requires no optical filter for cutting off the light emitted by the headlight of the oncoming vehicle. Therefore, the camera unit 130 can be reduced in size and realized at low cost. Hence, the headlight module 100 can be reduced in size and realized at low cost.

Also in the headlight module 100 according to the first embodiment of the present invention, the camera unit 130 includes the unit pixel 162 having the sensitivity at the wavelength of the infrared light and the unit pixel 163 having the sensitivity at the wavelength of the visible light and the wavelength of the infrared light. The camera unit 130 can take an image from the visible light during daytime hours by virtue of the unit pixel 163 having the sensitivity at the wavelength of the visible light and the wavelength of the infrared light. Furthermore, the unit pixels 162 and the unit pixels 163 are arranged in the staggered pattern or the stripe pattern. Accordingly, the camera unit 130 can readily synthesize the image taken from the infrared light and the image taken from the visible light.

In addition, the unit pixel 163 receives the visible light, and the infrared light modulated in the temporally pseudo-random manner; therefore, a signal outputted from the unit pixel 163 is also modulated in the temporally pseudo-random manner. Accordingly, the headlight module 100 can readily reduce the influence of the light emitted by the headlight of the oncoming vehicle and extract only the infrared light emitted thereby.

The infrared LED lamp unit 140 constantly emits the infrared light when the white LED lamp unit 150 emits the white light. In other words, the infrared light is emitted when the white light is emitted through the user's operation, so that the user obtains an image taken from the infrared light. Accordingly, when the user switches the headlight on as in the conventional operation, the headlight lights up and, simultaneously, the image taken from the infrared light is displayed. This improves user's convenience.

In addition, the infrared LED lamp unit 140 emits the infrared light as a high beam. Accordingly, it is possible to stably take an image of the far area even in night driving. Furthermore, the infrared light used as a high beam is modulated in the temporally pseudo-random manner and, therefore, does not interfere with the driver on the oncoming vehicle.

Also in the headlight module 100 according to the first embodiment of the present invention, the infrared LED, the white LED and the solid-state imaging device are integrated into one module. Accordingly, the headlight module 100 can be reduced in size and realized at low cost.

Moreover, the headlight module 100 according to the first embodiment of the present invention does not use a laser, but uses an LED. Accordingly, there is no possibility of blindness even when light emitted by the LED gets in eyes of a pedestrian.

In the foregoing description, as shown in FIG. 4, the camera unit 130 includes the solid-state imaging device 160, the A/D conversion unit 101, the frame memory 102, the detection unit 104, the light attenuation unit 105, the frame memory 106, the image synthesis unit 107 and the image output unit 108. Alternatively, all or some of the detection unit 104, the light attenuation unit 105, the frame memory 106, the image synthesis unit 107 and the image output unit 108 may be mounted at any positions of the vehicle.

Also in the foregoing description, the infrared LED lamp unit 140 includes the pulse generation unit 203. Alternatively, the camera unit 130 may include a pulse generation unit, and a pulse signal generated by the pulse generation unit may be transmitted to the infrared LED lamp unit 140. Furthermore, each of the camera unit 130 and the infrared LED lamp unit 140 may include a pulse generation unit which generates a pulse signal with the same pattern.

Second Embodiment

In the headlight module according to the first embodiment of the present invention, the camera unit takes an image from visible light and an image from infrared light. In a headlight module according to the second embodiment of the present invention, on the other hand, a camera unit takes a color image from visible light and an image from infrared light.

First, a configuration of the headlight module according to the second embodiment of the present invention is described.

A schematic configuration of the headlight module according to the second embodiment of the present invention is similar to that shown in FIG. 1; therefore, detailed description thereof will not be given here. In addition, a configuration of a camera unit 130 is similar to that shown in FIG. 4, and a configuration of an infrared LED lamp unit 140 is similar to that shown in FIG. 3.

The headlight module according to the second embodiment of the present invention is different from the headlight module 100 according to the first embodiment of the present invention in a configuration of a solid-state imaging device 160.

Figure 15:
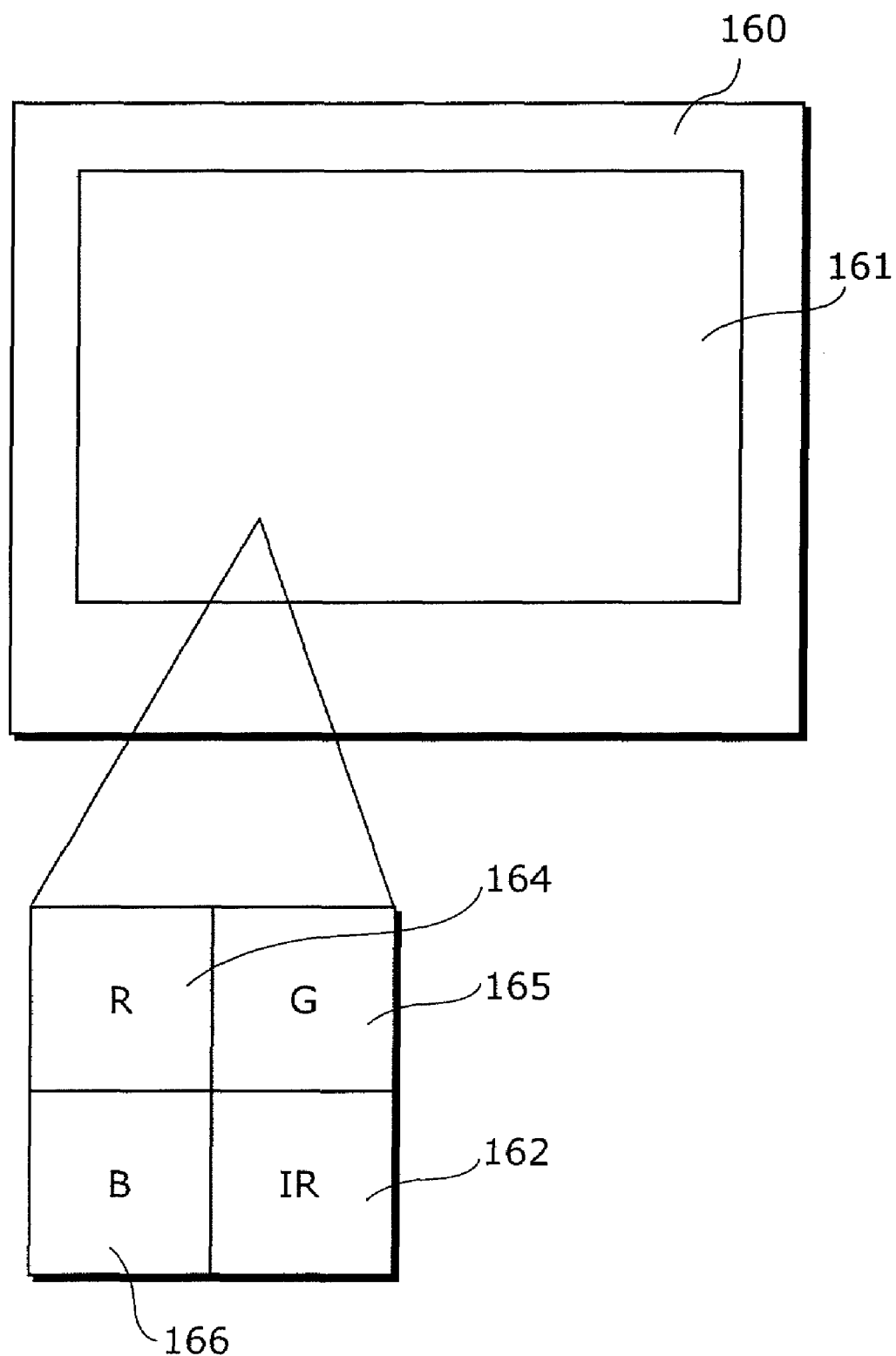
FIG. 15 shows a schematic configuration of a solid-state imaging device according to a second embodiment of the present invention.

FIG. 15 shows a schematic configuration of the solid-state imaging device 160 in the camera unit 130 according to the second embodiment of the present invention, and an arrangement of pixels in the solid-state imaging device 160. As in the first embodiment of the present invention, the solid-state imaging device 160 shown in FIG. 15 includes an imaging region 161 on which a plurality of unit pixels (pixel size: 5.6 μm square, for example) are arranged two-dimensionally. The unit pixels arranged on the imaging region 161 are unit pixels 162 each transmitting only infrared light and having a sensitivity at a wavelength of the infrared light, unit pixels 164 each transmitting red light and the infrared light and having a sensitivity at a wavelength of the red light and the wavelength of the infrared light, unit pixels 165 each transmitting green light and the infrared light and having a sensitivity at a wavelength of the green light and the wavelength of the infrared light, and unit pixels 166 each transmitting blue light and the infrared light and having a sensitivity at a wavelength of the blue light and the wavelength of the infrared light. On the imaging region 161, a set of four unit pixels 162, 164, 165 and 166 is arranged in a square pattern. When the unit pixels 162, 164, 165 and 166 are arranged as described above, the solid-state imaging device 160 can take a color image from the visible light and an image from the infrared light. Furthermore, since the set of unit pixels 162, 164, 165 and 166 are arranged in the square pattern, the color image taken from the visible light and the image taken from the infrared light can be synthesized readily.

Figure 16:
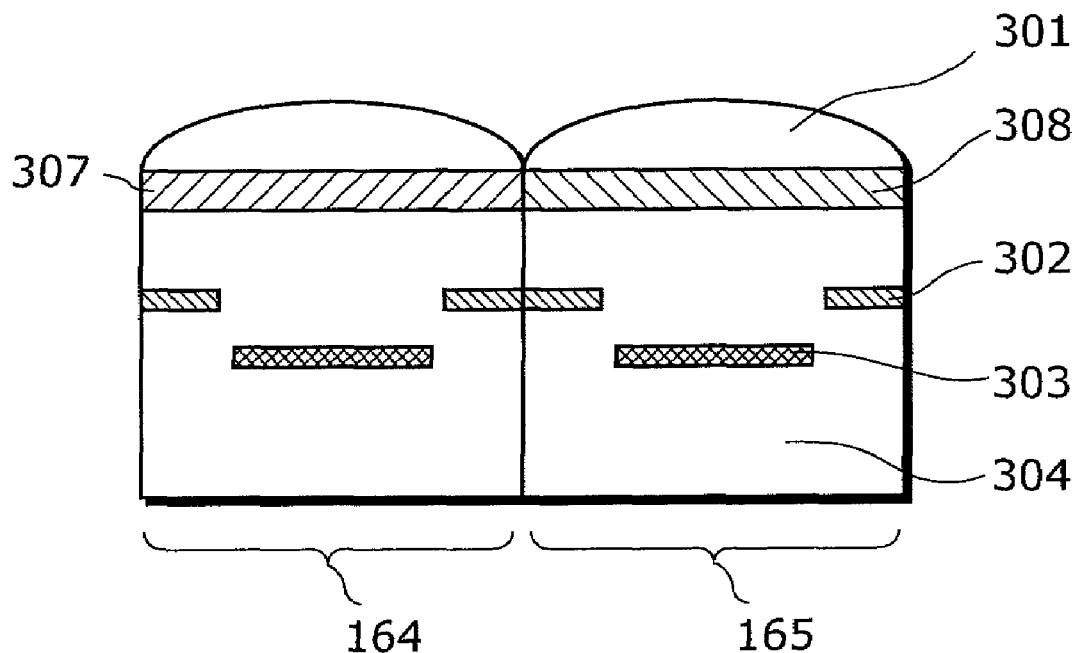
FIG. 16 shows a sectional structure of the solid-state imaging device according to the second embodiment of the present invention.
Figure 17:
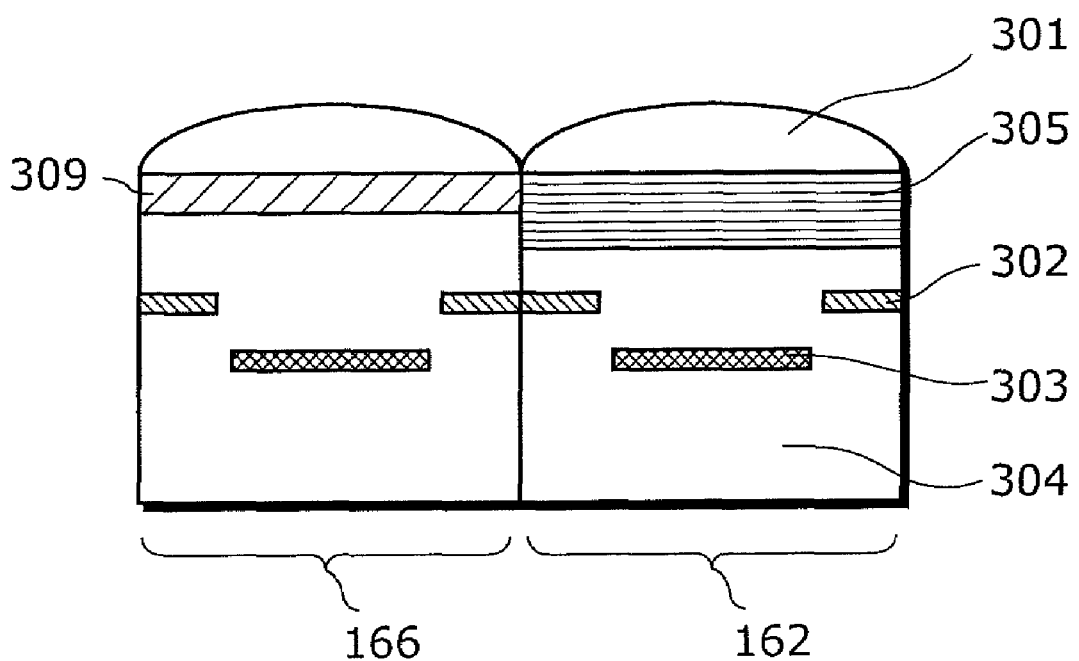
FIG. 17 shows a sectional structure of the solid-state imaging device according to the second embodiment of the present invention.

FIG. 16 schematically shows sectional structures of the unit pixels 164 and 165. FIG. 17 schematically shows sectional structures of the unit pixels 162 and 166. In FIGS. 16 and 17, similar constituent elements to those in FIG. 7 are denoted by identical reference numerals to those in FIG. 7; therefore, detailed description thereof will not be given here.

As shown in FIG. 17, a configuration of the unit pixel 162 transmitting only the infrared light is similar to that described in the first embodiment of the present invention. The unit pixel 162 includes a microlens 301, a wiring 302, a light receiving device 303, an Si substrate 304 and a visible-light cutting filter 305.

The visible-light cutting filter 305 is made up of, for example, a lamination film in which $TiO_2$ films and $SiO_2$ films are laminated alternately.

The unit pixel 164 transmitting the red light and the infrared light is similar in configuration to the unit pixel 162 except that a color filter 307 is provided in place of the visible-light cutting filter 305. The color filter 307 transmits the red light and the infrared light, but cuts off the green light and the blue light.

The unit pixel 165 transmitting the green light and the infrared light is similar in configuration to the unit pixel 162 except that a color filter 308 is provided in place of the visible-light cutting filter 305. The color filter 308 transmits the green light and the infrared light, but cuts off the red light and the blue light.

The unit pixel 166 transmitting the blue light and the infrared light is similar in configuration to the unit pixel 162 except that a color filter 309 is provided in place of the visible-light cutting filter 305. The color filter 309 transmits the blue light and the infrared light, but cuts off the red light and the green light.

Next, operations performed by the headlight module according to the second embodiment of the present invention are described.

As in the first embodiment of the present invention, the infrared light emitted by the infrared LED lamp unit 140 is modulated in a temporally pseudo-random manner. The infrared light is emitted at the timing shown in FIG. 9, for example. Accordingly, it is possible to reduce an influence of light emitted by a headlight of an oncoming vehicle.

Also as in the first embodiment of the present invention, an output signal from the unit pixel 162 transmitting only the infrared light when the solid-state imaging device 160 receives the infrared light modulated in the temporally pseudo-random manner and emitted at the timing shown in FIG. 9 is modulated in the temporally pseudo-random manner as shown in FIG. 11. The solid-state imaging device 160 reads out a signal according to the timing when the headlight module emits the infrared light. As a result, the headlight module can readily reduce the influence of the light emitted by the headlight of the oncoming vehicle and extract only the infrared light emitted thereby.

An output signal IRGB from the unit pixel 164, 165 or 166 transmitting the visible light such as the red light, the green light or the blue light and the infrared light when the solid-state imaging device 160 receives the infrared light modulated in the temporally pseudo-random manner and emitted at the timing shown in FIG. 9 is similar to that shown in FIG. 14. Specifically, the unit pixel 164, 165 or 166 outputs the output signal IRGB which suffers an influence of the visible light and is modulated in the temporally pseudo-random manner as in the infrared light. Accordingly, the solid-state imaging device 160 reads out the output signal IRGB according to the temporally pseudo-random modulation. As a result, even in the case of reception of the light emitted by the headlight of the oncoming vehicle, the solid-state imaging device 160 can separate, from the output signal IRGB, the light emitted by the headlight of the oncoming vehicle.

Herein, the light emitted by the headlight of the oncoming vehicle may be separated from the signal synthesized by the output signals IRGB outputted from the unit pixels 164, 165 and 166 and the output signal IR1 outputted from the unit pixel 162 according to the temporally pseudo-random modulation.

As described above, the headlight module according to the second embodiment of the present invention has the following advantages in addition to the advantages of the headlight module 100 according to the first embodiment of the present invention. That is, the solid-state imaging device 160 includes the unit pixel 162 transmitting only the infrared light, the unit pixel 164 transmitting the red light and the infrared light, the unit pixel 165 transmitting the green light and the infrared light and the unit pixel 166 transmitting the blue light and the infrared light, thereby taking the color image from the visible light and the image from the infrared light. Furthermore, a set of the unit pixel 162 transmitting only the infrared light, the unit pixel 164 transmitting the red light and the infrared light, the unit pixel 165 transmitting the green light and the infrared light and the unit pixel 166 transmitting the blue light and the infrared light is arranged in the square pattern. Therefore, the color image taken from the visible light and the image taken from the infrared light can be readily synthesized.

Third Embodiment

A headlight module according to the third embodiment of the present invention emits infrared light modulated using a spread spectrum system.

A schematic configuration of the headlight module according to the third embodiment of the present invention is similar to that shown in FIG. 1; therefore, detailed description thereof will not be given here. In addition, a configuration of a camera unit 130 is similar to that shown in FIG. 4, and a configuration of an infrared LED lamp unit 140 is similar to that shown in FIG. 3.

Figure 18:
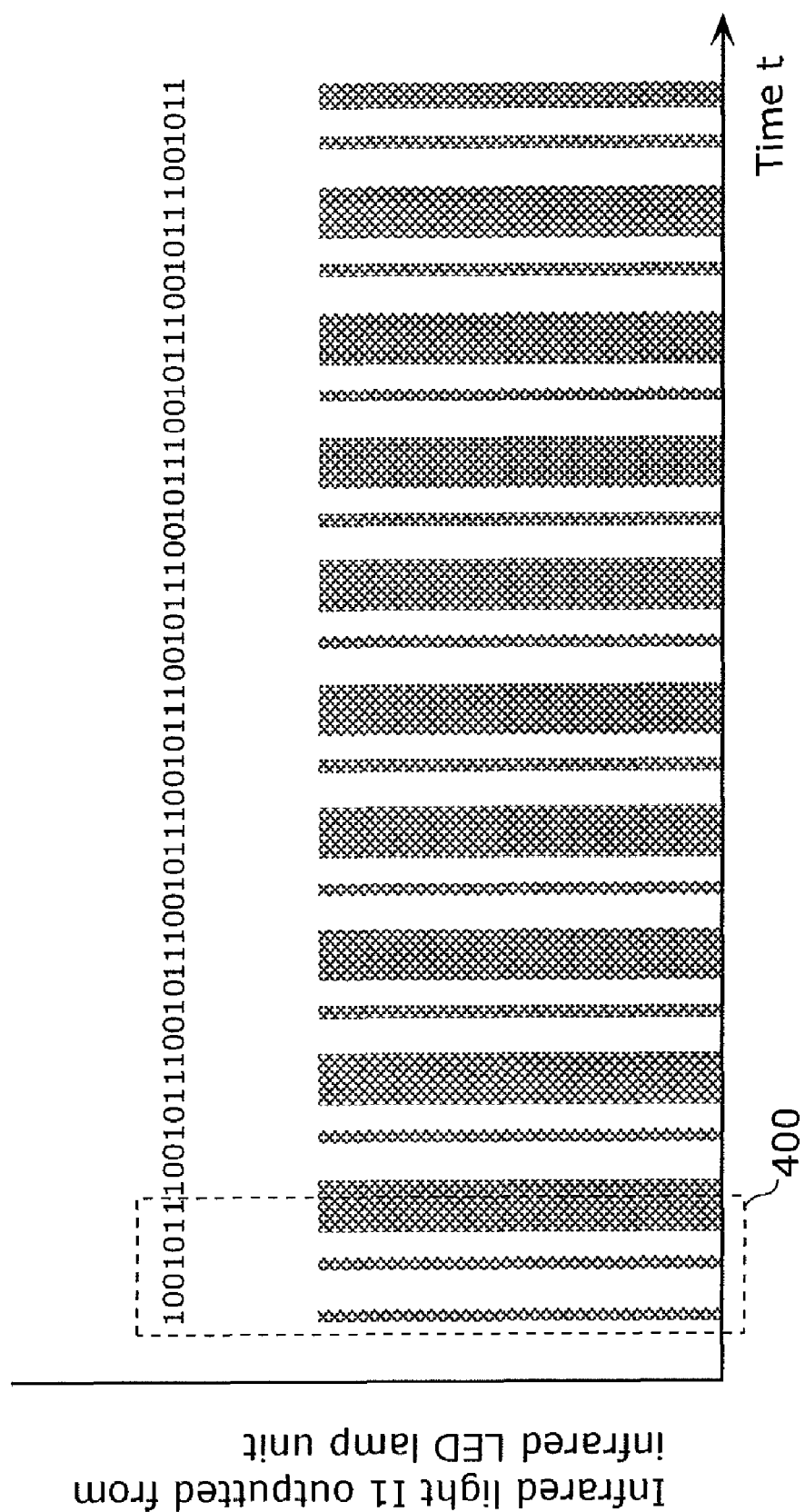
FIG. 18 shows a timing of emission of infrared light by an infrared LED according to a third embodiment of the present invention.
Figure 19:
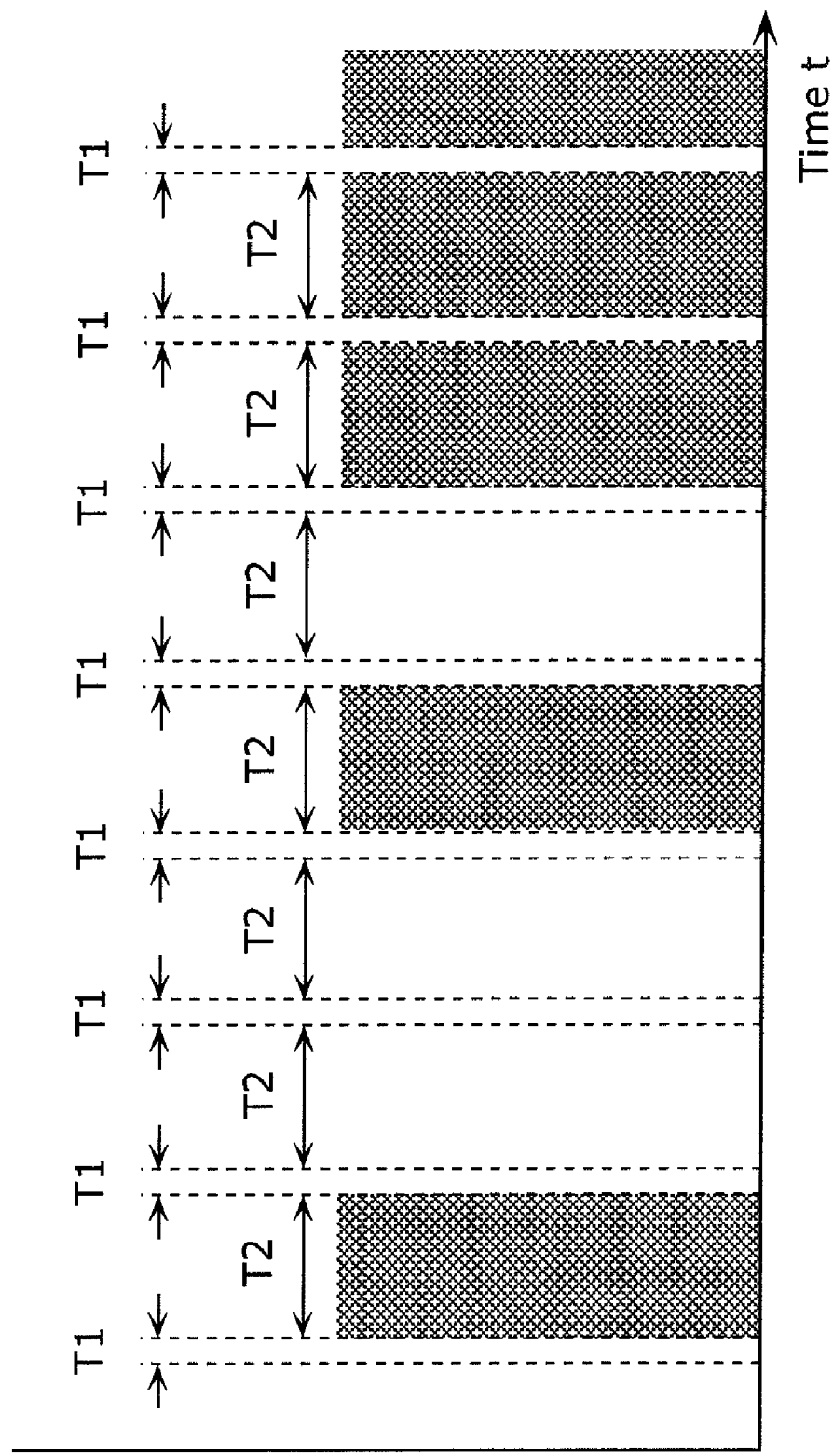
FIG. 19 shows a timing of emission of infrared light by the infrared LED according to the third embodiment of the present invention.

FIG. 18 shows a timing of emission of the infrared light by the infrared LED lamp unit 140 in the headlight module according to the third embodiment of the present invention. FIG. 19 shows an enlarged view of a rectangle 400 shown by a broken line in FIG. 18. As shown in FIGS. 18 and 19, the infrared LED lamp unit 140 emits the infrared light modulated in a temporally pseudo-random manner using the spread spectrum system.

A spread code sequence for use in the spread spectrum system desirably performs coding at a speed which is sufficiently higher than a data bit rate and has a uniform spectrum within a wavelength. In consideration of ease of decoding, such a spread code sequence desirably has periodicity. A pseudo-random sequence (PN sequence) satisfies the aforementioned requirements. The PN sequence is artificially generated by circuit including a shift register and having a feedback function on the basis of a certain rule. There is an M sequence (maximal-length sequence) as a well-known PN sequence. The M sequence has excellent correlating characteristics. From among code sequences which have a certain length and are generated by the circuit including the shift register and having the feedback function, the M sequence has a longest period. When "n" is the number of stages of the shift register, a bit length of the M sequence is obtained from an equation: $L=2n-1$.

In the headlight module according to the third embodiment of the present invention, a pulse generation unit 203 includes an M-sequence signal generator.

Figure 20:
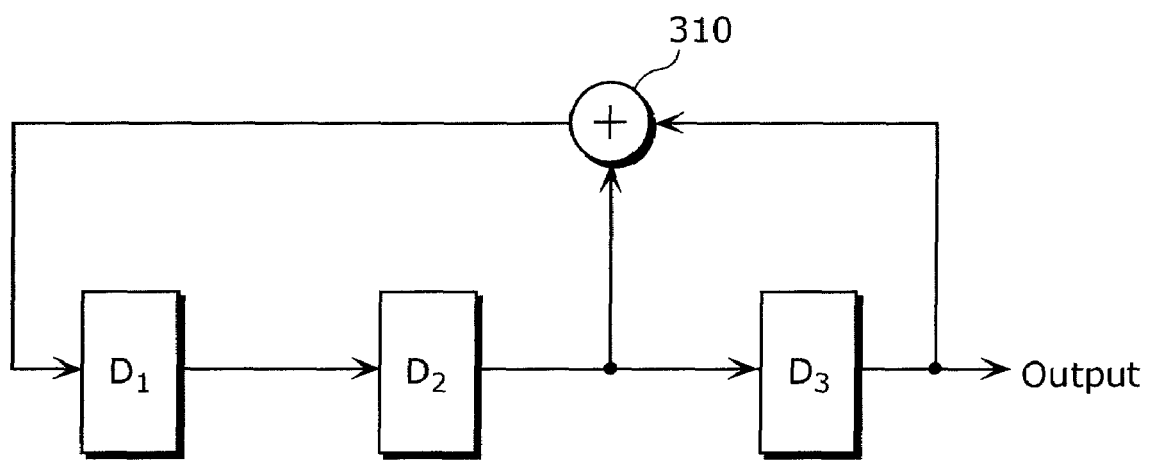
FIG. 20 shows a circuit configuration of an M-sequence generator according to the third embodiment of the present invention.

FIG. 20 shows a circuit configuration of the signal generator of the pulse generation unit 203. The signal generator shown in FIG. 20 forms a signal string of "1001011". As shown in FIG. 20, the signal generator includes three shift registers D1, D2 and D3, and an EXOR element 310. Each of the shift registers D1, D2 and D3 is a one-bit delay element. When an initial value of each of the shift registers D1 and D2 is set at "0" and an initial value of the shift register D3 is set at "1", a signal string of seven bits, that is, "1001011" can be obtained from an equation: $L=2^3-1$.

On the basis of the signal string formed by the signal generator shown in FIG. 20, the pulse generation unit 203 generates a pulse signal 205 modulated in the temporally pseudo-random manner using the spread spectrum system.

A light-emission control unit 204 receives, from the pulse generation unit 203, the pulse signal 205 modulated in the temporally pseudo-random manner using the spread spectrum system, and allows an infrared LED 201 of the infrared LED lamp unit 140 to emit the infrared light at a timing of change of the pulse signal 205. In other words, the light-emission control unit 204 allows the infrared LED 201 to emit the infrared light modulated in the temporally pseudo-random manner using the spread spectrum system. For example, the light-emission control unit 204 allows the infrared LED 201 to emit the infrared light when the pulse signal 205 takes a value of "1" and prevents the infrared LED 201 from emitting the infrared light when the pulse signal 205 takes a value of "0".

When the infrared LED lamp unit 140 emits infrared light to a forward area of a vehicle on which the headlight module according to the third embodiment of the present invention is mounted, a solid-state imaging device 160 receives the infrared light reflected from an object on the forward area. A detection unit 104 receives, from the pulse generation unit 203, the pulse signal 205 modulated in the temporally pseudo-random manner using the spread spectrum system, and retrieves a signal corresponding to the infrared light received by the solid-state imaging device 160 at the timing of change of the pulse signal 205, thereby extracting only the infrared light emitted by the headlight module.

Herein, a Gold sequence may be used from among the PN sequences. Furthermore, a Reed-Solomon code may be used for code correction.

Figure 21:
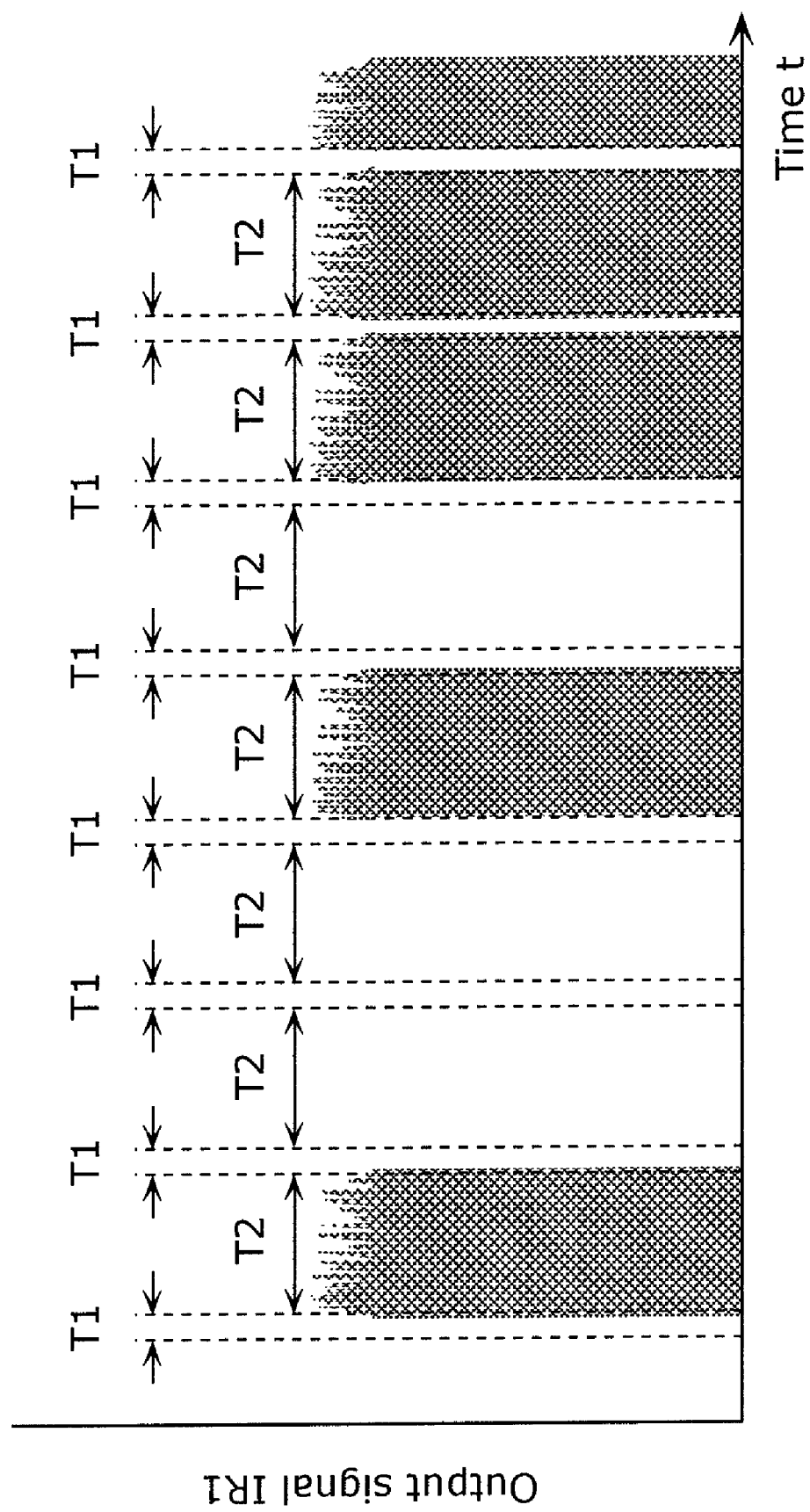
FIG. 21 shows an exemplary output signal from a unit pixel, which transmits only infrared light, in a solid-state imaging device according to the third embodiment of the present invention.

FIG. 21 shows an output signal IR1 outputted from a unit pixel 162 when the solid-state imaging device 160 receives the infrared light modulated in the temporally pseudo-random manner and emitted at the timing shown in FIG. 19. As shown in FIG. 21, the unit pixel 162 outputs the output signal IR1 modulated in the temporally pseudo-random manner at the timing when the infrared LED lamp unit 140 emits the infrared light. Accordingly, the camera unit 130 captures the output signal IR1 outputted from the unit pixel 162 at the timing when the headlight module emits the infrared light. As a result, the headlight module can readily reduce an influence of light emitted by a headlight of an oncoming vehicle and extract only the infrared light emitted thereby.

Figure 22:
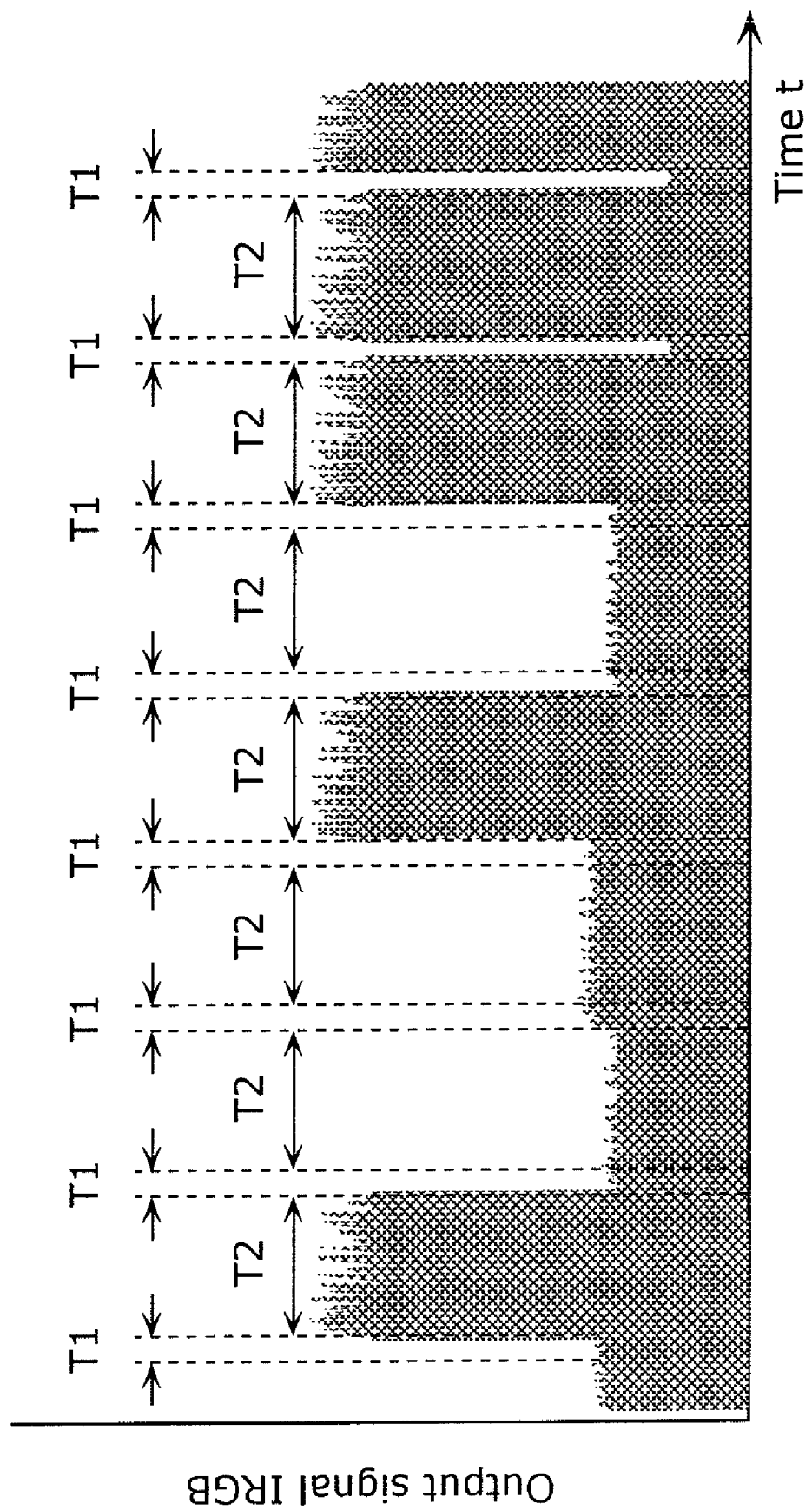
FIG. 22 shows an output signal from a unit pixel, which transmits visible light and infrared light, in the solid-state imaging device according to the third embodiment of the present invention.

FIG. 22 shows an output signal IRGB outputted from a unit pixel 163 when the solid-state imaging device 160 receives the infrared light modulated in the temporally pseudo-random manner and emitted at the timing shown in FIG. 19. As shown in FIG. 22, the unit pixel 163 outputs the output signal IRGB which suffers an influence of visible light and is modulated in the temporally pseudo-random manner as in the infrared light. As in the case of the unit pixel 162, accordingly, the camera unit 130 captures the output signal IRGB according to the temporally pseudo-random modulation. As a result, even in the case of reception of the light emitted by the headlight of the oncoming vehicle, the solid-state imaging device 160 can separate, from the output signal IRGB, the light emitted by the headlight of the oncoming vehicle.

As described above, the headlight module according to the third embodiment of the present invention emits the infrared light modulated using the spread spectrum system, and receives the infrared light reflected from the object. The headlight module according to the third embodiment of the present invention captures the received signal at a timing of the spread spectrum system. Therefore, the headlight module can read out only a signal corresponding to the infrared light emitted thereby. Furthermore, the infrared light modulated using the spread spectrum system is spread out over a wide band. Therefore, the headlight module can readily separate, from the infrared light, the light in a narrow band emitted by the headlight of the oncoming vehicle. Thus, the headlight module according to the third embodiment of the present invention can readily reduce the influence of the light emitted by the headlight of the oncoming vehicle.

Using the infrared light modulated using the spread spectrum system, it is possible to measure relative positions of moving objects on the basis of a difference in arrival time of light.

In the foregoing description, the detection unit 104 retrieves a signal at the timing indicated by the pulse signal 205. Alternatively, a signal generated by the solid-state imaging device 160 may be subjected to despreading. In this case, the signal is captured by despreading and, therefore, becomes resistant to disturbing wave and interference wave. That is, an S/N ratio can be made large.

Fourth Embodiment

A headlight module according to the fourth embodiment of the present invention is a modification of the headlight module according to the first embodiment of the present invention. In the headlight module according to the fourth embodiment of the present invention, a light transmitting film having refractive index distribution is used as a microlens of a unit pixel in a solid-state imaging device 160.

Figure 23:
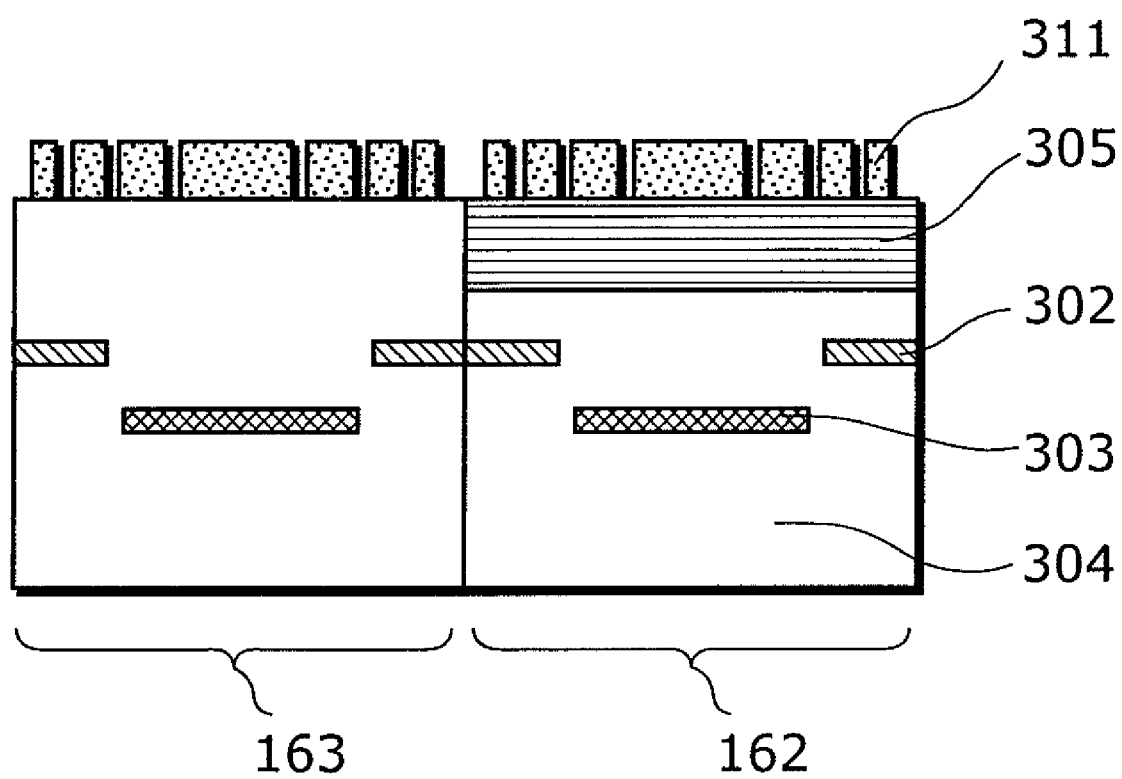
FIG. 23 shows a sectional structure of a solid-state imaging device according to a fourth embodiment of the present invention.

FIG. 23 schematically shows sectional structures of a unit pixel 162 having a sensitivity at a wavelength of infrared light and a unit pixel 163 having a sensitivity at a wavelength of visible light and the wavelength of the infrared light. Herein, the unit pixels 162 and 163 are included in the solid-state imaging device 160 of the headlight module according to the fourth embodiment of the present invention. In FIG. 23, similar constituent elements to those in FIG. 7 are denoted by identical reference numerals to those in FIG. 7; therefore, detailed description thereof will not be given here.

As shown in FIG. 23, the unit pixel 163 includes a light transmitting film 311 having refractive index distribution, a wiring 302, a light receiving device (Si photodiode) 303 and an Si substrate 304. The unit pixel 162 includes a visible-light cutting filter 305 in addition to the aforementioned configuration of the unit pixel 163. The visible-light cutting filter 305 is made up of a lamination film in which $TiO_2$ films and $SiO_2$ films are laminated alternately. The light transmitting film 311 is formed above the light receiving device 303.

Figure 24:
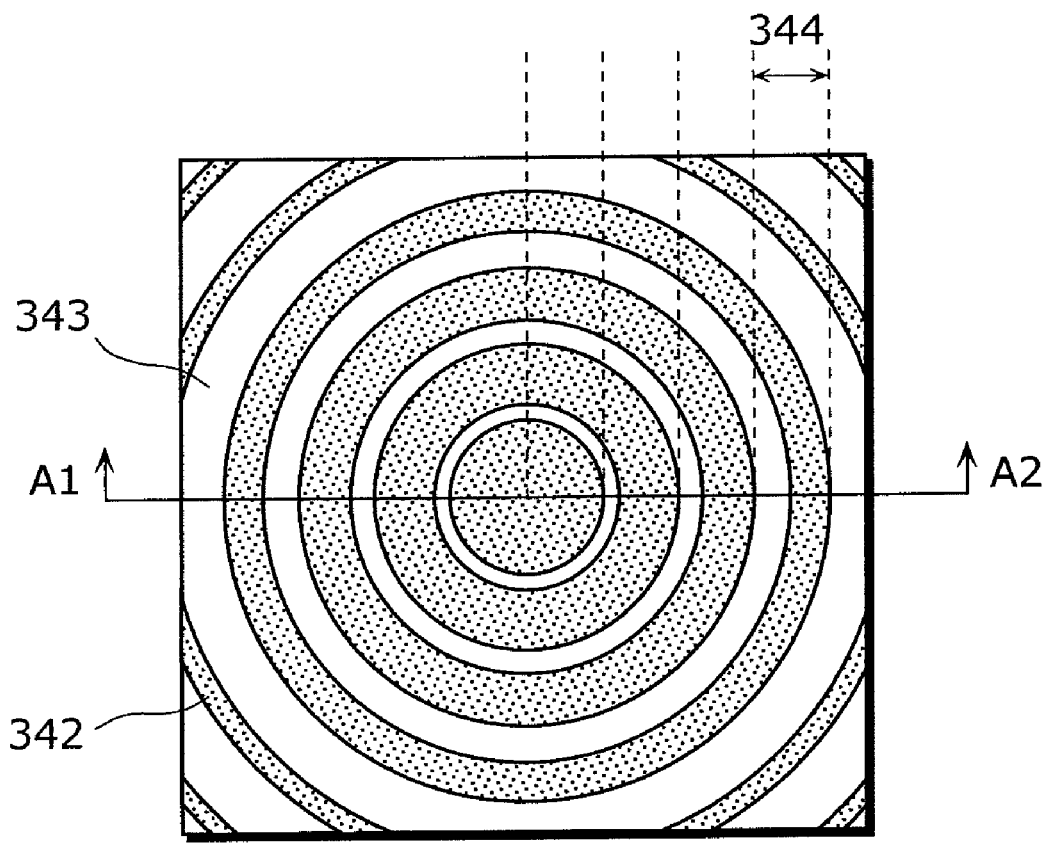
FIG. 24 shows a top view of a light transmitting film having refractive index distribution formed on the solid-state imaging device according to the fourth embodiment of the present invention.
Figure 25:
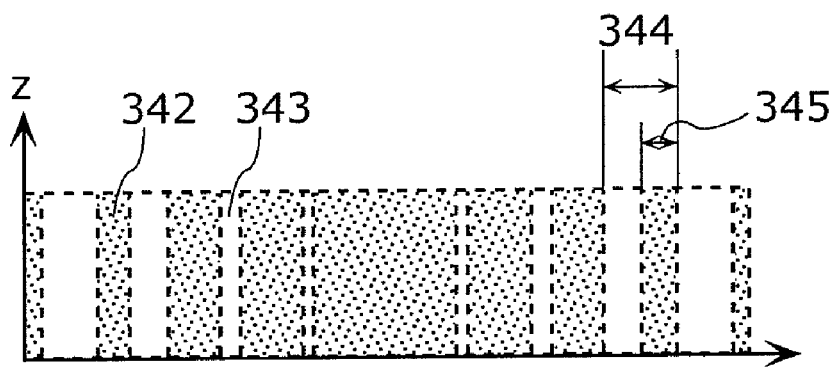
FIG. 25 shows a sectional structure of the light transmitting film having the refractive index distribution formed on the solid-state imaging device according to the fourth embodiment of the present invention.

FIG. 24 shows a top view of the light transmitting film 311 having refractive index distribution. FIG. 25 shows a sectional view taken along a line A1-A2 in FIG. 24.

As shown in FIGS. 24 and 25, the light transmitting film 311 includes a high-refractive-index material 342 and a low-refractive-index material 343. Each of the high-refractive-index material 342 and the low-refractive-index material 343 has a concentric structure. The high-refractive-index material 342 is, for example, $SiO_2$ (n=1.45), and the low-refractive-index material 343 is, for example, air (n=1.0). A difference 344 in outer peripheral diameter between adjoining circular light transmitting films is, for example, 200 nm. The light transmitting film 311 has a thickness of, for example, 1.2 μm. Among line widths 345 of the concentric high-refractive-index materials 342, the innermost line width 345 becomes longest while the outermost line width 345 becomes shortest. In the case where the line width is almost equal to or smaller than a wavelength of incident light, an effective refractive index of light can be calculated from a volume ratio between the high-refractive-index material 342 and the low-refractive-index material 343. A most significant feature of this structure is that the refractive index distribution can be controlled freely only by change of the line width (circumferential width) 345.

In the foregoing description, the solid-state imaging device 160 includes the unit pixels 162 each transmitting only the infrared light and the unit pixels 163 each transmitting the visible light and the infrared light as in the first embodiment of the present invention. Alternatively, also in the case that the solid-state imaging device 160 includes the unit pixels 162 each transmitting only the infrared light, unit pixels 164 each transmitting red light and the infrared light, unit pixels 165 each transmitting green light and the infrared light and unit pixels 166 each transmitting blue light and the infrared light as in the second embodiment of the present invention, the light transmitting film 311 having refractive index distribution may be used as a microlens.

Herein, an interferometric color filter may be used as the color filters 307, 308 and 309 of the unit pixels 164, 165 and 166 shown in FIGS. 16 and 17.

Figure 26:
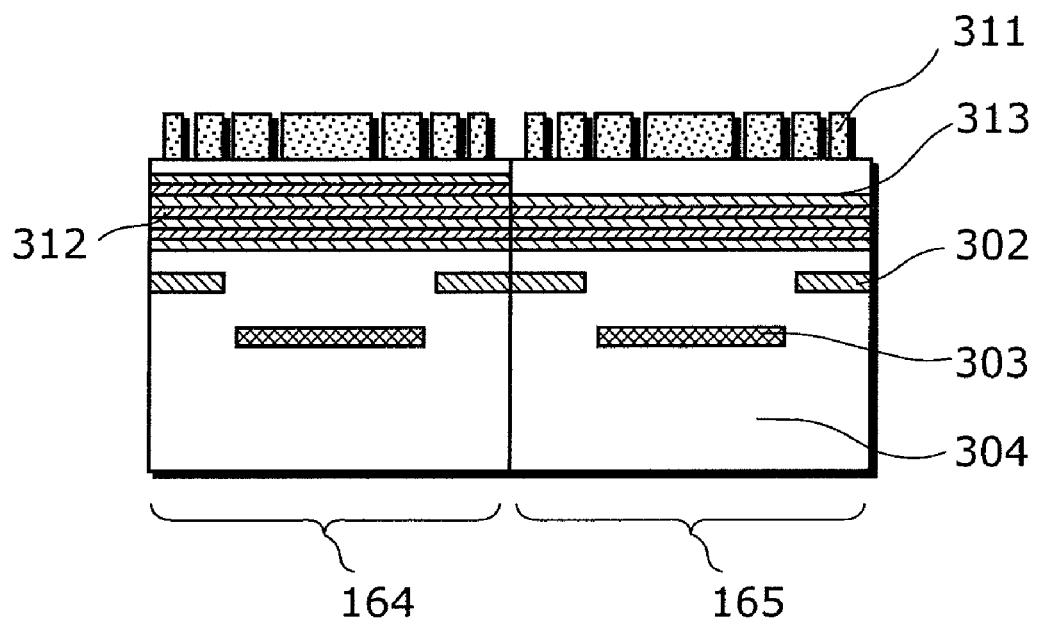
FIG. 26 shows a sectional structure of the solid-state imaging device according to the fourth embodiment of the present invention.
Figure 27:
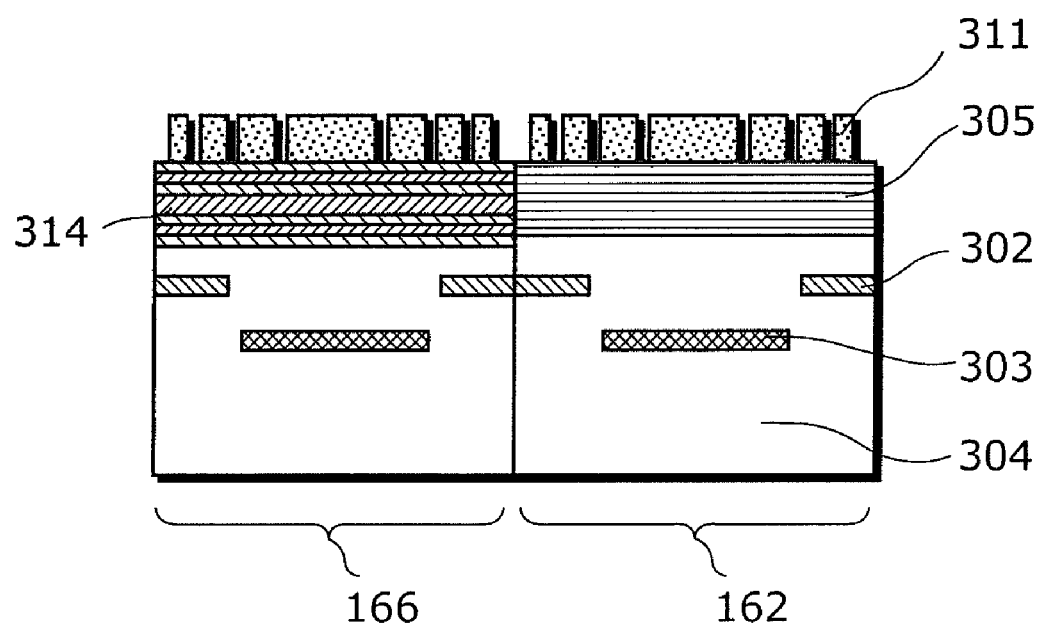
FIG. 27 shows a sectional structure of the solid-state imaging device according to the fourth embodiment of the present invention.

FIG. 26 schematically shows sectional structures of the unit pixels 164 and 165 each including the light transmitting film 311 having refractive index distribution and an interferometric color filter. FIG. 27 schematically shows sectional structures of the unit pixels 162 and 166 each including the light transmitting film 311 having refractive index distribution and an interferometric color filter. As shown in FIGS. 26 and 27, the unit pixel 164 transmitting the red light and the infrared light includes an interferometric color filter 312, the unit pixel 165 transmitting the green light and the infrared light includes an interferometric color filter 313, and the unit pixel 166 transmitting the blue light and the infrared light includes an interferometric color filter 314. Each of the interferometric color filters 312, 313 and 314 is made up of a lamination film in which $TiO_2$ films and $SiO_2$ films are laminated alternately. The interferometric color filters 312, 313 and 314 are different from each other in lamination structure depending on a color to be generated. For example, the interferometric color filter 313 of the unit pixel 165 transmitting the green light and the infrared light has a lamination structure of three $TiO_2$ films and two $SiO_2$ films. The interferometric color filter 312 of the unit pixel 164 transmitting the red light and the infrared light has a lamination structure of four $TiO_2$ films and three $SiO_2$ films. The interferometric color filter 314 of the unit pixel 166 transmitting the blue light and the infrared light has a lamination structure of four $TiO_2$ films and three $SiO_2$ films. Herein, a thickness of the intermediate $SiO_2$ film in the interferometric color filter 314 is different from a thickness of the intermediate $SiO_2$ film in the interferometric color filter 312.

As described above, in the headlight module according to the fourth embodiment of the present invention, each of the microlens and the color filter in the solid-state imaging device 160 is made of an inorganic material, leading to significant improvement in light resistance and heat resistance. That is, such solid-state imaging device 160 is optimal for a headlight module to be mounted on an automobile.

Figure 28:
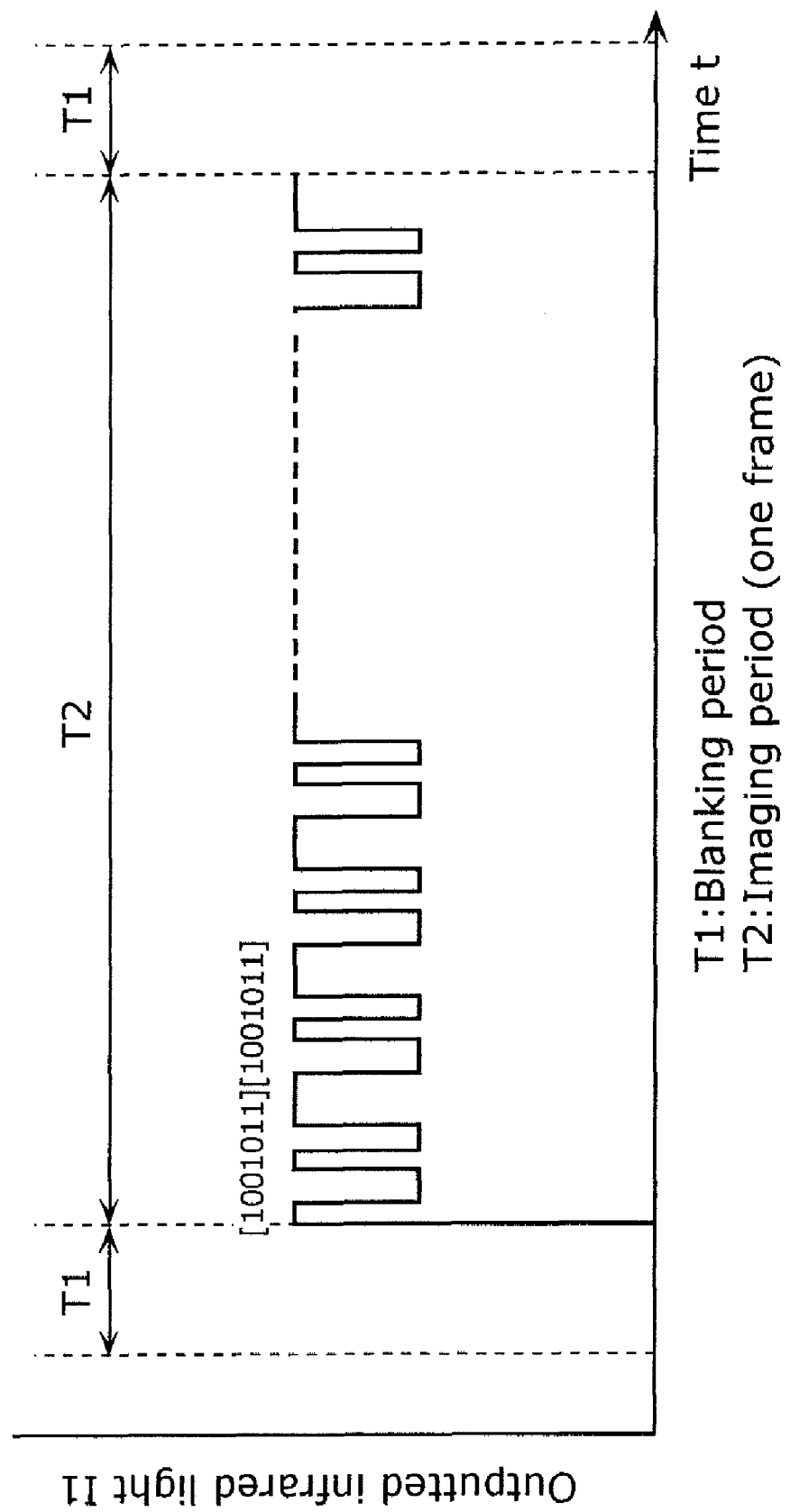
FIG. 28 shows infrared light emitted by an infrared LED according to a modification of the present invention.

In the foregoing description (the first to fourth embodiments), a pseudo-random modulation of infrared light is performed in such a manner that either a frame in which infrared light is emitted or a frame in which no infrared light is emitted is selected in a pseudo-random manner. However, the present invention is not limited thereto. For example, a length of an imaging period T2 may be changed in a pseudo-random manner in each frame. Alternatively, an infrared-light emission time may be changed in each frame while imaging periods T2 are equal in length to each other. Furthermore, an intensity of a signal in one frame may be modulated in a temporally pseudo-random manner. FIG. 28 shows a timing of emission of infrared light in the case where an intensity of a signal in one frame is modulated in a temporally pseudo-random manner. As shown in FIG. 28, for example, the intensity of the signal in one frame may be modulated in the temporally pseudo-random manner.

Fifth Embodiment

A headlight module according to the fifth embodiment of the present invention emits two pieces of infrared light which are different in wavelength from each other and are modulated in a temporally pseudo-random manner, and captures signals according to the modulation. As a result, infrared-light emission patterns become unique to each vehicle. Therefore, the headlight module can extract only the infrared light emitted thereby. Thus, the headlight module can reduce an influence of light emitted by a headlight of an oncoming vehicle.

First, a configuration of the headlight module according to the fifth embodiment of the present invention is described.

Figure 29:
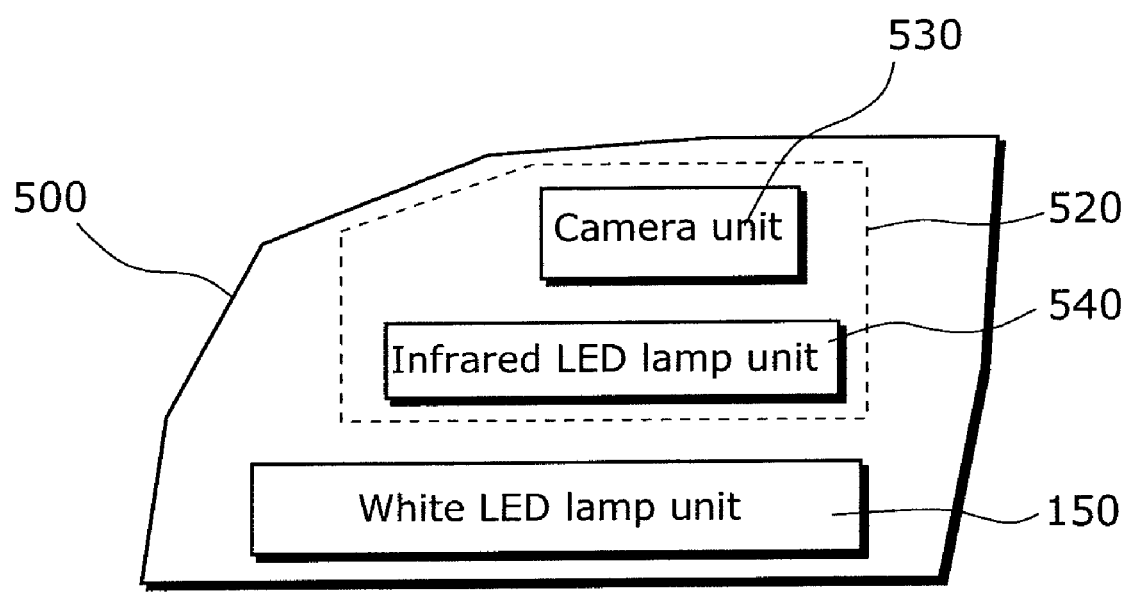
FIG. 29 shows a schematic configuration of a headlight module according to a fifth embodiment of the present invention.

FIG. 29 shows a schematic configuration of the headlight module according to the fifth embodiment of the present invention. In FIG. 29, similar constituent elements to those in FIG. 1 are denoted by identical reference numerals to those in FIG. 1; therefore, detailed description thereof will not be given here. As shown in FIG. 29, the headlight module 500 includes a night-vision imaging apparatus 520 and a white LED lamp unit 150. The night-vision imaging apparatus 520 includes a camera unit 530 and an infrared LED lamp unit 540.

The infrared LED lamp unit 540 emits infrared light to a forward area of a vehicle on which the headlight module 500 is mounted. Then, the camera unit 530 receives the infrared light reflected from an object on the forward area to take an image from the received infrared light. Moreover, the camera unit 530 receives visible light to take an image from the received visible light.

The infrared LED lamp unit 540 emits, as a high beam, first infrared light and second infrared light which are different in wavelength from each other. In the fifth embodiment of the present invention, each of the first infrared light and the second infrared light is near-infrared light.

Herein, the camera unit 530, the infrared LED lamp unit 540 and the white LED lamp unit 150 are provided in this order from above as shown in FIG. 29; however, a placement order and a position of the aforementioned units are not limited to those shown in FIG. 29.

Figure 30:
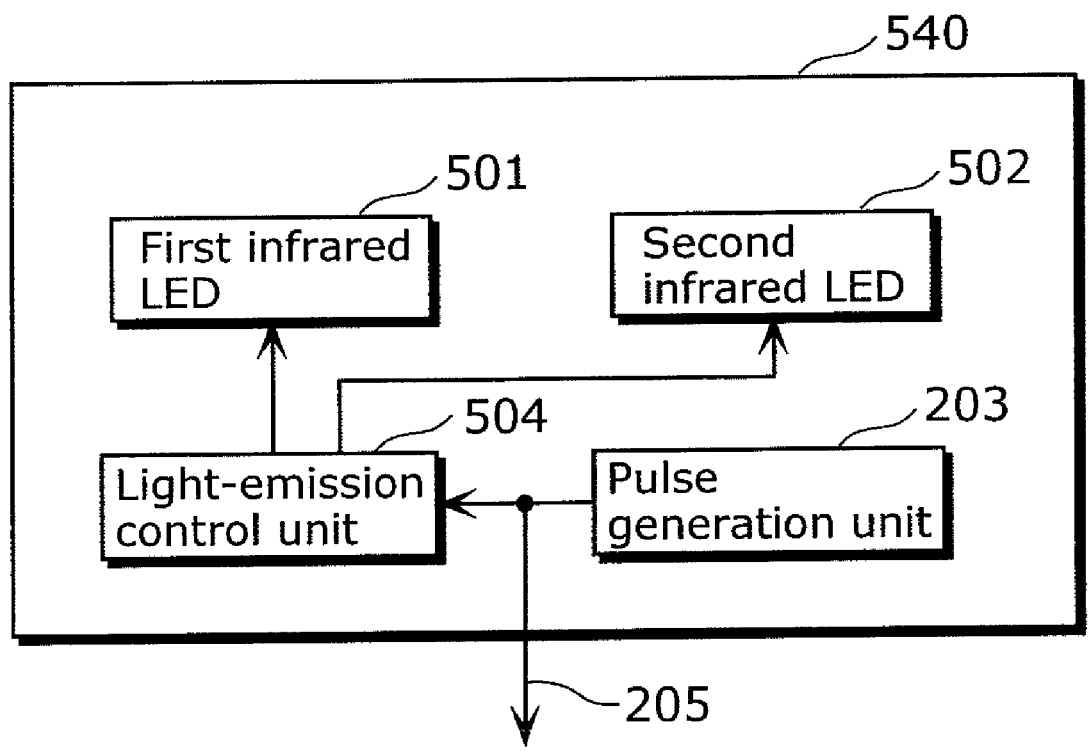
FIG. 30 shows a schematic configuration of an infrared LED lamp unit according to the fifth embodiment of the present invention.

FIG. 30 shows a block diagram of a configuration of the infrared LED lamp unit 540. As shown in FIG. 30, the infrared LED lamp unit 540 includes a first infrared LED 501, a second infrared LED 502, a pulse generation unit 203 and a light-emission control unit 504. In FIG. 30, similar constituent elements to those in FIG. 3 are denoted by identical reference numerals to those in FIG. 3; therefore, detailed description thereof will not be given here.

Each of the first infrared LED 501 and the second infrared LED 502 emits the infrared light under control by the light-emission control unit 504. The first infrared LED 501 emits the first infrared light. The second infrared LED 502 emits the second infrared light which is different in wavelength from the first infrared light.

At a timing indicated by the pulse signal 205 from the pulse generation unit 203, the light-emission control unit 504 controls the emission of the infrared light modulated in the temporally pseudo-random manner from the first infrared LED 501 and the second infrared LED 502. Herein, the modulation of the first infrared light is temporally opposite to the modulation of the second infrared light. In other words, the light-emission control unit 504 allows the second infrared LED 502 to emit the second infrared light modulated in the pseudo-random manner by the modulation which is temporally opposite to the modulation of the first infrared light.

A configuration of the camera unit 530 is similar to that shown in FIG. 4. The camera unit 530 includes a solid-state imaging device 160, an A/D conversion unit 101, a frame memory 102, a detection unit 104, a light attenuation unit 105, a frame memory 106, an image synthesis unit 107 and an image output unit 108.

When the infrared LED lamp unit 140 emits the first infrared light to the forward area of the headlight module 500 of the vehicle, the solid-state imaging device 160 receives the first infrared light reflected from the object on the forward area, converts the received first infrared light into an analog signal (third signal), and outputs the third signal to the A/D conversion unit 101. Moreover, when the infrared LED lamp unit 140 emits the second infrared light to the forward area of the headlight module 500, the solid-state imaging device 160 receives the second infrared light reflected from the object on the forward area, converts the received second infrared light into an analog signal (fourth signal), and outputs the fourth signal to the A/D conversion unit 101. Furthermore, the solid-state imaging device 160 receives visible light, converts the received visible light into an analog signal (fifth signal), and outputs the fifth signal to the A/D conversion unit 101.

The A/D conversion unit 101 receives the third signal, the fourth signal and the fifth signal from the solid-state imaging device 160, and converts each of the third, fourth and fifth signals into a digital signal.

The frame memory 102 receives the digital signal from the A/D conversion unit 101, and stores the digital signal therein.

The detection unit 104 retrieves the signal stored in the frame memory 102, at a timing indicated by the pulse signal 205 from the pulse generation unit 203. Moreover, the detection unit 104 removes, for example, the influence of the light emitted by the headlight of the oncoming vehicle, from the signal stored in the frame memory 102. The detection unit 104 includes a DC detection unit 109, an AC detection unit 110 and an extraction unit 111.

The DC detection unit 109 detects a signal having a DC component, which is generated due to the light emitted by the headlight of the oncoming vehicle, from the signal generated by the solid-state imaging device 160 and stored in the frame memory 102. Moreover, the DC detection unit 109 determines whether an intensity of the signal, which is generated by the solid-state imaging device 160 and is stored in the frame memory 102, is equal to or more than a predetermined intensity.

If the DC detection unit 109 determines that the intensity is equal to or more than the predetermined intensity, the light attenuation unit 105 attenuates the light to be received by the solid-state imaging device 160.

The AC detection unit 110 detects a signal having a component, which is different in timing (frequency characteristic) from a component of the pulse signal 205, from the signal stored in the frame memory 102 or a signal obtained from the light attenuation by the light attenuation unit 105.

At a timing of change of the pulse signal 205, the extraction unit 111 extracts a signal corresponding to each of the first infrared light and the second infrared light emitted by the headlight module 500 from the signal stored in the frame memory 102 or the signal obtained from the light attenuation by the light attenuation unit 105. In other words, the extraction unit 111 extracts, according to the temporally pseudo-random modulation of the first infrared light emitted by the infrared LED lamp unit 140, the signal corresponding to the first infrared light emitted by the infrared LED lamp unit 140 from the third signal generated by the solid-state imaging device 160. Furthermore, the extraction unit 111 extracts, according to the temporally pseudo-random modulation of the second infrared light emitted by the infrared LED lamp unit 140, the signal corresponding to the second infrared light emitted by the infrared LED lamp unit 140 from the fourth signal generated by the solid-state imaging device 160. Accordingly, the extraction unit 111 can extract only the signal corresponding to each of the first infrared light and the second infrared light emitted by the headlight module 500. Moreover, the extraction unit 111 subtracts the signals, which correspond to the light emitted by the headlight of the oncoming vehicle and are detected by the DC detection unit 109 and the AC detection unit 110, from the signal stored in the frame memory 102 or the signal obtained from the light attenuation by the light attenuation unit 105, thereby extracting the signal corresponding to the infrared light emitted by the headlight module 500.

The frame memory 106 stores therein the signal which corresponds to each of the first infrared light and the second infrared light emitted by the headlight module 500 and is extracted by the extraction unit 111.

The image synthesis unit 107 performs correction and synthesis on an image taken from the signal which corresponds to each the first infrared light and the second infrared light and is stored in the frame memory 106.

The image output unit 108 outputs the image corrected by the image synthesis unit 107 to, for example, a display unit (display) mounted on an interior of the vehicle, and the display unit displays the image outputted from the image output unit 108.

Next, an exemplary arrangement of pixels in the solid-state imaging device 160 according to the fifth embodiment of the present invention is described.

Figure 31:
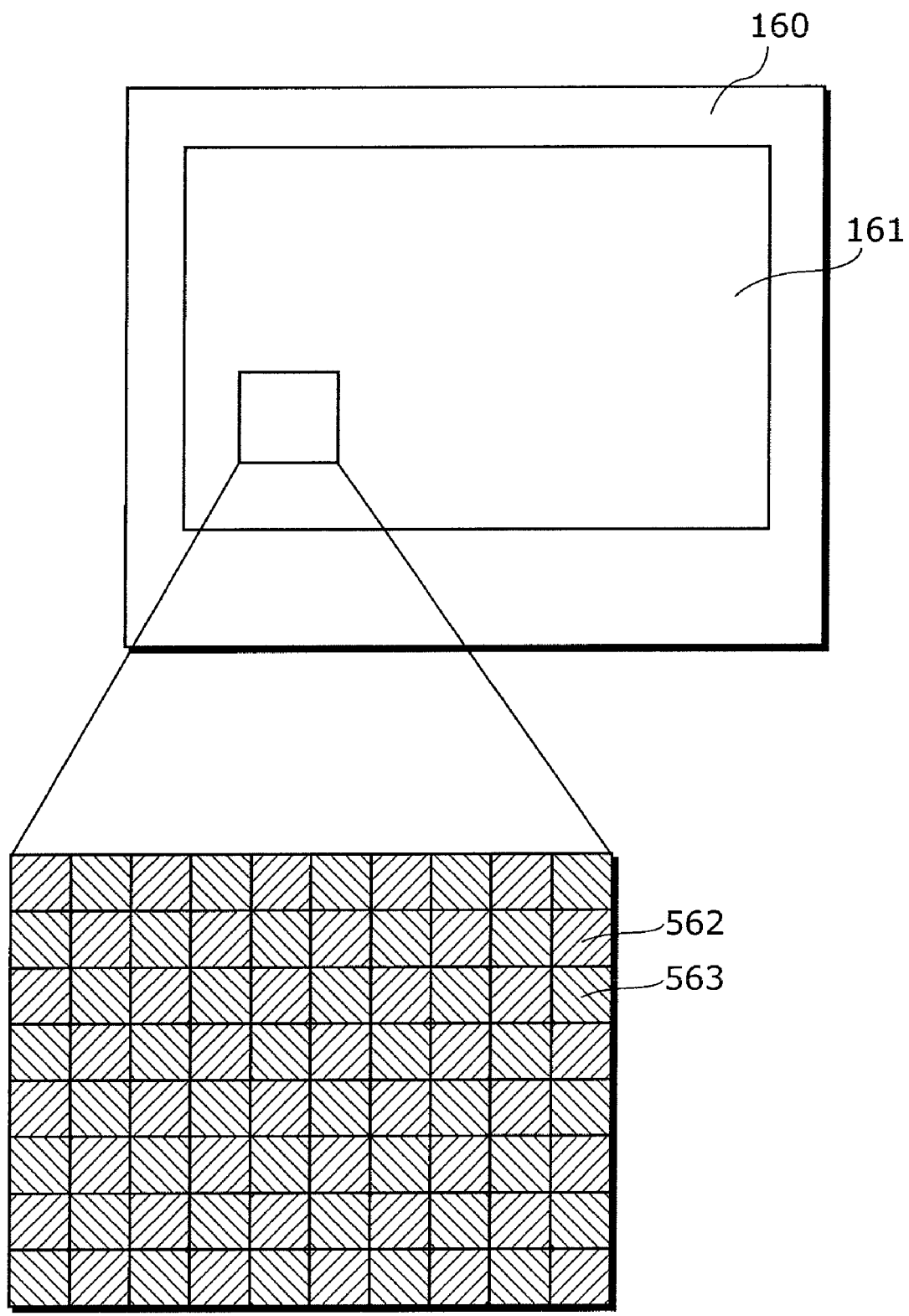
FIG. 31 shows a schematic configuration of a solid-state imaging device according to the fifth embodiment of the present invention.

FIG. 31 shows a schematic configuration of the solid-state imaging device 160 in the camera unit 530 and an arrangement of pixels in the solid-state imaging device 160. The solid-state imaging device 160 is an imaging device applicable to a digital camera or a cellular phone with a camera function. The solid-state imaging device 160 includes an imaging region 161 on which a plurality of unit pixels are arranged two-dimensionally. The unit pixels arranged on the imaging region 161 are unit pixels 562 each of which functions as a filter for transmitting only the first infrared light and has a sensitivity at a wavelength of the first infrared light, and unit pixels 563 each of which functions as a filter for transmitting only the second infrared light and has a sensitivity at a wavelength of the second infrared light. The unit pixel 562 converts the first infrared light into an electric signal. The unit pixel 563 converts the second infrared light into an electric signal. On the imaging region 161, as shown in FIG. 31, the unit pixels 562 and the unit pixels 563 are arranged in a staggered pattern. Thus, an image can be synthesized readily.

Figure 32:
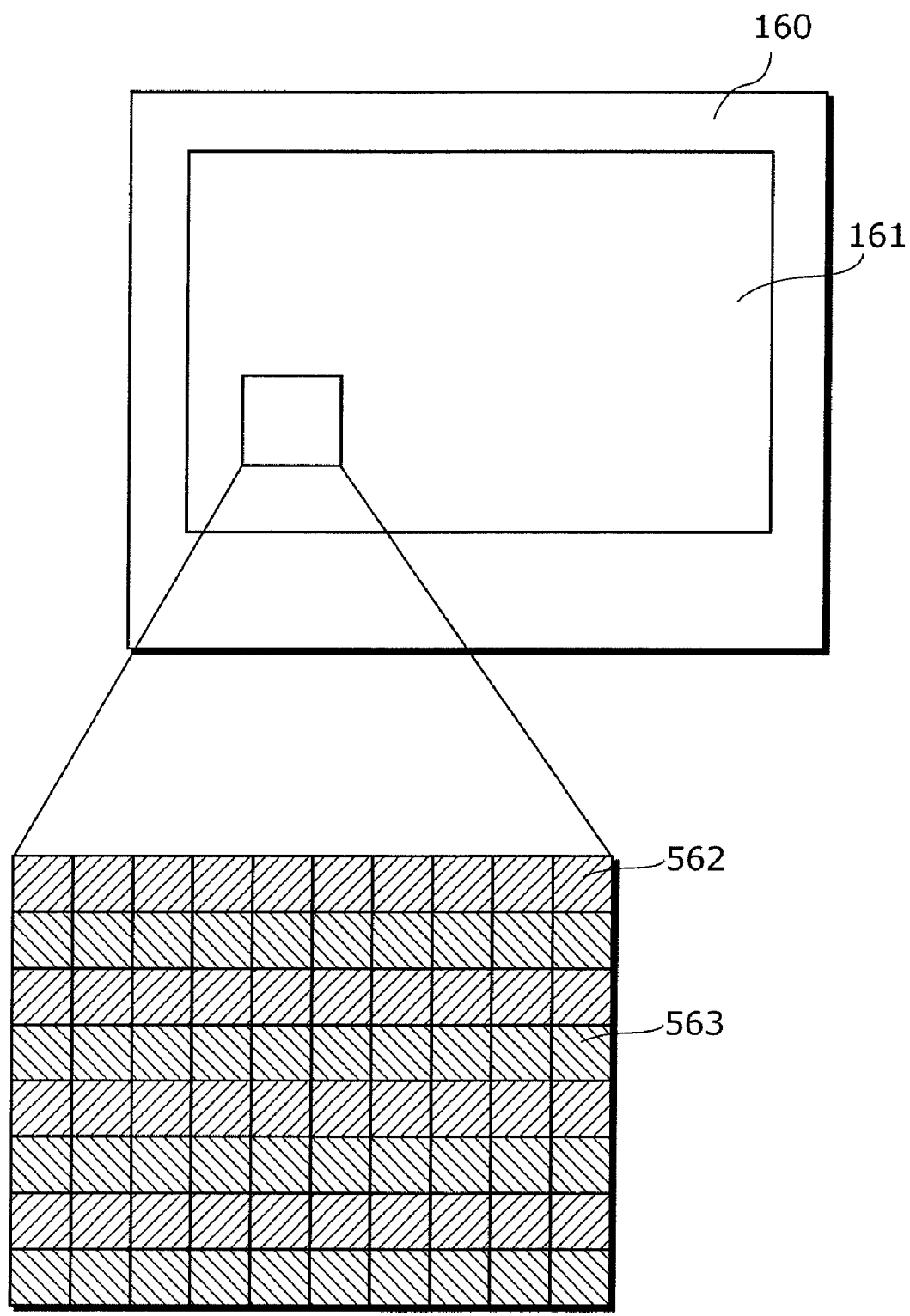
FIG. 32 shows a modified schematic configuration of the solid-state imaging device according to the fifth embodiment of the present invention.

Herein, the unit pixels 562 and the unit pixels 563 may be arranged in a stripe pattern. FIG. 32 shows the unit pixels 562 and the unit pixels 563 which are arranged in a horizontal stripe pattern. On the imaging region 161, when the unit pixels 562 and the unit pixels 563 are arranged in the horizontal stripe pattern, similarly, an image can be synthesized readily. Herein, the unit pixels 562 and the unit pixels 563 may be arranged in a vertical stripe pattern.

Furthermore, the unit pixels 562 each having the sensitivity at the wavelength of the first infrared light, the unit pixels 563 each having the sensitivity at the wavelength of the second infrared light and unit pixels 564 each transmitting visible light and having a sensitivity at a wavelength of the visible light may be arranged on the imaging region 161. The unit pixel 564 converts light at the wavelength of the visible light into an electric signal.

Figure 33:
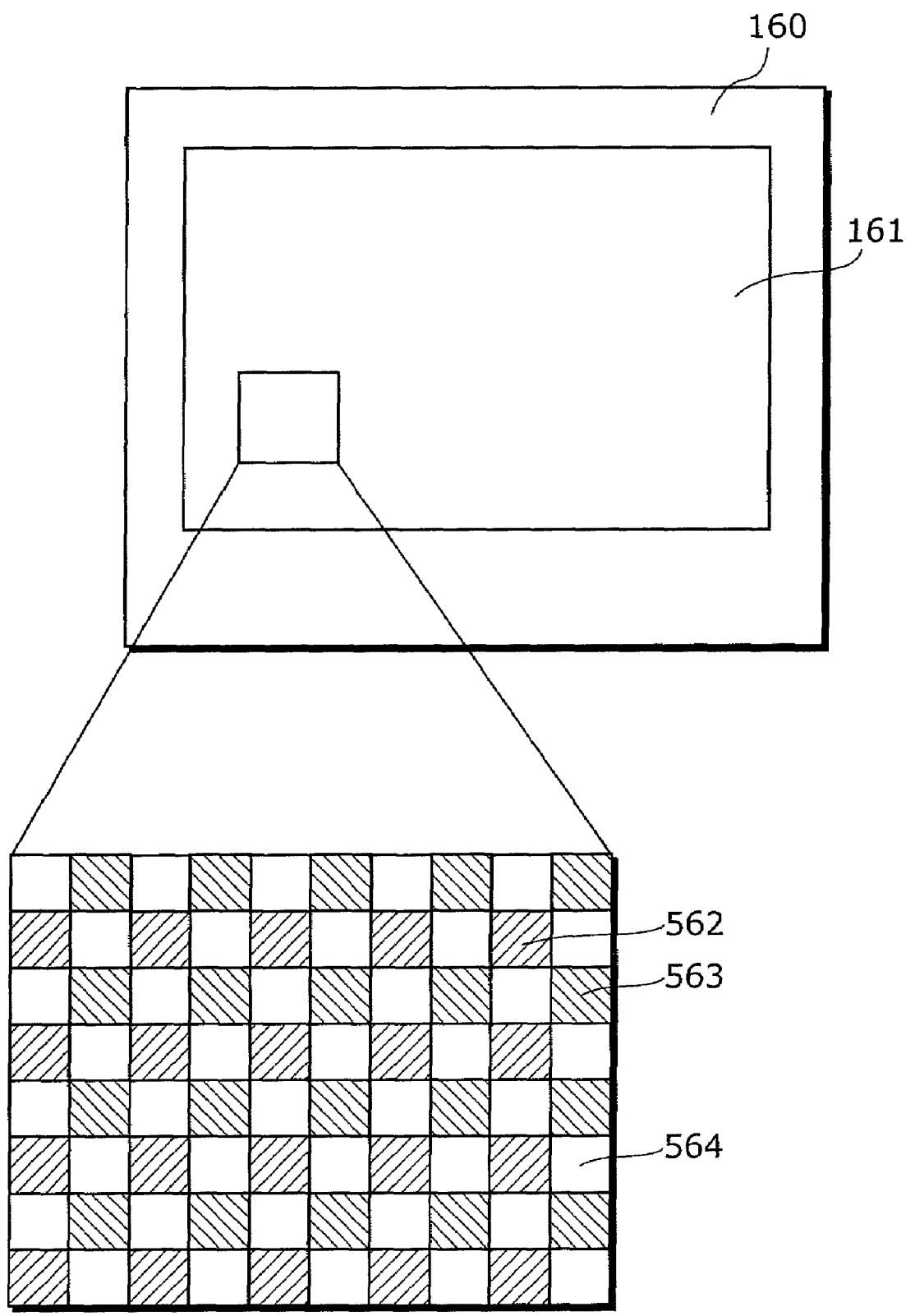
FIG. 33 shows a modified schematic configuration of the solid-state imaging device according to the fifth embodiment of the present invention.

FIG. 33 shows the unit pixels 562, the unit pixels 563 and the unit pixels 564 which are arranged in a staggered pattern. As shown in FIG. 33, pairs of the unit pixels 562 and the unit pixels 563 and the unit pixels 564 are arranged in the staggered pattern. In each column, the unit pixels 562 or 563 and the unit pixels 564 are arranged alternately. Columns in which the unit pixels 562 and the unit pixels 564 are arranged alternately and columns in which the unit pixels 563 and the unit pixels 564 are arranged alternately are arranged alternately in a row direction. By the arrangement of the unit pixels 562, 563 and 564, the solid-state imaging device 160 can take an image from the visible light and an image from the infrared light. Furthermore, the solid-state imaging device 160 can readily synthesize the image taken from the visible light and the image taken from the infrared light.

Figure 34:
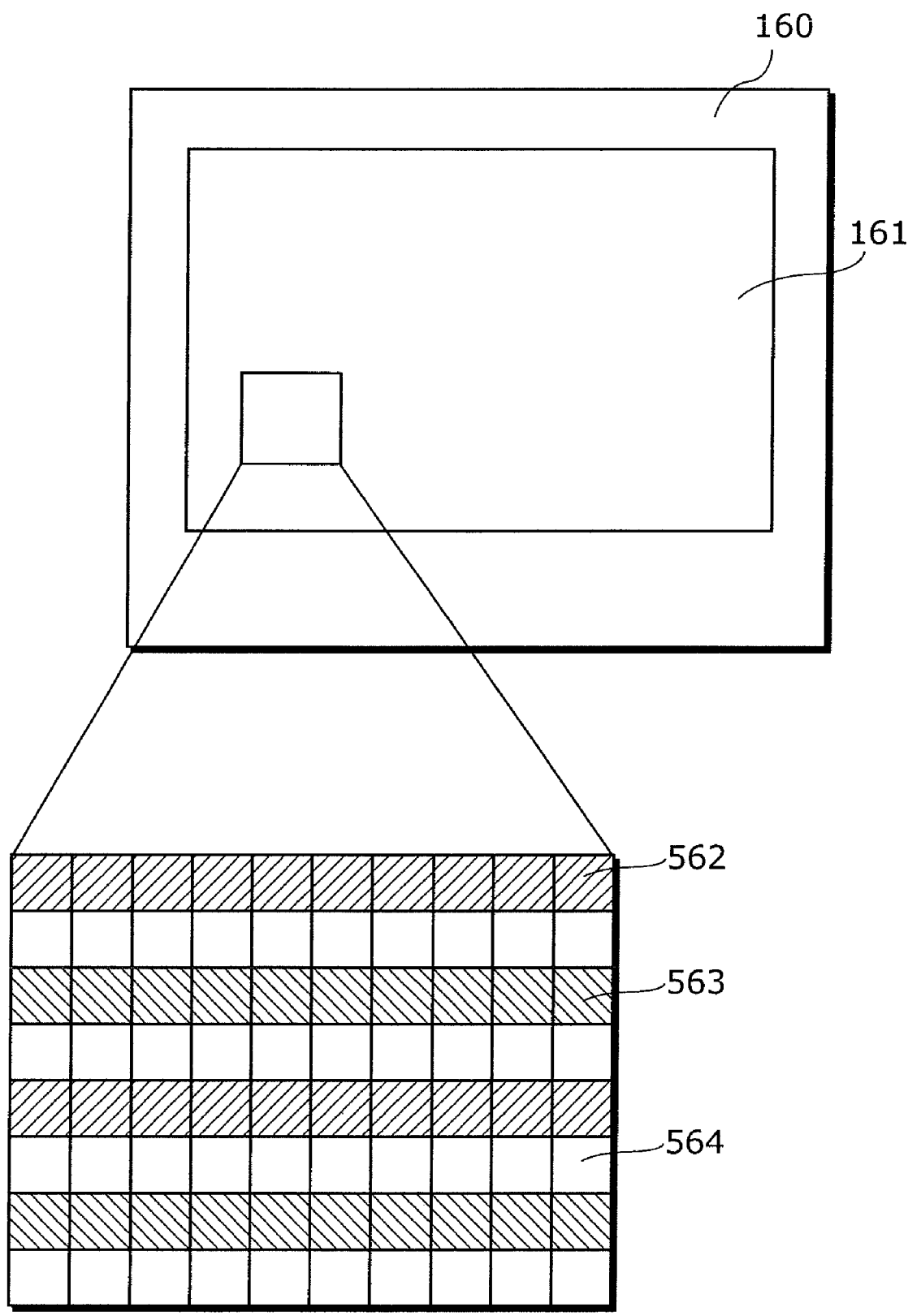
FIG. 34 shows a modified schematic configuration of the solid-state imaging device according to the fifth embodiment of the present invention.

Herein, the unit pixels 562, 563 and 564 may be arranged in a stripe pattern. FIG. 34 shows the unit pixels 562, 563 and 564 arranged in a horizontal stripe pattern. As shown in FIG. 34, the unit pixels 562, 563 and 564 may be arranged in the horizontal stripe pattern in order of the unit pixels 562, the unit pixels 564, the unit pixels 563 and the unit pixels 564. Also in the case that the unit pixels 562, 563 and 564 are arranged in the horizontal stripe pattern, the solid-state imaging device 160 can readily synthesize the image taken from the visible light and the image taken from the infrared light. Herein, the unit pixels 562, 563 and 564 may be arranged in a vertical stripe pattern.

Figure 35:
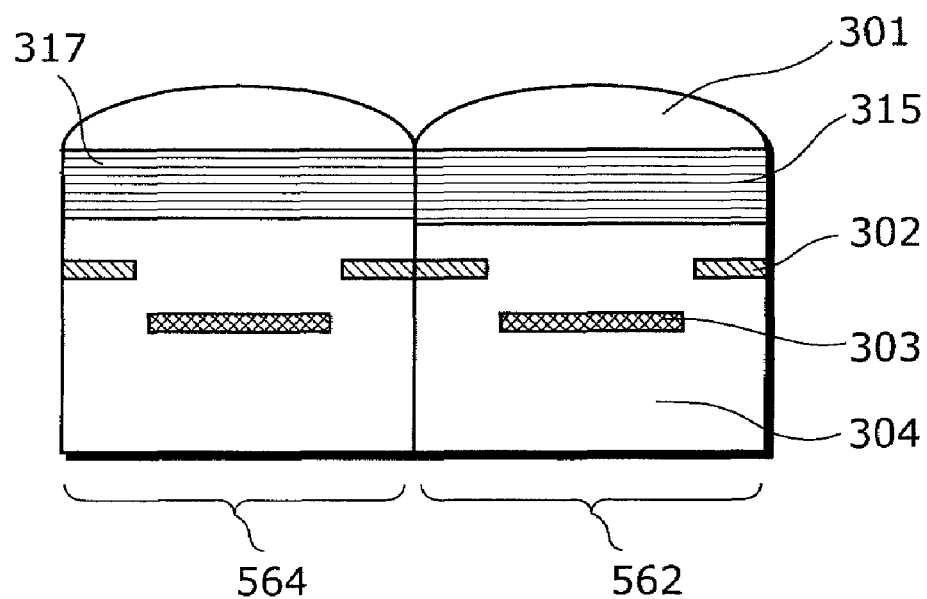
FIG. 35 shows a sectional structure of the solid-state imaging device according to the fifth embodiment of the present invention.

FIG. 35 shows a sectional structure of the unit pixel 562 having the sensitivity at the wavelength of the first infrared light and a sectional structure of the unit pixel 564 having the sensitivity at the wavelength of the visible light. In FIG. 35, similar constituent elements to those in FIG. 7 are denoted by identical reference numerals to those in FIG. 7; therefore, detailed description thereof will not be given here.

In the solid-state imaging device 160, as shown in FIG. 35, the unit pixel 564 transmitting the visible light includes a microlens 301, a wiring 302, a light receiving device (Si photodiode) 303 for receiving the visible light and the infrared light, an Si substrate 304, and a filter 317 transmitting only light at the wavelength of the visible light.

The filter 317 transmitting only light at the wavelength of the visible light is made up of, for example, a lamination film in which $TiO_2$ films and $SiO_2$ films are laminated alternately.

In the solid-state imaging device 160, the unit pixel 562 having the sensitivity at the wavelength of the first infrared light is different from the unit pixel 564 in configuration of a filter. That is, the unit pixel 562 includes a filter 315. The filter 315 transmits only the first infrared light, and is made up of, for example, a lamination film in which $TiO_2$ films and $SiO_2$ films are laminated alternately.

Figure 36:
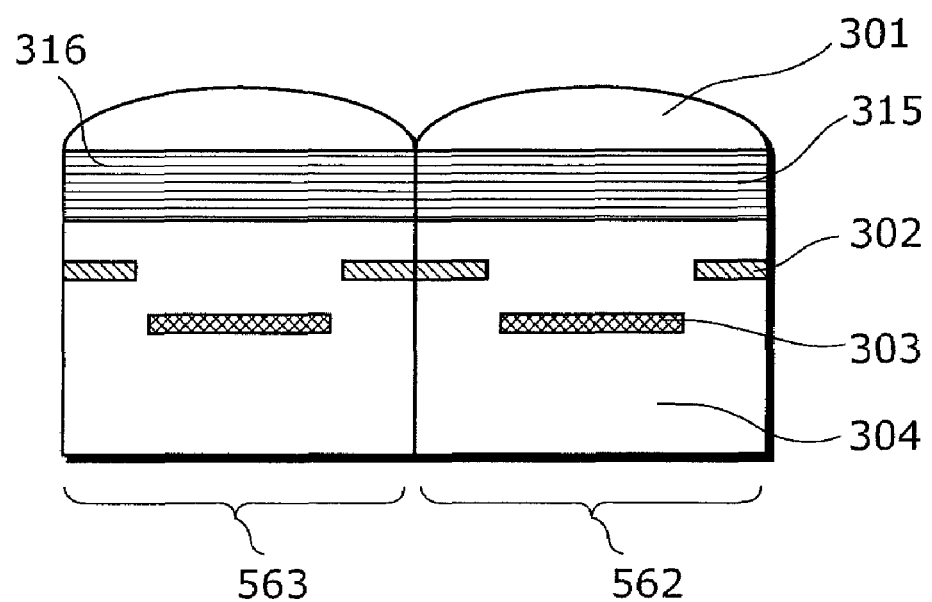
FIG. 36 shows a sectional structure of the solid-state imaging device according to the fifth embodiment of the present invention.

FIG. 36 shows a sectional structure of the unit pixel 562 having the sensitivity at the wavelength of the light emitted by the first infrared LED and a sectional structure of the unit pixel 563 having the sensitivity at the wavelength of the light emitted by the second infrared LED. In the solid-state imaging device 160, the unit pixel 563 having the sensitivity at the wavelength of the second infrared light is different from the unit pixel 564 in a configuration of a filter. That is, the unit pixel 563 includes a filter 316. The filter 316 transmits only the second infrared light, and is made up of, for example, a lamination film in which $TiO_2$ films and $SiO_2$ films are laminated alternately.

Next, operations performed by the headlight module 500 according to the fifth embodiment of the present invention are described.

Figure 37:
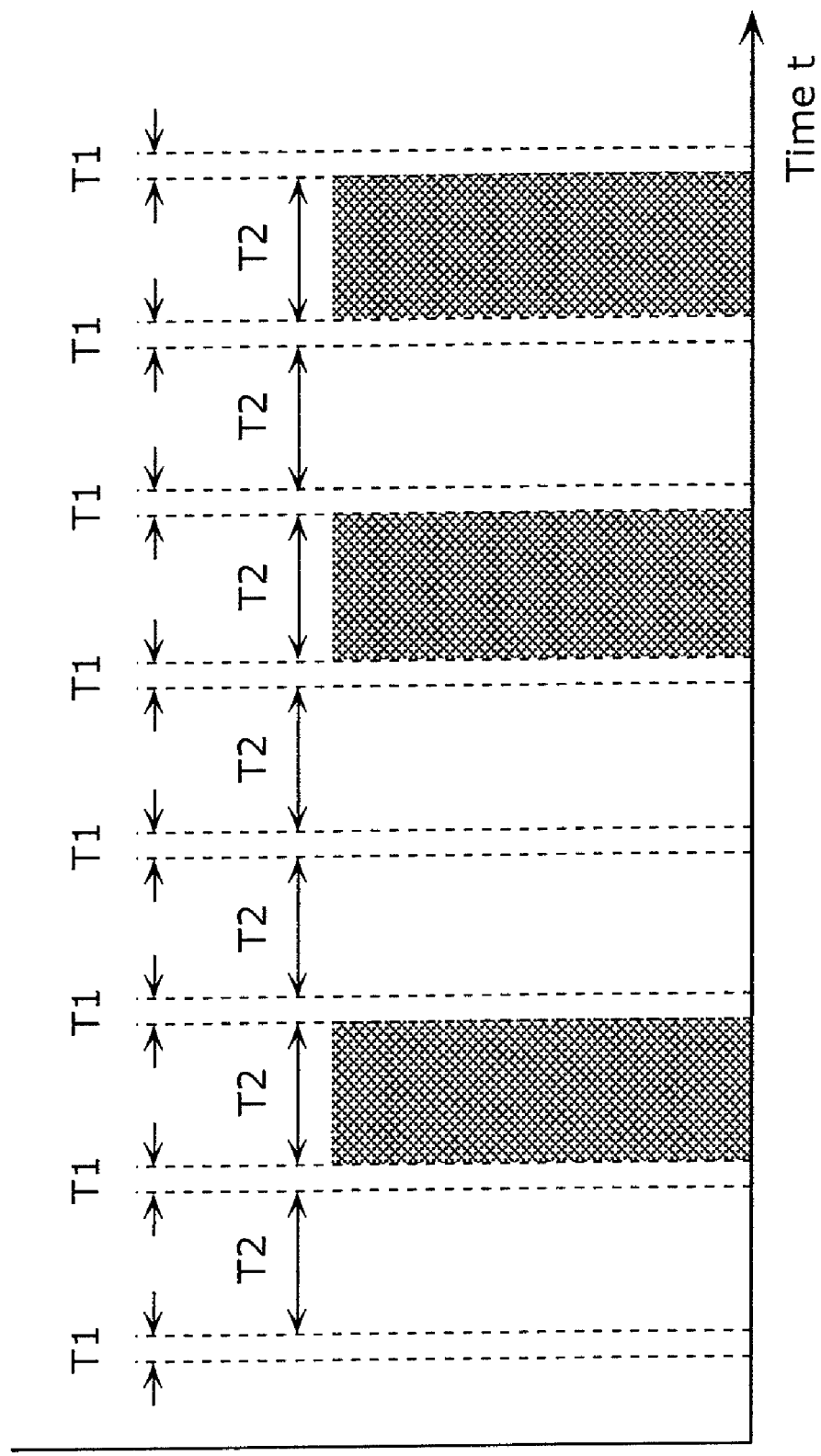
FIG. 37 shows a timing of emission of infrared light by a second infrared LED according to the fifth embodiment of the present invention.

In the headlight module 500 according to the fifth embodiment of the present invention, a timing of emission of the infrared light by the first infrared LED 501 is similar to that shown in FIG. 9. FIG. 37 shows a timing of emission of the infrared light by the second infrared LED 502 in the headlight module 500 according to the fifth embodiment of the present invention.

As shown in FIG. 9, the first infrared LED 501 emits the first infrared light modulated in the temporally pseudo-random manner. As shown in FIG. 37, the second infrared LED 502 emits the second infrared light modulated in the temporally pseudo-random manner. Thus, the headlight module 500 can reduce the influence of the light emitted by the headlight of the oncoming vehicle.

Furthermore, the timing of emission of the infrared light by the first infrared LED 501 is temporally opposite to the timing of emission of the infrared light by the second infrared LED 502. One of the first infrared LED 501 and the second infrared LED 502 lights up at all times, which prevents loss of an image. Thus, an image can be synthesized readily.

As shown in FIGS. 9 and 37, the infrared LED lamp unit 540 selects, in a pseudo-random manner, either a frame in which the first infrared LED 501 emits the first infrared light, but the second infrared LED 502 does not emit the second infrared light or a frame in which the second infrared LED 502 emits the second infrared light, but the first infrared LED 501 does not emit the first infrared light. For example, the infrared LED lamp unit 540 selects a frame in which the first infrared light or the second infrared light is emitted, at the timing indicated by the pulse signal 205 from the pulse generation unit 203.

In the headlight module 500 according to the fifth embodiment of the present invention, a flow of operations performed by the camera unit 530 is similar to that shown in FIG. 10.

When the first infrared LED 501 and the second infrared LED 502 in the infrared LED lamp unit 540 emit the first infrared light and the second infrared light to the forward area of the vehicle on which the headlight module 500 is mounted, first, the solid-state imaging device 160 receives the first infrared light and the second infrared light reflected from the object on the forward area (S101).

An output signal IR1 outputted from the unit pixel 562 of the solid-state imaging device 160 when the solid-state imaging device 160 receives the first infrared light modulated in the temporally pseudo-random manner and emitted at the timing shown in FIG. 9 is similar to that shown in FIG. 11. As shown in FIG. 11, the unit pixel 562 outputs the output signal IR1 modulated in the temporally pseudo-random manner at the timing when the infrared LED lamp unit 140 emits the first infrared light. Herein, timings of emission and modulation of the light emitted by the headlight of the oncoming vehicle are different in pattern from those shown in FIGS. 9 and 11. Accordingly, the camera unit 530 captures the output signal IR1 outputted from the unit pixel 562 of the solid-state imaging device 160 at the timing when the headlight module 500 emits the first infrared light. As a result, the headlight module 500 can readily reduce the influence of the light emitted by the headlight of the oncoming vehicle and extract only the first infrared light emitted thereby.

Figure 38:
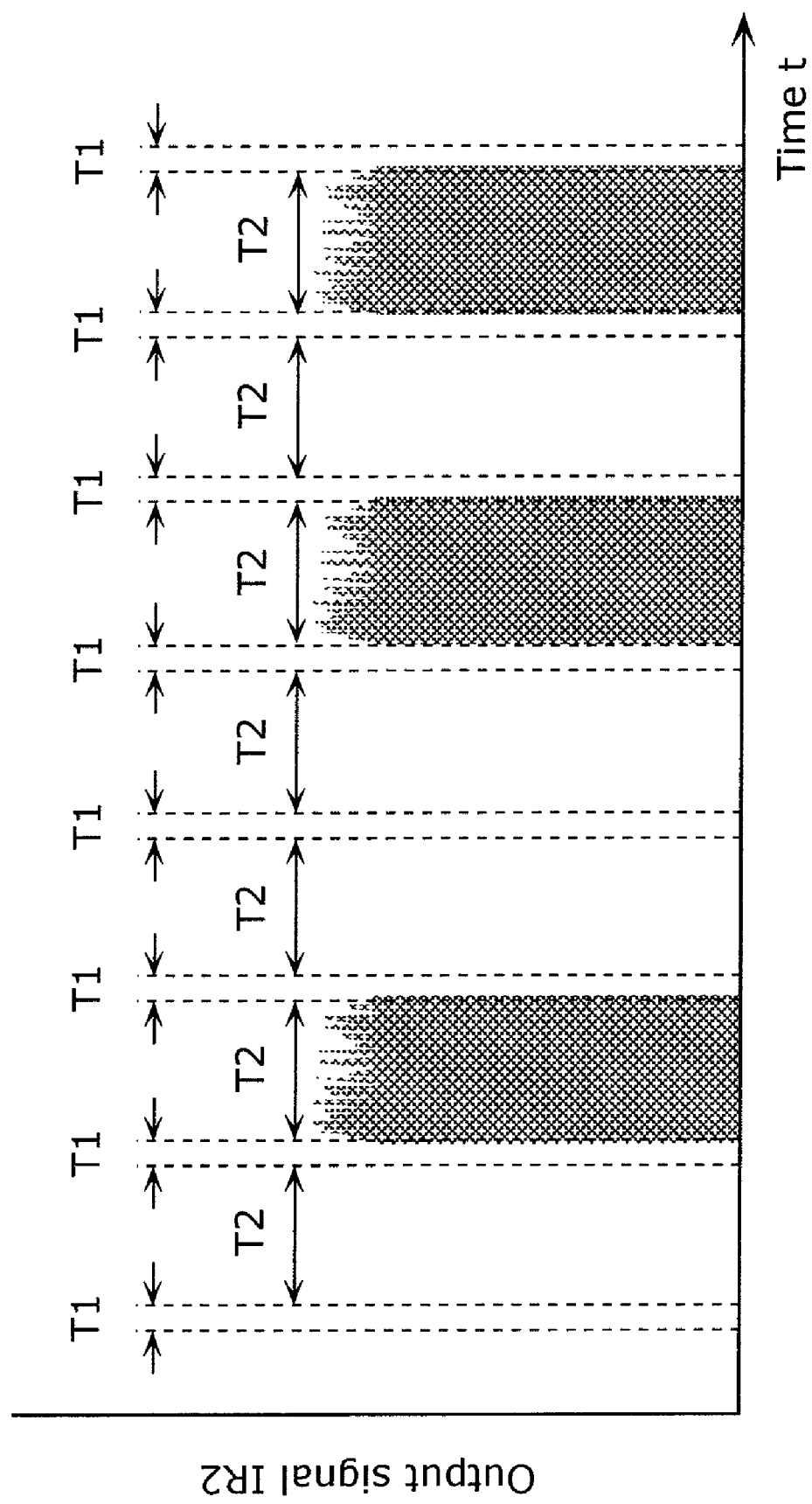
FIG. 38 shows an exemplary output signal from a unit pixel, which receives only second infrared light, in the solid-state imaging device according to the fifth embodiment of the present invention.

FIG. 38 shows an output signal IR2 outputted from the unit pixel 563 of the solid-state imaging device 160 when the solid-state imaging device 160 receives the second infrared light modulated in the temporally pseudo-random manner and emitted at the timing shown in FIG. 37. As shown in FIG. 38, the unit pixel 563 outputs the output signal IR2 modulated in the temporally pseudo-random manner at the timing when the infrared LED lamp unit 140 emits the second infrared light. As in the case of the first infrared light, timings of emission and modulation of the light emitted by the headlight of the oncoming vehicle are different in pattern from those shown in FIGS. 37 and 38. Accordingly, the camera unit 530 captures the output signal IR2 outputted from the unit pixel 563 of the solid-state imaging device 160 at the timing when the headlight module 500 emits the second infrared light. As a result, the headlight module 500 can readily reduce the influence of the light emitted by the headlight of the oncoming vehicle and extract only the second infrared light emitted thereby.

The solid-state imaging device 160 outputs each of the output signals IR1 and IR2 at the timings shown in FIGS. 11 and 38. The A/D conversion unit 101 receives the analog signals (output signals IR1 and IR2) from the solid-state imaging device 160, and converts each of the analog signals into a digital signal (S102). The frame memory 102 stores therein the digital signal obtained from the A/D conversion by the A/D conversion unit 101. The DC detection unit 109 of the detection unit 104 determines whether or not the signal stored in the frame memory 102 is saturated due to, for example, the light emitted by the headlight of the oncoming vehicle (S103). In other words, the DC detection unit 109 determines whether a signal level of the signal generated by the solid-state imaging device 160 is equal to or more than a predetermined signal level.

If the output signal IR1 is saturated ("Yes" in S103), the light attenuation unit 105 attenuates the light to be received by the solid-state imaging device 160 until the signal stored in the frame memory 102 has a predetermined intensity (S104). A signal can be extracted from the output signal IR1 by the light attenuation even when the output signal IR1 is saturated due to the influence of the light emitted by the headlight of the oncoming vehicle. Also in the case where the output signal IR2 is saturated, the aforementioned operations are performed.

If the DC detection unit 109 determines that the output signal IR1 is not saturated ("No" in S103) or after the light attenuation (S104), the DC detection unit 109 detects a signal having a DC component, which is generated due to the light emitted by the headlight of the oncoming vehicle (S105). For example, the DC detection unit 109 detects a signal level of the signal outputted from the unit pixel 562 at a period during which the first infrared LED 501 does not emit the first infrared light, thereby detecting the signal having the DC component, which is generated due to the influence of the light emitted by the headlight of the oncoming vehicle. Herein, the DC detection unit 109 may detect a signal level of the signal outputted from the unit pixel 563 at a period during which the second infrared LED 502 does not emit the second infrared light.

Next, the AC detection unit 110 detects a signal corresponding to light different in frequency component from the first infrared light and the second infrared light emitted by the infrared LED lamp unit 540, on the basis of the pulse signal 205 (S106). Herein, an order of the DC detection (S105) and the AC detection (S106) may be optional. For example, the DC detection may be performed after the AC detection. Alternatively, the DC detection and the AC detection may be performed simultaneously.

The extraction unit 111 removes the signal having the DC component, which is generated due to the light emitted by the headlight of the oncoming vehicle and is detected by the DC detection unit 109 in Step S105, and the signal having the AC component, which is generated due to the light emitted by the headlight of the oncoming vehicle and is detected by the AC detection unit 110 in Step S106, from the signal stored in the frame memory 102, thereby extracting only the first infrared light and the second infrared light emitted by the infrared LED lamp unit 540 (S107). The frame memory 106 stores therein signals corresponding to the first infrared light and the second infrared light which are emitted by the infrared LED lamp unit 540 and are extracted by the extraction unit 111.

The image synthesis unit 107 synthesizes an image taken in a frame during which the first infrared LED 501 emits the first infrared light with an image taken in a frame during which the second infrared LED 502 emits the second infrared light, on the basis of the signals stored in the frame memory 106 (S108). Thus, an image to be displayed gives no uncomfortable feeling to the user.

The image output unit 108 outputs an image obtained from the image synthesis by the image synthesis unit 107 (S109). For example, the image output unit 108 outputs the image to the display unit (display) mounted on the interior of the vehicle, so that the user (driver) can see the image taken from the infrared light and displayed on the display unit.

Herein, the solid-state imaging device 160 may be a CCD sensor or a MOS sensor. Since the solid-state imaging device 160 reads out a signal at a high speed in a pseudo-random manner, a MOS sensor is preferably used as the solid-state imaging device 160.

As described above, the headlight module 500 according to the fifth embodiment of the present invention has similar advantages to those of the headlight module 100 according to the first embodiment of the present invention.

In the headlight module 500 according to the fifth embodiment of the present invention, further, the timing of emission of the infrared light by the first infrared LED 501 is temporally opposite to the timing of emission of the infrared light by the second infrared LED 502. That is, one of the first infrared LED 501 and the second infrared LED 502 lights up at all times; therefore, an image can be generated without loss. Accordingly, the headlight module 500 according to the fifth embodiment of the present invention can readily synthesize an image. Furthermore, the headlight module 500 according to the fifth embodiment of the present invention can take a high-quality image.

In the foregoing description, the modulation of the first infrared light and the modulation of the second infrared light are temporally opposite to each other as shown in FIGS. 9 and 37. However, the present invention is not limited thereto. In one frame, for example, the first infrared light and the second infrared light may be emitted simultaneously. That is, the infrared LED lamp unit 540 emits at least one of the first infrared light and the second infrared light in each frame; thus, the infrared light can be emitted constantly. As a result, an image can be taken without loss. In the case that the modulation of the first infrared light and the modulation of the second infrared light are opposite to each other as described above, the same pulse signal 205 can control emission and extraction of the first infrared light and the second infrared light. As a result, the headlight module 500 can be controlled readily.

In one frame, further, neither the first infrared light nor the second infrared light may by emitted. For example, the second infrared light is emitted in some of frames in which the first infrared light is not emitted. Thus, the number of frames in which no infrared light is emitted can be reduced, unlike the case of using single infrared light. In other words, an image can be taken without loss. The light-emission control unit 204 allows the first infrared LED 501 to emit the first infrared light which is modulated according to a temporally pseudo-random first modulation, and allows the second infrared LED 502 to emit the second infrared light which is modulated according to a temporally pseudo-random second modulation different from the first modulation.

Sixth Embodiment

A headlight module according to the sixth embodiment of the present invention is a modification of the headlight module according to the fifth embodiment of the present invention. The headlight module according to the sixth embodiment of the present invention includes a first headlight module and a second headlight module which are mounted on a right front side and a left front side of a vehicle. Herein, the first headlight module emits first infrared light, and the second headlight module emits second infrared light. Furthermore, the first headlight module receives the reflected second infrared light, and the second headlight module receives the reflected first infrared light.

Figure 39:
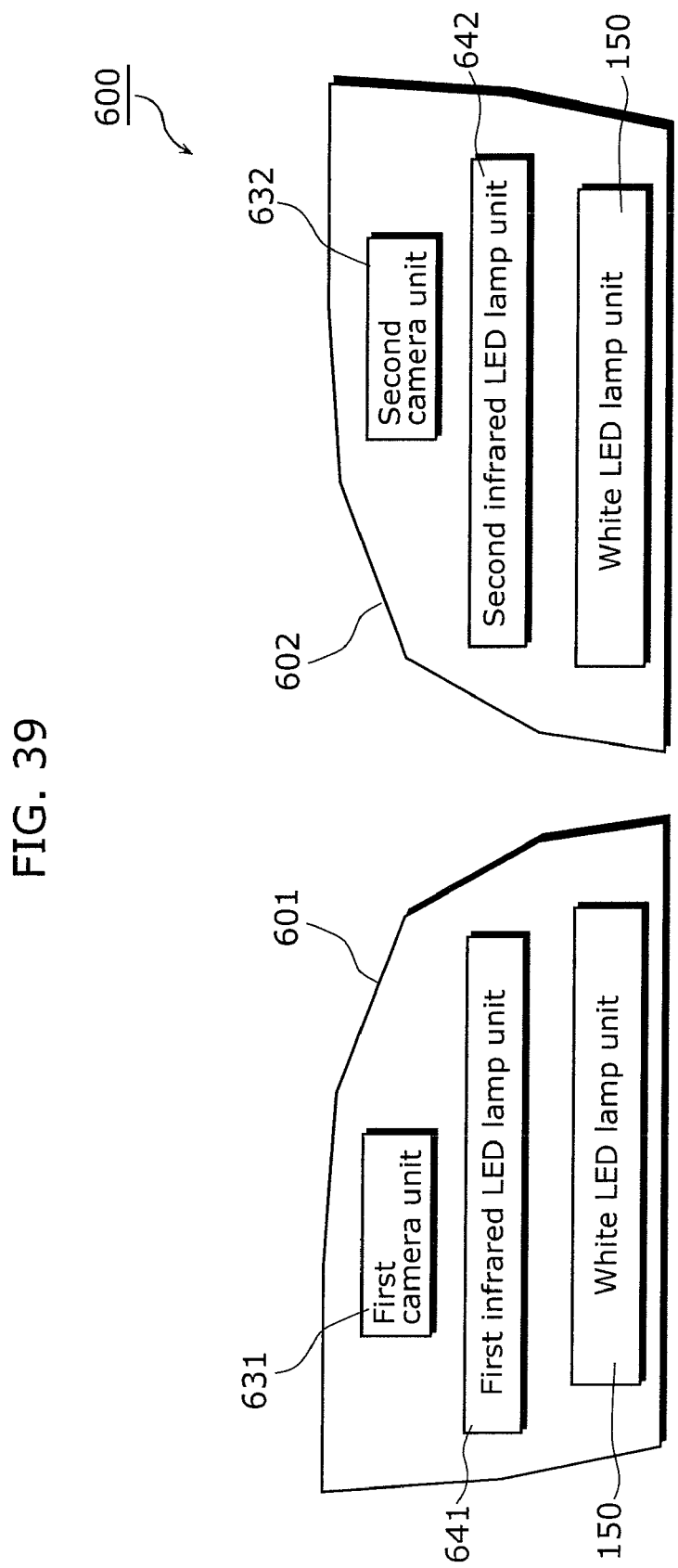
FIG. 39 shows a schematic configuration of a headlight module according to a sixth embodiment of the present invention.

FIG. 39 shows a schematic configuration of the headlight module according to the sixth embodiment of the present invention. In FIG. 39, similar constituent elements to those in FIG. 29 are denoted by identical reference numerals to those in FIG. 29; therefore, detailed description thereof will not be given here.

As shown in FIG. 39, the headlight module 600 includes the first headlight module 601 and the second headlight module 602. For example, the first headlight module 601 is mounted on the right front side of the vehicle, and the second headlight module 602 is mounted on the left front side of the vehicle.

The first headlight module 601 emits the first infrared light and receives the second infrared light. The first headlight module 601 includes a first camera unit 631, a first infrared LED lamp unit 641 and a white LED lamp unit 150.

The second headlight module 602 emits the second infrared light and receives the first infrared light. The second headlight module 602 includes a second camera unit 632, a second infrared LED lamp unit 642 and a white LED lamp unit 150.

Figure 40:
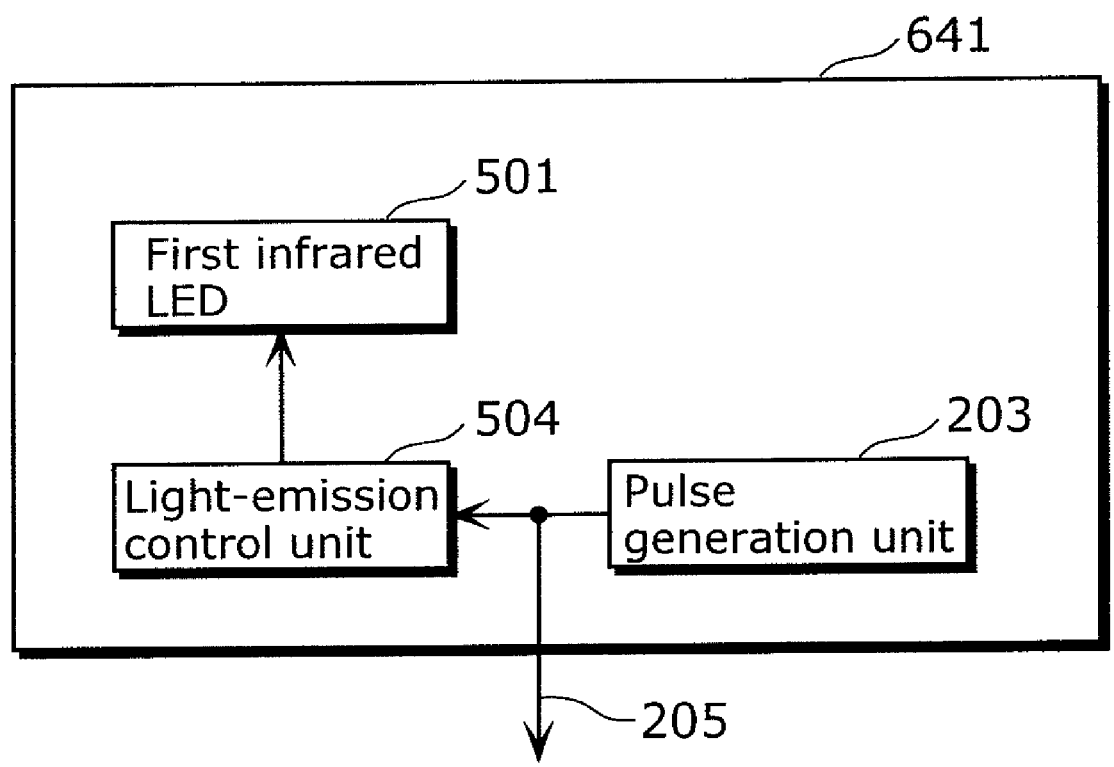
FIG. 40 shows a schematic configuration of a first infrared LED lamp unit according to the sixth embodiment of the present invention.

FIG. 40 shows a configuration of the first infrared LED lamp unit 641. As shown in FIG. 40, the first infrared LED lamp unit 641 includes a first infrared LED 501, a pulse generation unit 203 and a light-emission control unit 504. In FIG. 40, similar constituent elements to those in FIG. 30 are denoted by identical reference numerals to those in FIG. 30; therefore, detailed description thereof will not be given here.

Figure 41:
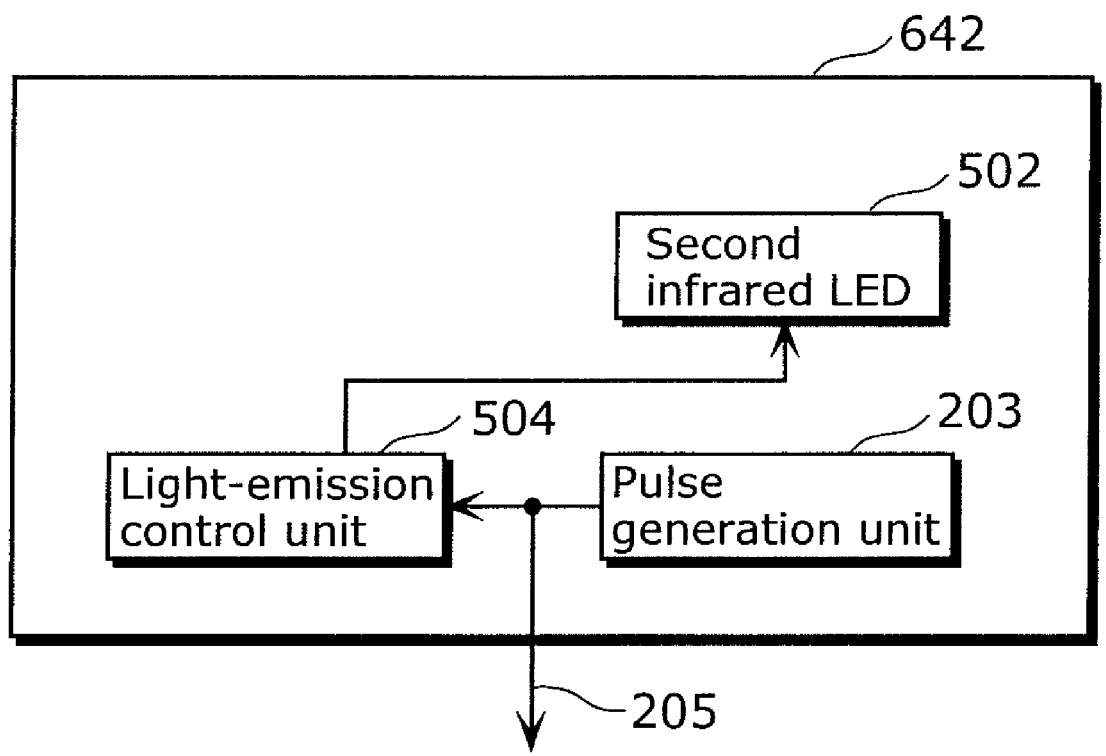
FIG. 41 shows a schematic configuration of a second infrared LED lamp unit according to the sixth embodiment of the present invention.

FIG. 41 shows a configuration of the second infrared LED lamp unit 642. As shown in FIG. 41, the second infrared LED lamp unit 642 includes a second infrared LED 502, a pulse generation unit 203 and a light-emission control unit 504. In FIG. 41, similar constituent elements to those in FIG. 30 are denoted by identical reference numerals to those in FIG. 30; therefore, detailed description thereof will not be given here.

Herein, a block configuration of each of the first camera unit 631 and the second camera unit 632 is similar to that shown in FIG. 4. In the sixth embodiment of the present invention, each of the first camera unit 631 and the second camera unit 632 is different from the camera unit 530 according to the fifth embodiment of the present invention in a configuration of a solid-state imaging device 160.

Figure 42:
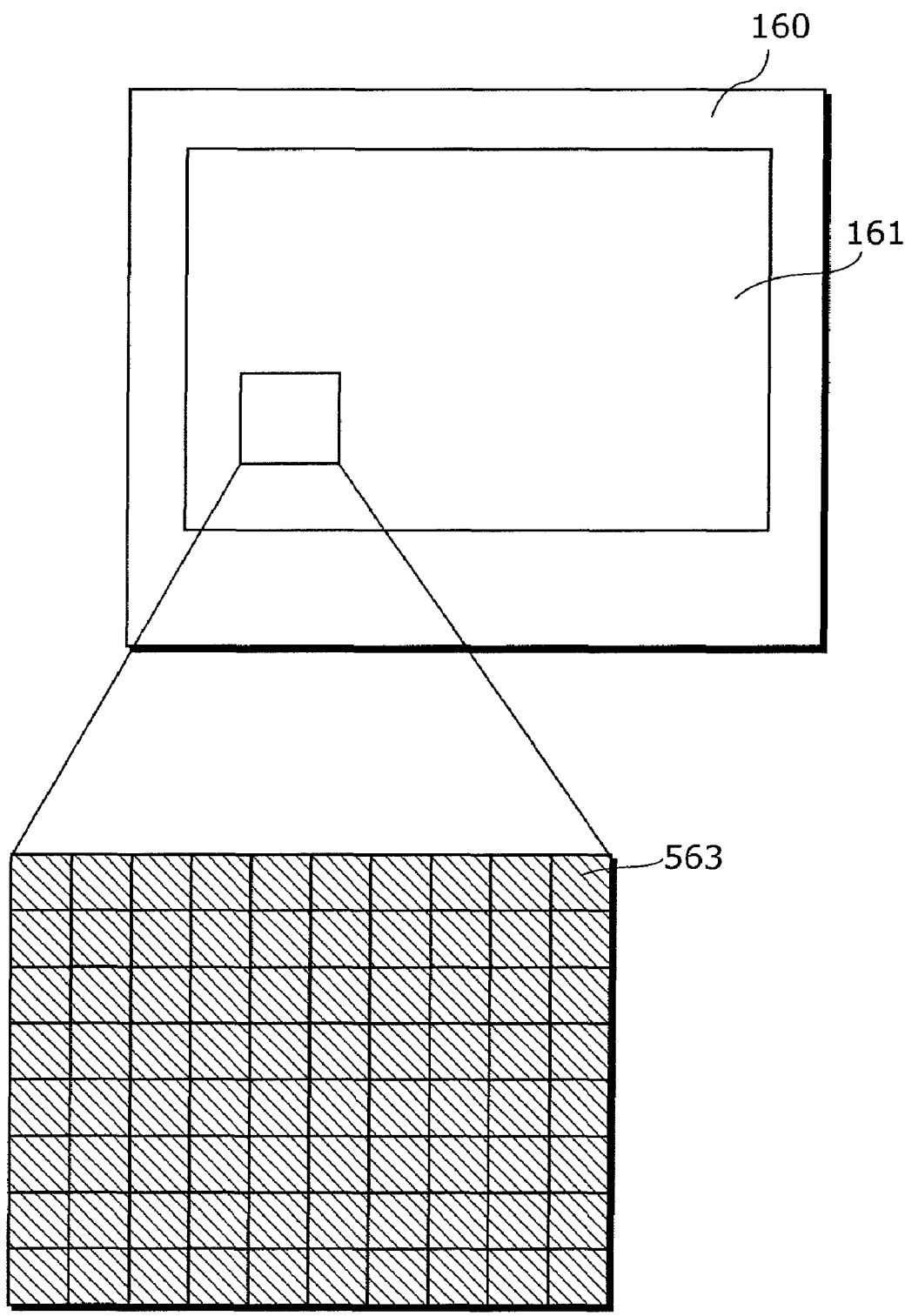
FIG. 42 shows a schematic configuration of a solid-state imaging device of a first module according to the sixth embodiment of the present invention.

FIG. 42 shows a schematic configuration of a solid-state imaging device 160 in the first camera unit 631 and an arrangement of pixels in the solid-state imaging device 160. In the first camera unit 631, the solid-state imaging device 160 includes an imaging region 161 on which a plurality unit pixels (pixel size: 5.6 μm square, for example) are arranged two-dimensionally. In the first camera unit 631, the unit pixels arranged on the imaging region 161 are unit pixels 563 each of which functions as a filter for transmitting only the second infrared light and has a sensitivity at a wavelength of the second infrared light. In the first camera unit 631, the unit pixels arranged on the imaging region 161 may be the unit pixels 563, and unit pixels 564 each of which has a sensitivity at a wavelength of visible light. For example, the unit pixels 563 and the unit pixels 564 are arranged in a staggered pattern, a horizontal stripe pattern or a vertical stripe pattern.

Figure 43:
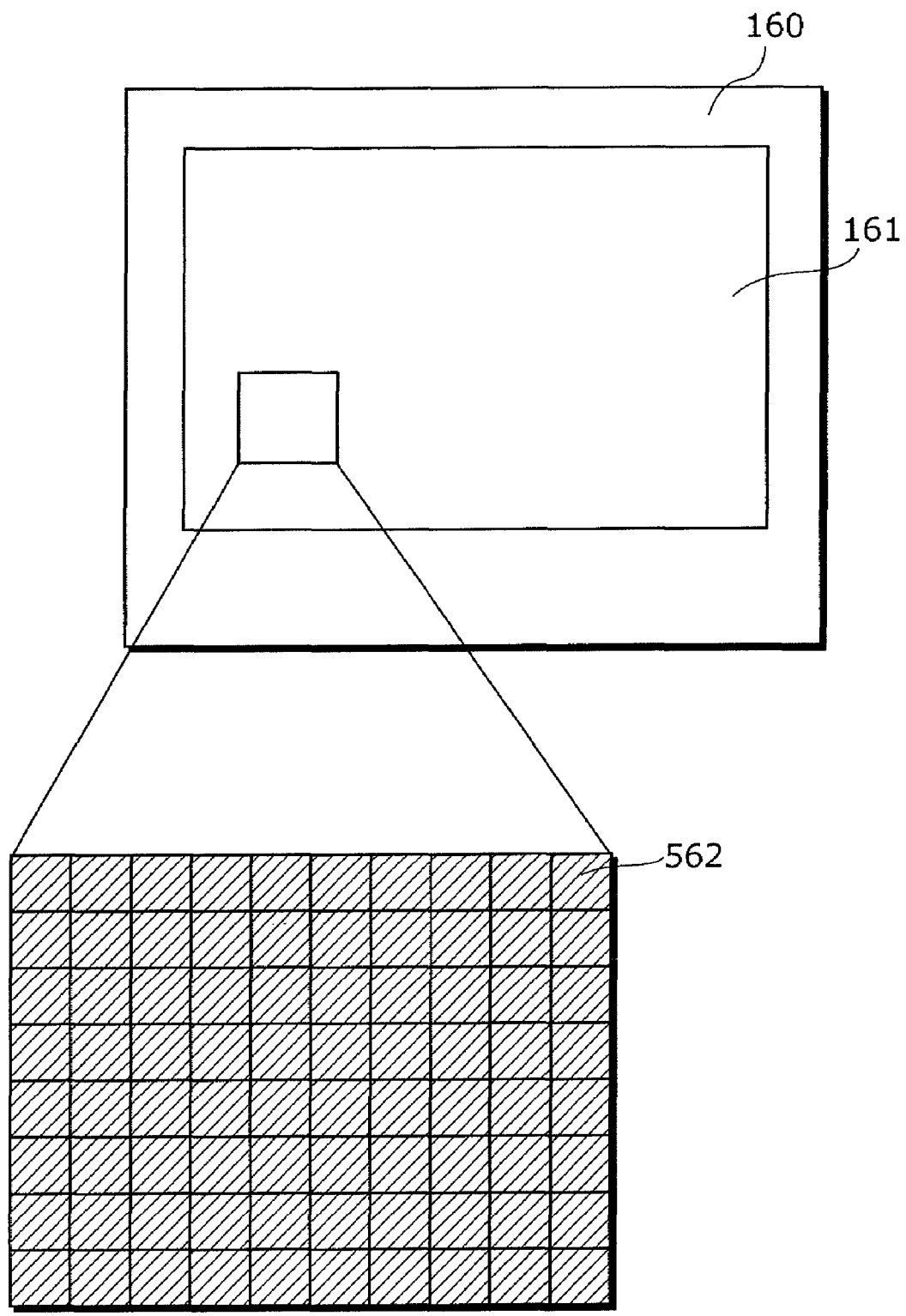
FIG. 43 shows a schematic configuration of a solid-state imaging device of a second module according to the sixth embodiment of the present invention.

FIG. 43 shows a schematic configuration of a solid-state imaging device 160 in the second camera unit 632 and an arrangement of pixels in the solid-state imaging device 160. In the second camera unit 632, the solid-state imaging device 160 includes an imaging region 161 on which a plurality of unit pixels (pixel size: 5.6 μm square, for example) are arranged two-dimensionally. In the second camera unit 632, the unit pixels arranged on the imaging region 161 are unit pixels 562 each of which functions as a filter for transmitting only the first infrared light and has a sensitivity at a wavelength of the first infrared light. In the second camera unit 632, the unit pixels arranged on the imaging region 161 may be the unit pixels 562, and unit pixels 564 each of which has a sensitivity at a wavelength of visible light. For example, the unit pixels 562 and the unit pixels 564 are arranged in a staggered pattern, a horizontal stripe pattern or a vertical stripe pattern.

The second infrared LED lamp unit 642 emits the second infrared light to a forward area of a vehicle on which the headlight module 600 according to the sixth embodiment of the present invention is mounted. Then, the first camera unit 631 receives the second infrared light reflected from an object on the forward area to take an image from the received second infrared light. That is, the first camera unit 631 and the second infrared LED lamp unit 642 form a night-vision imaging apparatus.

On the other hand, the first infrared LED lamp unit 641 emits the first infrared light to the forward area of the vehicle. Then, the second camera unit 632 receives the first infrared light reflected from the object on the forward area to take an image from the received first infrared light. That is, the second camera unit 632 and the first infrared LED lamp unit 641 form a night-vision imaging apparatus.

Moreover, each of the first camera unit 631 and the second camera unit 632 receives the visible light to take an image from the received visible light.

In the headlight module 600 according to the sixth embodiment of the present invention, as described above, the first headlight module 601 emits the first infrared light and the second headlight module 602 receives the reflected first infrared light. Furthermore, the second headlight module 602 emits the second infrared light and the first headlight module 601 receives the reflected second infrared light. Accordingly, a camera unit in a headlight module is less susceptible to an influence of infrared light emitted by an infrared LED lamp unit in the headlight module. In the headlight module according to the fifth embodiment of the present invention, for example, each of the first infrared LED 501 and the second infrared LED 502 adjoins to the camera unit 130 which receives both the reflected first infrared light and the reflected second infrared light. This configuration has the following problem that the camera unit 130 directly receives the first infrared light (or the second infrared light) emitted by the first infrared LED 501 (or the second infrared LED 502), leading to degradation in quality of an image to be generated. In the headlight module 600 according to the sixth embodiment of the present invention, on the other hand, the first headlight module 601 which emits the first infrared light (receives the reflected second infrared light) and the second headlight module 602 which receives the reflected first infrared light (emits the second infrared light) are mounted on the vehicle so as to be spaced away from each other. This leads to suppression of an influence exerted, on an image to be taken, by the first infrared light and the second infrared light emitted by the headlight module 600 before the first infrared light and the second infrared light are reflected from the object.

In the headlight module 600 according to the sixth embodiment of the present invention, further, the first headlight module 601 and the second headlight module 602 are arranged in stereo. Therefore, it is possible to measure relative positions of moving objects on the basis of a difference in arrival time of light.

Seventh Embodiment

A headlight module according to the seventh embodiment of the present invention emits two kinds of infrared light which are different in direction of polarization from each other and are modulated in a temporally pseudo-random manner, and captures signals according to the modulation. As a result, infrared-light emission patterns become unique to each vehicle. Therefore, the headlight module can extract only the infrared light emitted thereby. Thus, the headlight module can reduce an influence of light emitted by a headlight of an oncoming vehicle.

First, a configuration of the headlight module according to the seventh embodiment of the present invention is described.

Figure 44:
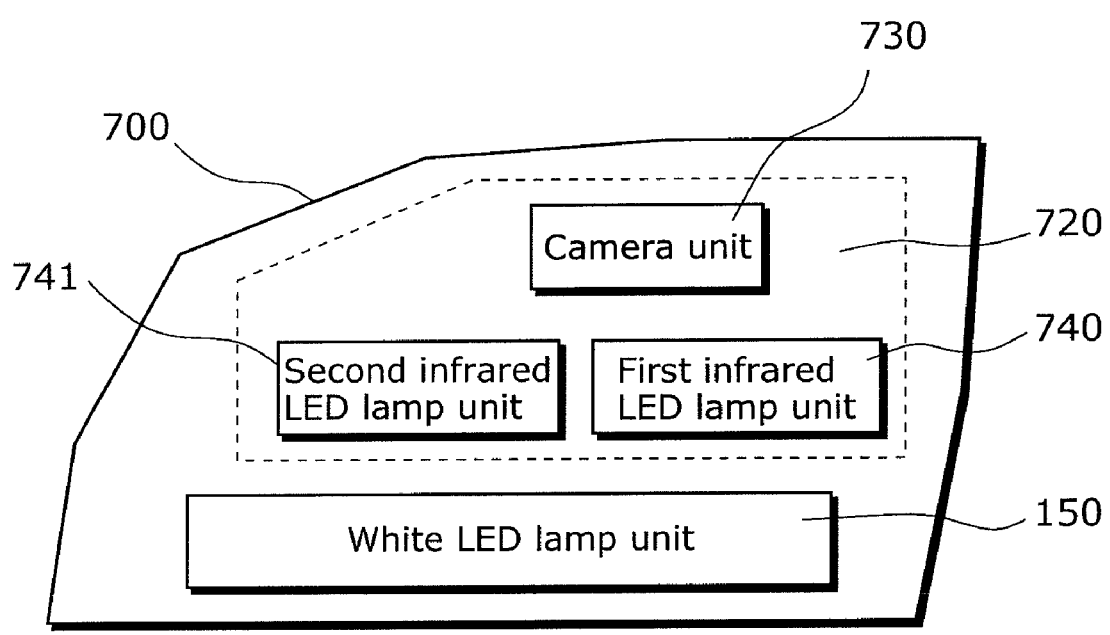
FIG. 44 shows a schematic configuration of a headlight module according to a seventh embodiment of the present invention.

FIG. 44 shows a schematic configuration of the headlight module according to the seventh embodiment of the present invention. In FIG. 44, similar constituent elements to those in FIG. 1 are denoted by identical reference numerals to those in FIG. 1; therefore, detailed description thereof will not be given here. As shown in FIG. 44, the headlight module 700 includes a night-vision imaging apparatus 720 and a white LED lamp unit 150. The night-vision imaging apparatus 720 includes a camera unit 730, a first infrared LED lamp unit 740 and a second infrared LED lamp unit 741.

Each of the first infrared LED lamp unit 740 and the second infrared LED lamp unit 741 emits the infrared light to a forward area of a vehicle on which the headlight module 700 is mounted. Then, the camera unit 730 receives the infrared light reflected from an object on the forward area to take an image from the received infrared light.

The first infrared LED lamp unit 740 emits third infrared light linearly polarized in a first direction. In the seventh embodiment of the present invention, the first direction is almost perpendicular to the ground.

The second infrared LED lamp unit 741 emits fourth infrared light linearly polarized in a second direction which is different from the first direction. In the seventh embodiment of the present invention, the second direction is almost parallel to the ground. That is, the first direction is orthogonal to the second direction.

Moreover, the first infrared LED lamp unit 740 and the second infrared LED lamp unit 741 emit the third infrared light and the fourth infrared light, respectively, as a high beam. In the seventh embodiment of the present invention, each of the third infrared light and the fourth infrared light is near-infrared light.

Herein, the camera unit 730, each of the first infrared LED lamp unit 740 and the second infrared LED lamp unit 741 and the white LED lamp unit 150 are provided in this order from above as shown in FIG. 44; however, a placement order and a position of the aforementioned units are not limited to those shown in FIG. 44.

Figure 45:
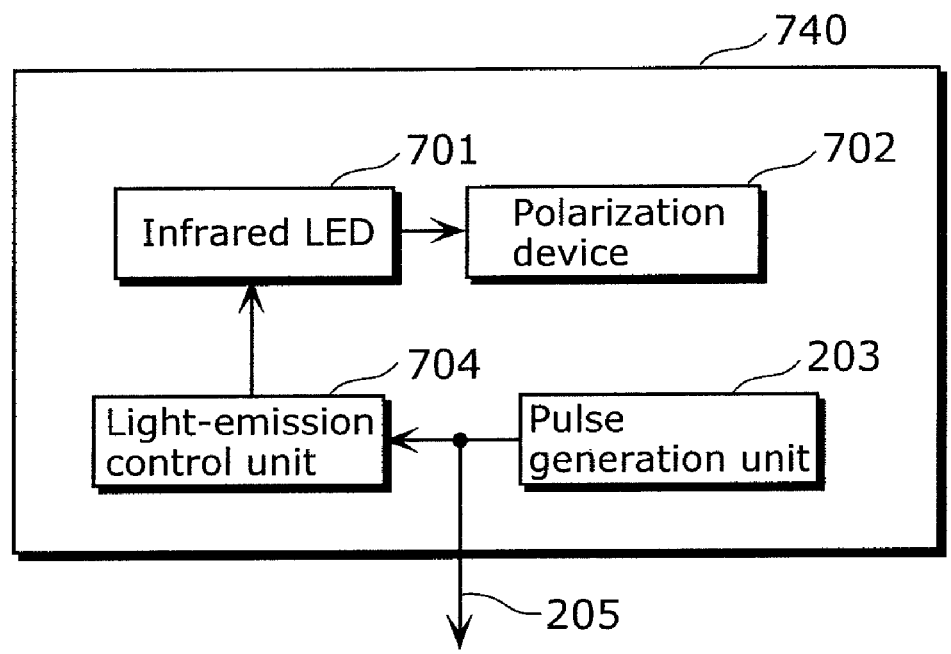
FIG. 45 shows a schematic configuration of a first infrared LED lamp unit according to the seventh embodiment of the present invention.

FIG. 45 shows a block diagram of a configuration of the first infrared LED lamp unit 740. As shown in FIG. 45, the first infrared LED lamp unit 740 includes an infrared LED 701, a polarization device 702, a pulse generation unit 203 and a light-emission control unit 704.

The infrared LED 701 emits the infrared light under control by the light-emission control unit 704.

The polarization device 702 transmits only the infrared light having a linear polarization component in a direction almost perpendicular to the ground from among the infrared light emitted by the infrared LED 701. More specifically, the polarization device 702 linearly polarizes the infrared light, which is emitted by the infrared LED 701, in the direction almost perpendicular to the ground to output the third infrared light.

The pulse generation unit 203 generates a pulse signal 205 modulated in the temporally pseudo-random manner. The pulse generation unit 203 outputs the pulse signal 205 to each of the light-emission control unit 704 and the camera unit 730.

At a timing indicated by the pulse signal 205 from the pulse generation unit 203, the light-emission control unit 704 allows the infrared LED 701 to emit the infrared light modulated in the temporally pseudo-random manner.

Figure 46:
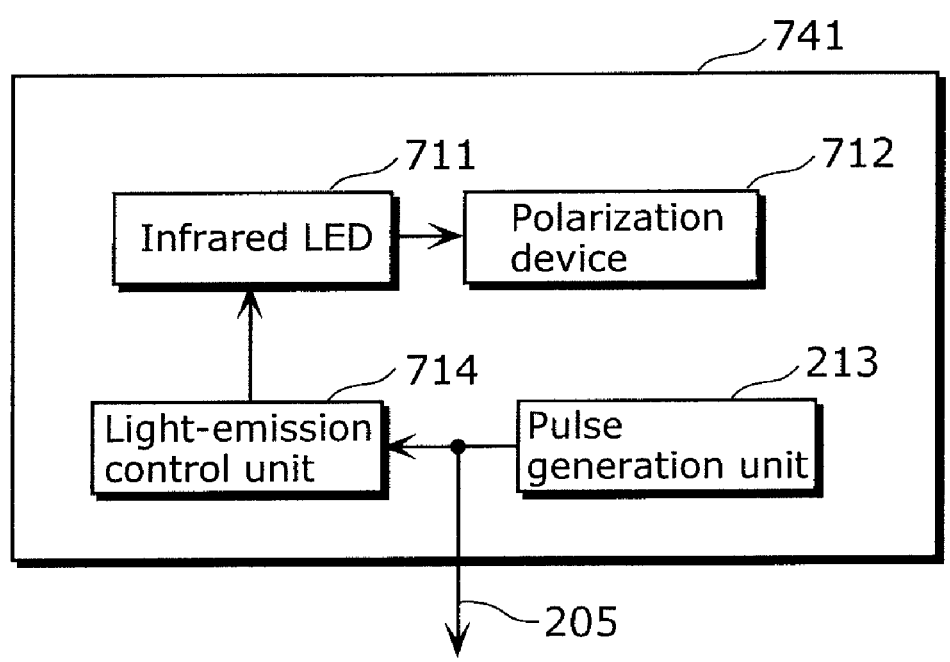
FIG. 46 shows a schematic configuration of a second infrared LED lamp unit according to the seventh embodiment of the present invention.

FIG. 46 shows a block diagram of a configuration of the second infrared LED lamp unit 741. As shown in FIG. 46, the second infrared LED lamp unit 741 includes an infrared LED 711, a polarization device 712, a pulse generation unit 213 and a light-emission control unit 714.

The infrared LED 711 emits the infrared light under control by the light-emission control unit 714.

The polarization device 712 transmits only the infrared light having a linear polarization component in a direction almost parallel to the ground from among the infrared light emitted by the infrared LED 711. More specifically, the polarization device 712 linearly polarizes the infrared light, which is emitted by the infrared LED 711, in the direction almost parallel to the ground to output the fourth infrared light.

The pulse generation unit 213 generates a pulse signal 205 modulated in the temporally pseudo-random manner. The pulse generation unit 213 outputs the pulse signal 205 to each of the light-emission control unit 714 and the camera unit 730. Herein, the pulse signal 205 generated by the pulse generation unit 213 is identical to the pulse signal 205 generated by the pulse generation unit 203. Herein, only one of the pulse generation unit 203 and the pulse generation unit 213 may output the pulse signal 205 to the camera unit 730. In addition, the pulse signals 205 to be generated by the pulse generation units 203 and 213 may be identical in pattern to each other. Alternatively, a signal level of the pulse signal 205 generated by the pulse generation unit 203 may be opposite to a signal level of the pulse signal 205 generated by the pulse generation unit 213.

At a timing indicated by the pulse signal 205 from the pulse generation unit 213, the light-emission control unit 714 allows the infrared LED 711 to emit the infrared light modulated in the temporally pseudo-random manner. Herein, the modulation of the third infrared light and the modulation of the fourth infrared light are temporally opposite to each other. That is, the light-emission control unit 714 allows the infrared LED 711 to the emit infrared light modulated in the pseudo-random manner at a timing opposite to a timing of emission of the infrared light by the infrared LED 701.

A configuration of the camera unit 730 is similar to that shown in FIG. 4. The camera unit 730 includes a solid-state imaging device 160, an A/D conversion unit 101, a frame memory 102, a detection unit 104, a light attenuation unit 105, a frame memory 106, an image synthesis unit 107 and an image output unit 108.

When the first infrared LED lamp unit 740 emits the third infrared light to the forward area of the vehicle on which the headlight module 700 is mounted, the solid-state imaging device 160 receives the third infrared light reflected from the object on the forward area, converts the received third infrared light into an analog signal (sixth signal), and outputs the sixth signal to the A/D conversion unit 101. Moreover, when the second infrared LED lamp unit 741 emits the fourth infrared light to the forward area of the vehicle, the solid-state imaging device 160 receives the fourth infrared light reflected from the object on the forward area, converts the received fourth infrared light into an analog signal (seventh signal), and outputs the seventh signal to the A/D conversion unit 101.

The A/D conversion unit 101 receives the sixth signal and the seventh signal from the solid-state imaging device 160, and converts each of the sixth and seventh signals into a digital signal.

The frame memory 102 receives the digital signal from the A/D conversion unit 101, and stores the digital signal therein.

The detection unit 104 retrieves the signal stored in the frame memory 102, at a timing indicated by the pulse signal 205 from the pulse generation unit 203. Herein, the detection unit 104 may retrieve the signal stored in the frame memory 102, at a timing indicated by the pulse signal 205 from the pulse generation unit 213. Moreover, the detection unit 104 removes, for example, the influence of the light emitted by the headlight of the oncoming vehicle, from the signal stored in the frame memory 102. The detection unit 104 includes a DC detection unit 109, an AC detection unit 110 and an extraction unit 111.

The DC detection unit 109 detects a signal having a DC component, which is generated due to the light emitted by the headlight of the oncoming vehicle, from the signal generated by the solid-state imaging device 160 and stored in the frame memory 102. Moreover, the DC detection unit 109 determines whether an intensity of the signal, which is generated by the solid-state imaging device 160 and is stored in the frame memory 102, is equal to or more than a predetermined intensity.

If the DC detection unit 109 determines that the intensity is equal to or more than the predetermined intensity, the light attenuation unit 105 attenuates the light to be received by the solid-state imaging device 160.

The AC detection unit 110 detects a signal having a component, which is different in timing (frequency characteristic) from a component of the pulse signal 205, from the signal stored in the frame memory 102 or a signal obtained from the light attenuation by the light attenuation unit 105.

At a timing of change of the pulse signal 205, the extraction unit 111 extracts a signal corresponding to the infrared light emitted by the headlight module 700 from the signal stored in the frame memory 102 or the signal obtained from the light attenuation by the light attenuation unit 105. In other words, the extraction unit 111 extracts, according to the temporally pseudo-random modulation of the third infrared light emitted by the first infrared LED lamp unit 740, a signal corresponding to the third infrared light emitted by the first infrared LED lamp unit 740 from the sixth signal generated by the solid-state imaging device 160. Furthermore, the extraction unit 111 extracts, according to the temporally pseudo-random modulation of the fourth infrared light emitted by the second infrared LED lamp unit 741, a signal corresponding to the fourth infrared light emitted by the second infrared LED lamp unit 741 from the seventh signal generated by the solid-state imaging device 160. Accordingly, the extraction unit 111 can extract only the signal corresponding to the infrared light emitted by the headlight module 700. Moreover, the extraction unit 111 subtracts the signals, which correspond to the light emitted by the headlight of the oncoming vehicle and are detected by the DC detection unit 109 and the AC detection unit 110, from the signal stored in the frame memory 102 or the signal obtained from the light attenuation by the light attenuation unit 105, thereby extracting the signal corresponding to the infrared light emitted by the headlight module 700.

The frame memory 106 stores therein the signal which corresponds to the infrared light emitted by the headlight module 700 and is extracted by the extraction unit 111.

The image synthesis unit 107 performs correction and synthesis on an image on the basis of the signal stored in the frame memory 106.

The image output unit 108 outputs the image subjected to the image correction and the image synthesis by the image synthesis unit 107 to, for example, a display unit (display) mounted on an interior of the vehicle, and the display unit displays the image outputted from the image output unit 108.

Herein, the light attenuation unit 105 may be a neutral filter or an aperture.

Next, a configuration of a pixel in the solid-state imaging device 160 and an arrangement of pixels in the solid-state imaging device 160 are described. The solid-state imaging device 160 is an imaging device applicable to a digital camera or a cellular phone with a camera function. The solid-state imaging device 160 includes an imaging region 161 on which a plurality of unit pixels (pixel size: 5.6 µm square, for example) are arranged two-dimensionally. The unit pixels arranged on the imaging region 161 are unit pixels 762 each of which functions as a filter for transmitting only the infrared light linearly polarized in the first direction and has a sensitivity of the infrared light linearly polarized in the first direction, and unit pixels 763 each of which functions as a filter for transmitting only the infrared light linearly polarized in the second direction and has a sensitivity of the infrared light linearly polarized in the second direction. The unit pixel 762 converts the infrared light linearly polarized in the first direction into an electric signal. The unit pixel 763 converts the infrared light linearly polarized in the second direction into an electric signal. As in the arrangement of the unit pixels 562 and the unit pixels 563 shown in FIG. 31, the unit pixels 762 and the unit pixels 763 are arranged in a staggered pattern on the imaging region 161, so that an image can be synthesized readily. As in the arrangement of the unit pixels 562 and the unit pixels 563 shown in FIG. 32, the unit pixels 762 and the unit pixels 763 may be arranged in a horizontal stripe pattern. Alternatively, the unit pixels 762 and the unit pixels 763 may be arranged in a vertical stripe pattern.

Figure 47:
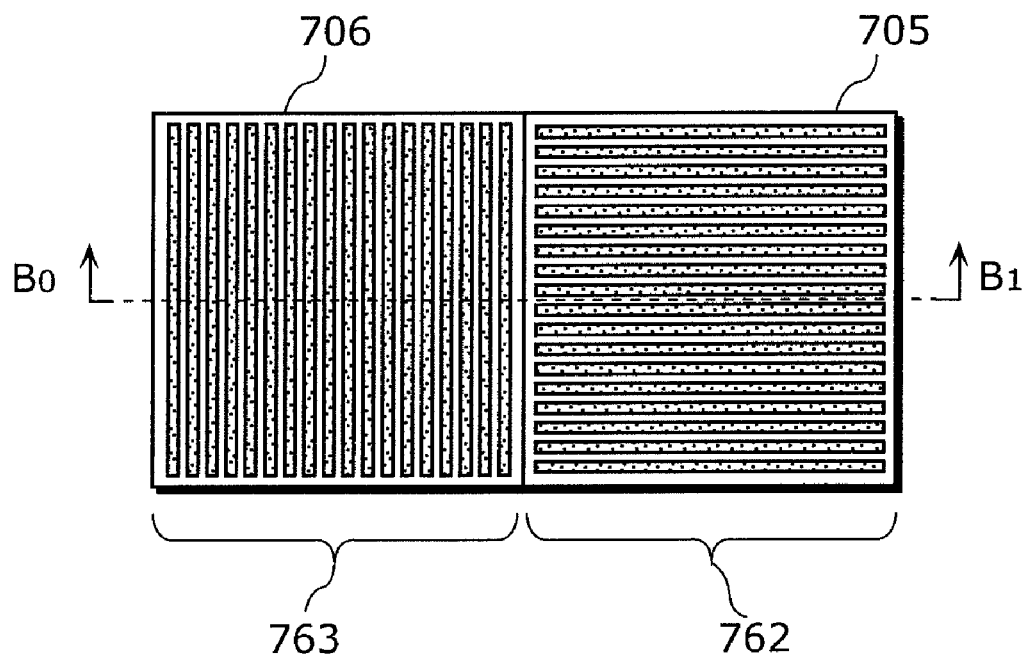
FIG. 47 shows a top view of a configuration of a solid-state imaging device according to the seventh embodiment of the present invention.
Figure 48:
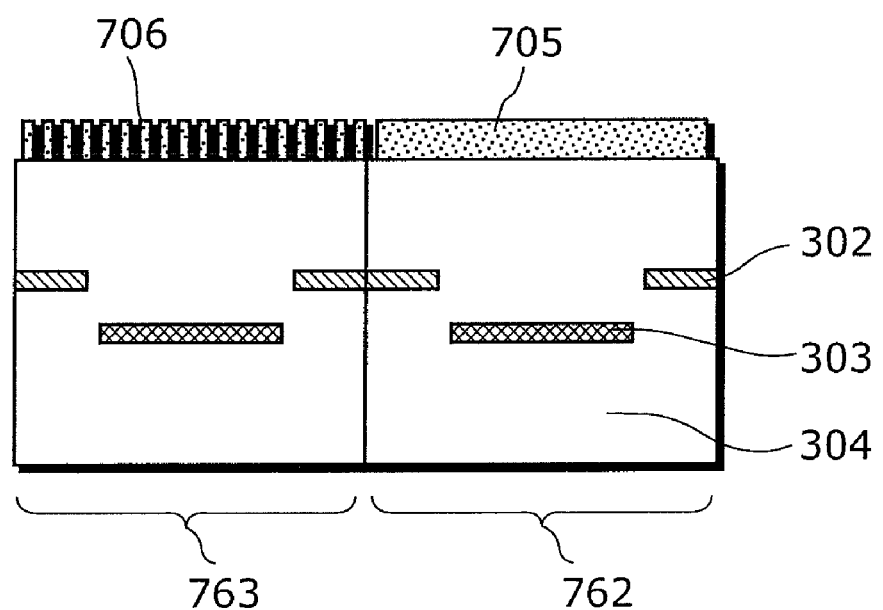
FIG. 48 shows a sectional structure of the solid-state imaging device according to the seventh embodiment of the present invention.

FIG. 47 shows a top view of the unit pixel 762 having the sensitivity of the third infrared light and the unit pixel 763 having the sensitivity of the fourth infrared light. FIG. 48 shows a sectional view taken along a line B0-B1 in FIG. 47. In FIG. 48, similar constituent elements to those in FIG. 7 are denoted by identical reference numerals to those in FIG. 7; therefore, detailed description thereof will not be given here.

As shown in FIGS. 47 and 48, the unit pixel 762 having the sensitivity of the third infrared light includes a wiring 302, a light receiving device 303 for receiving the infrared light, an Si substrate 304, and a wire grid-type polarization device 705. The unit pixel 763 having the sensitivity of the fourth infrared light includes a wiring 302, a light receiving device (Si photodiode) 303 for receiving the infrared light, an Si substrate 304, and a wire grid-type polarization device 706.

As shown in FIG. 47, a wire grid structure of the polarization device 705 is orthogonal to a wire grid structure of the polarization device 706 when being seen from above. In the seventh embodiment of the present invention, the wire grid is made of Ag. Also in the seventh embodiment of the present invention, the wire grid has a width of 0.1 µm, a thickness of 0.21 µm and a pitch of 0.2 µm.

Figure 49:
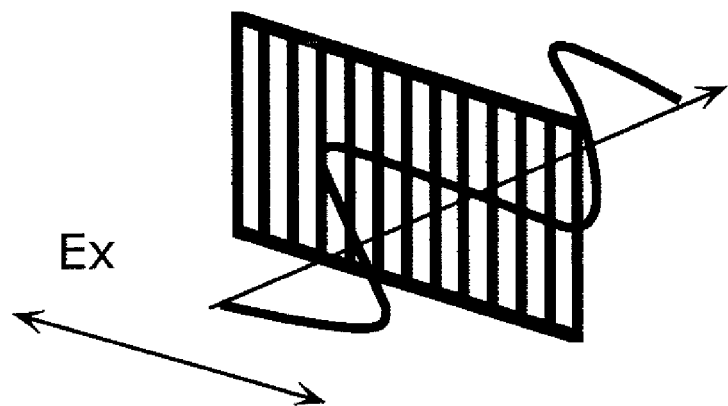
FIG. 49 schematically shows transmitting characteristics in a wire grid-type polarization device.
Figure 50:
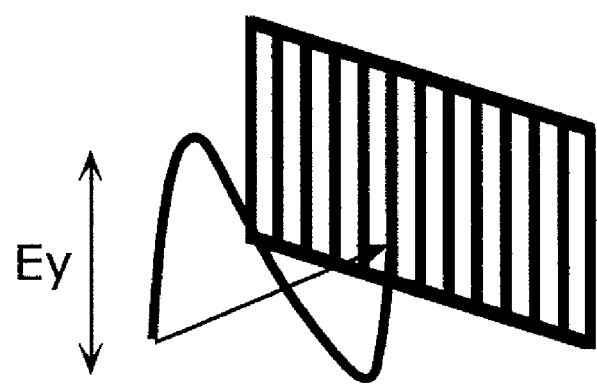
FIG. 50 schematically shows transmitting characteristics in the wire grid-type polarization device.

FIGS. 49 and 50 schematically show light transmission characteristics of a wire grid-type polarization device. As shown in FIG. 49, the polarization device transmits only light having a linear polarization component in a direction orthogonal to a stripe pattern of a wire grid. As shown in FIG. 50, on the other hand, the polarization device inhibits transmission of light having a linear polarization component in a direction parallel to the stripe pattern of the wire grid.

Next, operations performed by the headlight module 700 according to the seventh embodiment of the present invention are described.

In the headlight module 700 according to the seventh embodiment of the present invention, a timing of emission of the infrared light by the infrared LED 701 of the first infrared LED lamp unit 740 is similar to that shown in FIG. 9, and a timing of emission of the infrared light by the infrared LED 711 of the second infrared LED lamp unit 741 is similar to that shown in FIG. 37.

As shown in FIG. 9, the first infrared LED lamp unit 740 emits the third infrared light modulated in the temporally pseudo-random manner. As shown in FIG. 37, the second infrared LED lamp unit 741 emits the fourth infrared light modulated in the temporally pseudo-random manner. Thus, the headlight module 700 can reduce the influence of the light emitted by the headlight of the oncoming vehicle.

Furthermore, the timing of emission of the infrared light by the first infrared LED lamp unit 740 is opposite to the timing of emission of the infrared light by the second infrared LED lamp unit 741. Thus, one of the first infrared LED lamp unit 740 and the second infrared LED lamp unit 741 lights up at all times. As a result, an image can be taken without loss. Accordingly, the image can be synthesized readily.

As shown in FIGS. 9 and 37, the headlight module 700 selects, in the pseudo-random manner, either a frame in which the first infrared LED lamp unit 740 emits the third infrared light while the second infrared LED lamp unit 741 does not emit the fourth infrared light or a frame in which the second infrared LED lamp unit 741 emits the fourth infrared light while the first infrared LED lamp unit 740 does not emit the third infrared light. Specifically, at timings indicated by the pulse signals 205 from the pulse generation unit 203 and the pulse generation unit 213, the light-emission control unit 704 and the light-emission control unit 714 select a frame in which the infrared light linearly polarized in the first direction or the infrared light linearly polarized in the second direction is emitted.

Figure 51:
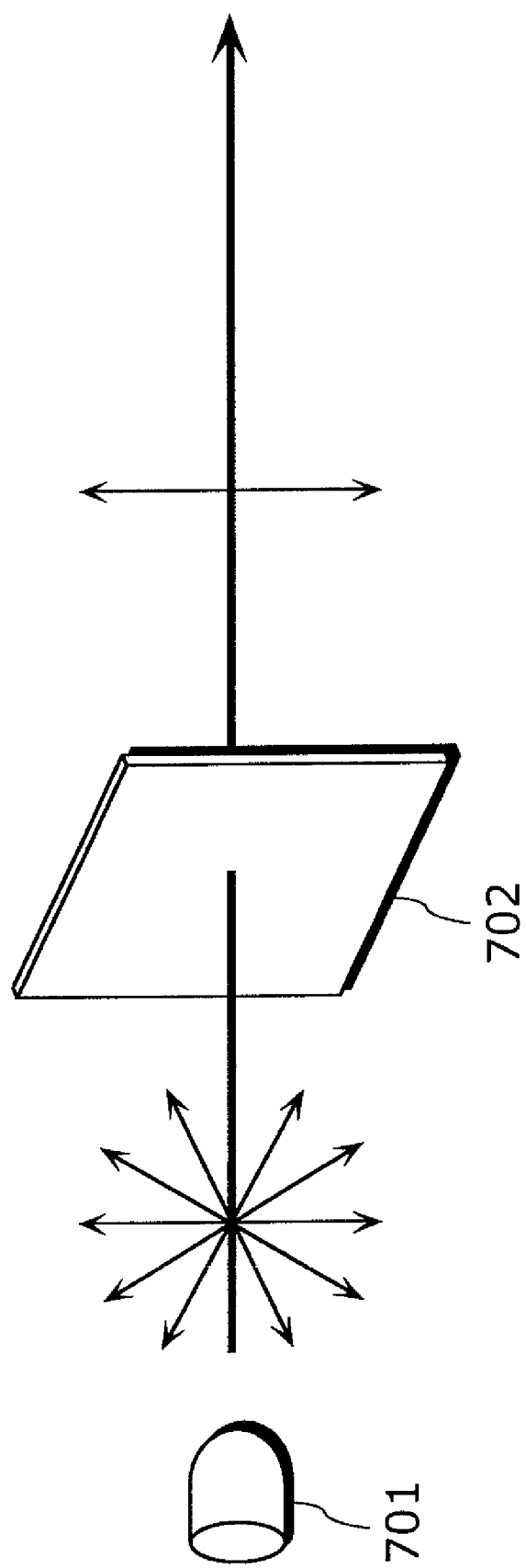
FIG. 51 schematically shows a state that a polarization device polarizes light emitted by an infrared LED, in the first infrared LED lamp unit according to the seventh embodiment of the present invention.

FIG. 51 schematically shows a state that the polarization device 702 polarizes the light emitted by the infrared LED 701. As shown in FIG. 51, the polarization device 702 transmits only light having a polarization component in a direction almost perpendicular to the ground from among the light which is emitted by the infrared LED 701 and is not linearly polarized.

Figure 52:
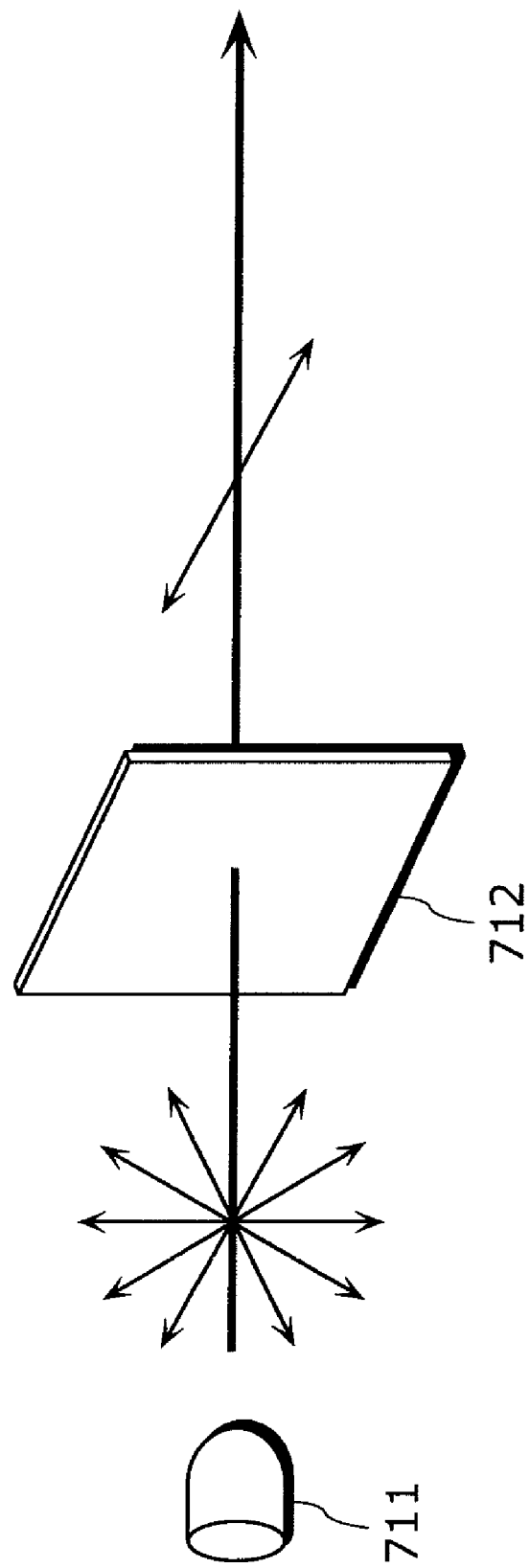
FIG. 52 schematically shows a state that a polarization device polarizes light emitted by an infrared LED, in the second infrared LED lamp unit according to the seventh embodiment of the present invention.

FIG. 52 schematically shows a state that the polarization device 712 polarizes the light emitted by the infrared LED 711. As shown in FIG. 52, the polarization device 712 transmits only light having a polarization component in a direction almost parallel to the ground from among the light which is emitted by the infrared LED 711 and is not linearly polarized. For example, the polarization device 702 and the polarization device 712 are similar to the polarization device 705 and the polarization device 706, that is, are wire grid-type polarization devices.

In the headlight module 700 according to the seventh embodiment of the present invention, a flow of operations performed by the camera unit 730 is similar to that shown in FIG. 10.

When the first infrared LED lamp unit 740 or the second infrared LED lamp unit 741 emits the third infrared light or the fourth infrared light to the forward area of the vehicle on which the headlight module 700 is mounted, first, the solid-state imaging device 160 receives the third infrared light or the fourth infrared light reflected from the object on the forward area (S101).

An output signal IR1 outputted from the unit pixel 762 of the solid-state imaging device 160 when the solid-state imaging device 160 receives the third infrared light modulated in the temporally pseudo-random manner and emitted at the timing shown in FIG. 9 is similar to that shown in FIG. 11. As shown in FIG. 11, the unit pixel 762 outputs the output signal IR1 modulated in the temporally pseudo-random manner at the timing when the infrared LED lamp unit 140 emits the third infrared light. Herein, timings of emission and modulation of the light emitted by the headlight of the oncoming vehicle are different in pattern from those shown in FIGS. 9 and 11. Accordingly, the camera unit 730 captures the output signal IR1 from the unit pixel 762 of the solid-state imaging device 160 at the timing when the the headlight module 700 emits the infrared light linearly polarized in the first direction. As a result, the headlight module 700 can readily reduce the influence of the light emitted by the headlight of the oncoming vehicle and extract only the third infrared light emitted thereby.

An output signal IR2 outputted from the unit pixel 763 of the solid-state imaging device 160 when the solid-state imaging device 160 receives the fourth infrared light modulated in the temporally pseudo-random manner and emitted at the timing shown in FIG. 37 is similar to that shown in FIG. 38. As shown in FIG. 38, the unit pixel 763 outputs the output signal IR2 modulated in the temporally pseudo-random manner at the timing when the infrared LED lamp unit 140 emits the fourth infrared light. As in the case of the third infrared light, the timings of emission and modulation of the light emitted by the headlight of the oncoming vehicle are different in pattern from those shown in FIGS. 37 and 38. Accordingly, the camera unit 730 captures the output signal IR2 from the unit pixel 763 of the solid-state imaging device 160 at the timing when the headlight module 700 emits the fourth infrared light. As a result, the headlight module 700 can readily reduce the influence of the light emitted by the headlight of the oncoming vehicle and extract only the fourth infrared light emitted thereby.

The solid-state imaging device 160 outputs the output signals IR1 and IR2 at the timings shown in FIGS. 11 and 38. The A/D conversion unit 101 receives the analog signals (output signals IR1 and IR2) from the solid-state imaging device 160, and converts each of the analog signals into a digital signal (S102). The frame memory 102 stores therein the digital signal obtained from the A/D conversion by the A/D conversion unit 101. The DC detection unit 109 of the detection unit 104 determines whether or not the signal stored in the frame memory 102 is saturated due to, for example, the light emitted by the headlight of the oncoming vehicle (S103). In other words, the DC detection unit 109 determines whether a signal level of the signal generated by the solid-state imaging device 160 is equal to or more than a predetermined signal level.

If the output signal IR1 is saturated ("Yes" in S103), the light attenuation unit 105 attenuates the light to be received by the solid-state imaging device 160 until the signal stored in the frame memory 102 has a predetermined intensity (S104). Herein, the light attenuation unit 105 may be an optical aperture or an ND (Neutral Density) filter. A signal can be extracted from the output signal IR1 by the light attenuation even when the output signal IR1 is saturated due to the influence of the light emitted by the headlight of the oncoming vehicle. Also in the case where the output signal IR2 is saturated, the aforementioned operations are performed.

If the DC detection unit 109 determines that the output signal IR1 is not saturated ("No" in S103) or after the light attenuation (S104), the DC detection unit 109 detects a signal having a DC component, which is generated due to the influence of the light emitted by the headlight of the oncoming vehicle (S105). For example, the DC detection unit 109 detects a signal level of the signal outputted from the unit pixel 762 at a period during which the first infrared LED lamp unit 740 does not emit the third infrared light, thereby detecting the signal having the DC component, which is generated due to the influence of the light emitted by the headlight of the oncoming vehicle. Herein, the DC detection unit 109 may detect a signal level of the signal outputted from the unit pixel 763 at a period during which the second infrared LED lamp unit 741 does not emit the fourth infrared light.

Next, the AC detection unit 110 detects a signal corresponding to light different in frequency component from the third infrared light emitted by the first infrared LED lamp unit 740 or the fourth infrared light emitted by the second infrared LED lamp unit 741, on the basis of the pulse signal 205 (S106). Herein, an order of the DC detection (S105) and the AC detection (S106) may be optional. For example, the DC detection may be performed after the AC detection. Alternatively, the DC detection and the AC detection may be performed simultaneously.

The extraction unit 111 removes the signal having the DC component, which is generated due to the light emitted by the headlight of the oncoming vehicle and is detected by the DC detection unit 109 in Step S105, and the signal having the AC component, which is generated due to the light emitted by the headlight of the oncoming vehicle and is detected by the AC detection unit 110 in Step S106, from the signal stored in the frame memory 102, thereby extracting only a component of the third infrared light emitted by the first infrared LED lamp unit 740 or the fourth infrared light emitted by the second infrared LED lamp unit 741 (S107). The frame memory 106 stores therein a signal corresponding the component, which is extracted by the extraction unit 111, of the third infrared light or the fourth infrared light emitted by the first infrared LED lamp unit 740 or the second infrared LED lamp unit 741.

The image synthesis unit 107 synthesizes an image taken in a frame during which the first infrared LED lamp unit 740 emits the third infrared light and an image taken in a frame during which the second infrared LED lamp unit 741 emits the fourth infrared light, on the basis of the signal stored in the frame memory 106 (S108). Thus, an image to be displayed gives no uncomfortable feeling to a user.

The image output unit 108 outputs an image synthesized by the image synthesis unit 107 (S109). For example, the image output unit 108 outputs the image to the display unit (display) mounted on the interior of the vehicle, so that the user (driver) can see the image taken from the infrared light and displayed on the display unit.

Herein, the solid-state imaging device 160 may be a CCD sensor or a MOS sensor. Since the solid-state imaging device 160 reads out a signal at a high speed in a pseudo-random manner, a MOS sensor is preferably used as the solid-state imaging device 160.

As described above, the headlight module 700 according to the seventh embodiment of the present invention has similar advantages to those of the headlight module 100 according to the first embodiment of the present invention. Furthermore, the headlight module 700 according to the seventh embodiment of the present invention uses polarized light as detection light (probe light) and, therefore, can reduce an influence of ambient light having various directions of polarization.

Also in the headlight module 700 according to the seventh embodiment of the present invention, the timing of emission of the infrared light by the first infrared LED lamp unit 740 is opposite to the timing of emission of the infrared light by the second infrared LED lamp unit 741. Accordingly, one of the third infrared light and the fourth infrared light is emitted at all times; therefore, an image can be generated without loss. In addition, such an image can be synthesized readily; therefore, a high-quality image can be generated.

Also in the headlight module 700 according to the seventh embodiment of the present invention, the direction of polarization of the third infrared light emitted by the first infrared LED lamp unit 740 is orthogonal to the direction of polarization of the fourth infrared light emitted by the second infrared LED lamp unit 741. Accordingly, a ratio of polarization between the third infrared light and the fourth infrared light becomes maximum, so that an S/N ratio can be improved.

In the foregoing description, the first infrared LED lamp unit 740 includes the pulse generation unit 203 and the second infrared LED lamp unit 741 includes the pulse generation unit 213. Alternatively, one of the first infrared LED lamp unit 740 and the second infrared LED lamp unit 741 may include a pulse generation unit, and a pulse signal generated by the pulse generation unit may be transmitted to either the first infrared LED lamp unit 740 or the second infrared LED lamp unit 741 including no pulse generation unit. Still alternatively, the camera unit 730 may include a pulse generation unit, and a pulse signal generated by the pulse generation unit may be transmitted to each of the first infrared LED lamp unit 740 and the second infrared LED lamp unit 741 including no pulse generation unit.

Eighth Embodiment

A headlight module according to the eighth embodiment of the present invention is a modification of the headlight module 700 according to the seventh embodiment of the present invention. The headlight module according to the eighth embodiment of the present invention changes a direction of polarization of infrared light emitted by a signal infrared LED, thereby emitting third infrared light and fourth infrared light which are modulated in a temporally pseudo-random manner and are linearly polarized in different directions.

First, a configuration of the headlight module according to the eighth embodiment of the present invention is described.

Figure 53:
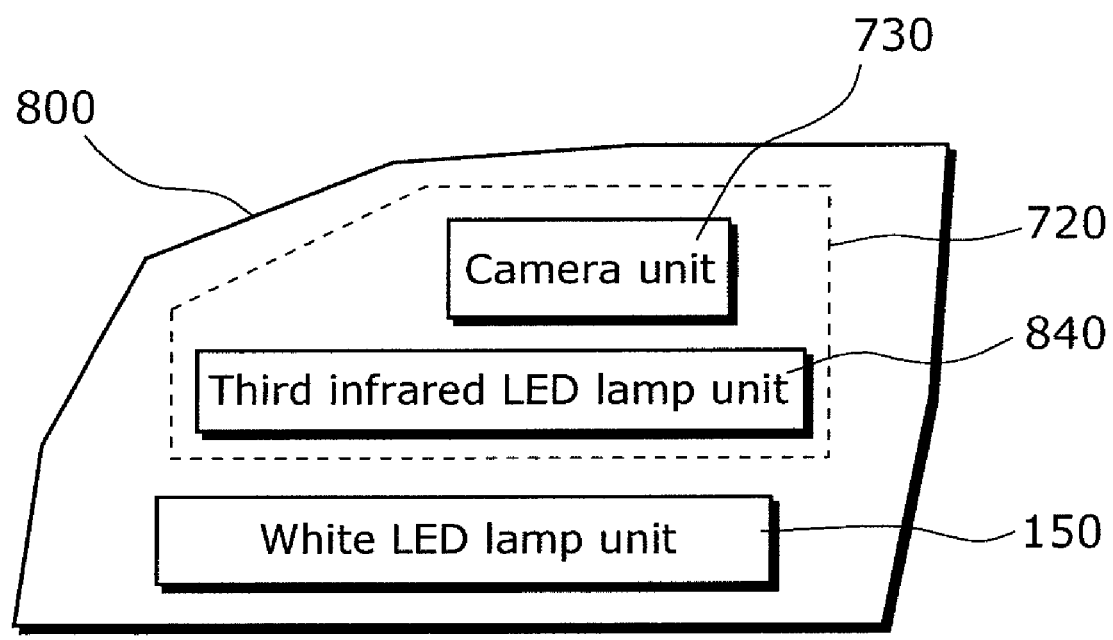
FIG. 53 shows a schematic configuration of a headlight module according to an eighth embodiment of the present invention.

FIG. 53 shows a schematic configuration of the headlight module according to the eighth embodiment of the present invention. As shown in FIG. 53, the headlight module 800 includes a night-vision imaging apparatus 720 and a white LED lamp unit 150. The night-vision imaging apparatus 720 includes a camera unit 730 and a third infrared LED lamp unit 840. In FIG. 53, similar constituent elements to those in FIG. 44 are denoted by identical reference numerals to those in FIG. 44.

The third infrared LED lamp unit 840 emits the infrared light to a forward area of a vehicle on which the headlight module according to the eighth embodiment of the present invention is mounted. Then, the camera unit 730 receives the infrared light reflected from an object on the forward area to take an image from the received infrared light.

The third infrared LED lamp unit 840 emits, as a high beam, two kinds of infrared light which are different in direction of polarization from each other. Specifically, the third infrared LED lamp unit 840 emits third infrared light as infrared light linearly polarized in a first direction and fourth infrared light as infrared light linearly polarized in a second direction. In the eighth embodiment of the present invention, each of the infrared light linearly polarized in the first direction and the infrared light linearly polarized in the second direction is near-infrared light.

As in the first embodiment of the present invention, the third infrared LED lamp unit 840 constantly lights up when the white LED lamp unit 150 is on. In other words, infrared light is emitted when white light is emitted through a user's switching operation, so that a user obtains an image taken from infrared light. Accordingly, when the user switches the headlight on as in the conventional operation, the headlight lights up and, simultaneously, an image taken from infrared light is displayed. This improves user's convenience.

Herein, the camera unit 730, the third infrared LED lamp unit 840 and the white LED lamp unit 150 are provided in this order from above as shown in FIG. 53; however, a placement order and a position of the aforementioned units are not limited to those shown in FIG. 53. The headlight module 800 according to the eighth embodiment of the present invention may be mounted on a vehicle such as an automobile, a bus or a truck.

Next, the third infrared LED lamp unit 840 is described.

Figure 54:
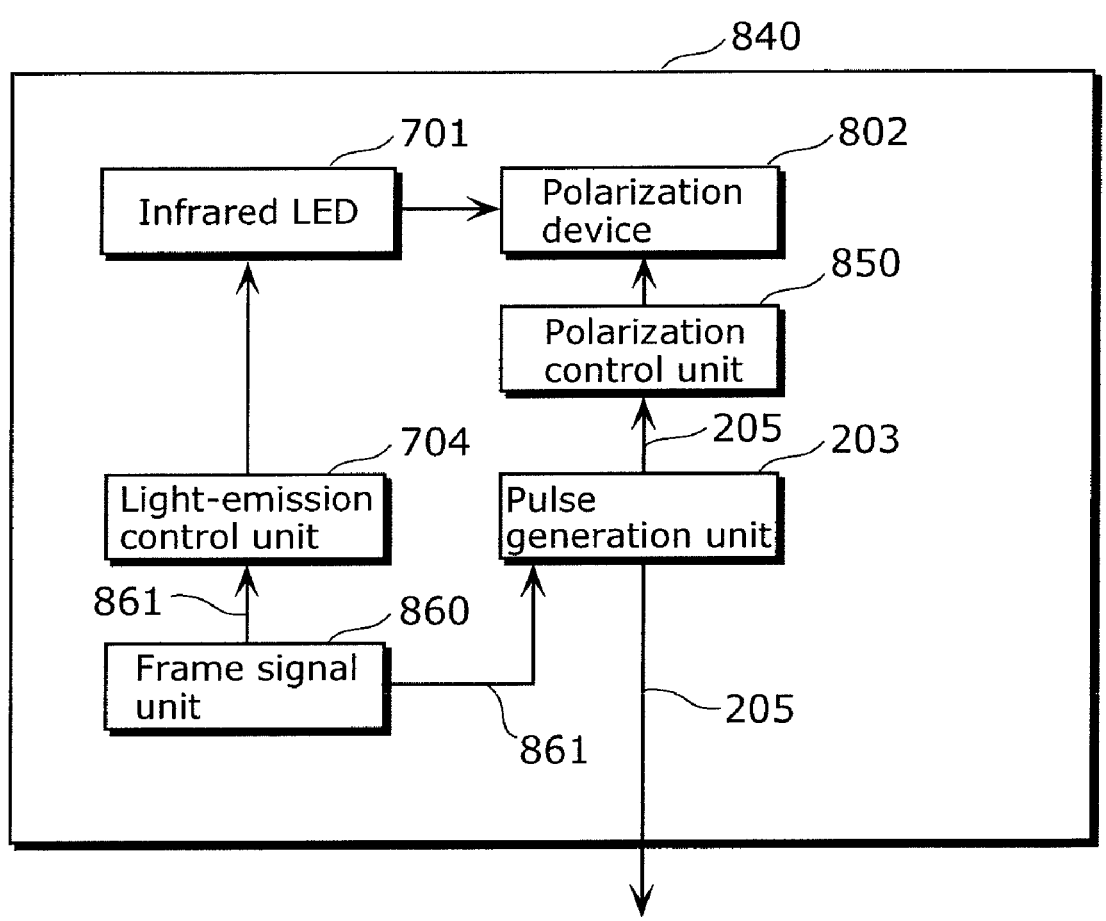
FIG. 54 shows a schematic configuration of a third infrared LED lamp unit according to the eighth embodiment of the present invention.

FIG. 54 shows a block diagram of a configuration of the third infrared LED lamp unit 840. The third infrared LED lamp unit 840 includes an infrared LED 701, a polarization device 802, a light-emission control unit 704, a pulse generation unit 203, a polarization control unit 850 and a frame signal unit 860. In FIG. 54, similar constituent elements to those in FIG. 45 are denoted by identical reference numerals to those in FIG. 45.

The infrared LED 701 emits the infrared light under control by the light-emission control unit 704. The pulse generation unit 203 generates a pulse signal 205 modulated in the temporally pseudo-random manner. The pulse generation unit 203 outputs the pulse signal 205 to each of the polarization control unit 850 and the camera unit 730.

The frame signal unit 860 generates a pulse signal 861 indicating a timing of changeover between the blanking period T1 and the imaging period T2 in FIG. 8. For example, the pulse signal 861 becomes "H" level at the blanking period T1, but becomes "L" level at the imaging period T2.

The light-emission control unit 704 allows the infrared LED 701 to emit the infrared light on the basis of the timing indicated by the pulse signal 861 from the frame signal unit 860. That is, the light-emission control unit 704 allows the infrared LED 701 to emit the infrared light during the imaging period T2.

Figure 55:
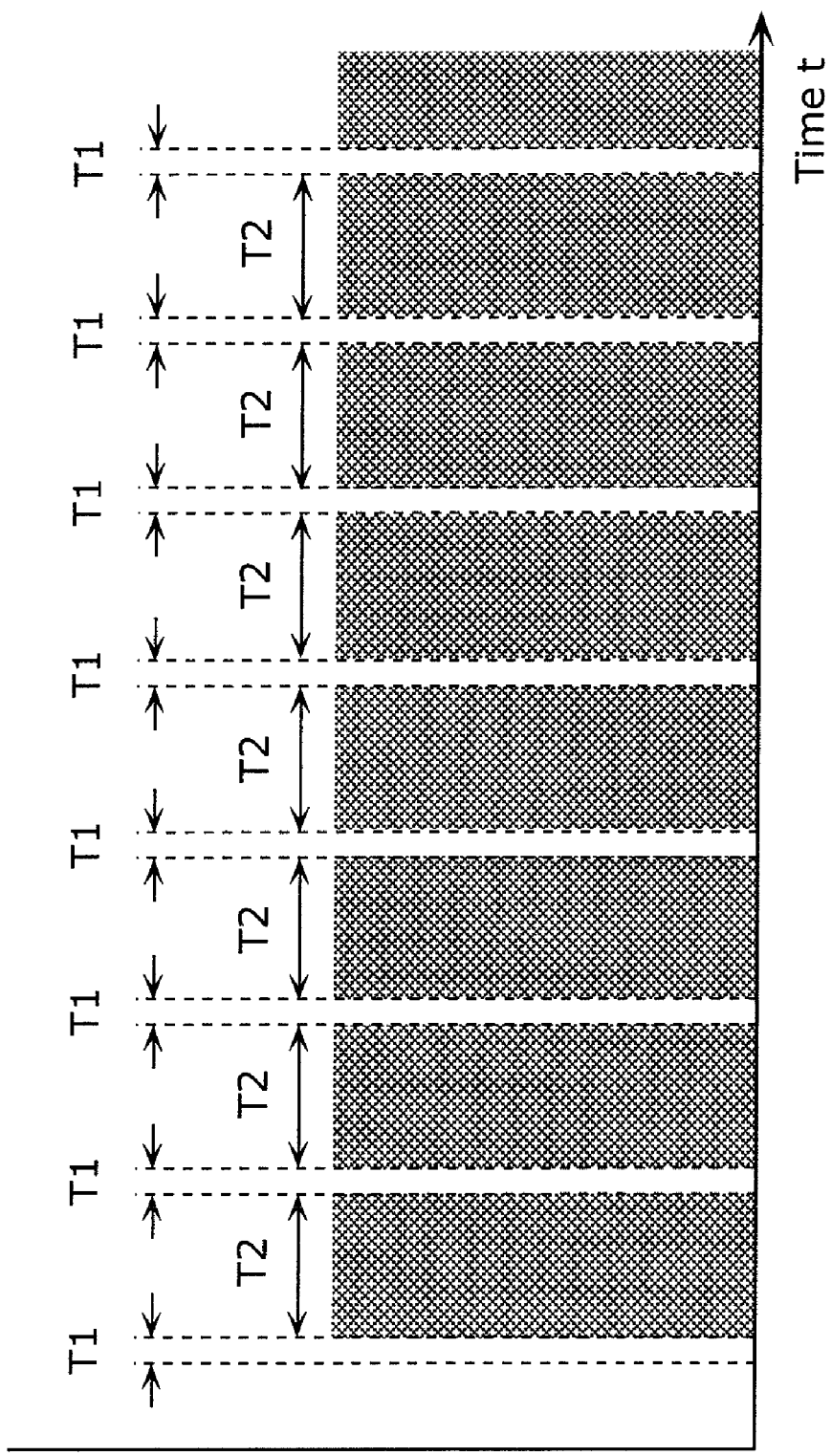
FIG. 55 shows a timing of emission of infrared light by an infrared LED in the third infrared LED lamp unit according to the eighth embodiment of the present invention.

FIG. 55 shows a timing of emission of the infrared light by the infrared LED 701 in the third infrared LED lamp unit 840. As shown in FIG. 55, the light-emission control unit 704 allows the infrared LED 701 to emit the infrared light during the imaging period T2.

The polarization device 802 linearly polarizes the infrared light, which is emitted by the infrared LED 701, in the first direction or the second direction.

The polarization control unit 850 changes the direction polarized by the polarization device 802, according to the timing indicated by the pulse signal 205 from the pulse generation unit 203. Specifically, the polarization control unit 850 rotates the polarization device 802 by 90 degrees, thereby changing the direction polarized by the polarization device 802 to the first direction or the second direction. Herein, the polarization control unit 850 rotates the polarization device 802 at the blanking period T1 in order to change the direction polarized by the polarization device 802. Thus, the third infrared LED lamp unit 840 emits the third infrared light which is modulated in the temporally pseudo-random manner and is linearly polarized in an almost vertical direction, and the fourth infrared light which is modulated in the temporally pseudo-random manner and is linearly polarized in an almost horizontal direction. Furthermore, the timing of emission of the third infrared light by the third infrared LED lamp unit 840 is opposite to the timing of emission of the fourth infrared light by the third infrared LED lamp unit 840. For example, the third infrared LED lamp unit 840 emits the third infrared light at the timing shown in FIG. 9 and emits the fourth infrared light at the timing shown in FIG. 37.

As described above, the headlight module 800 according to the eighth embodiment of the present invention changes the direction polarized by the polarization device 802 in the temporally pseudo-random manner, thereby emitting the third infrared light and the fourth infrared light each of which is modulated in the temporally pseudo-random manner. Thus, the eighth embodiment can bring about advantages similar to those in the first embodiment. That is, a timing of emission of infrared light by the headlight module 800 according to the eighth embodiment of the present invention is different from a timing of emission of light by the headlight of the oncoming vehicle. Therefore, the headlight module 800 can readily reduce the influence of the light emitted by the headlight light of the oncoming vehicle and extract only the infrared light emitted thereby.

In the headlight module 800 according to the eighth embodiment of the present invention, the polarization control unit 850 changes the direction polarized by the polarization device 802 at the blanking time T1 during which no imaging operation is performed. Therefore, the polarization control unit 850 can change the direction of polarization of the infrared light emitted by the third infrared LED lamp unit 840 without exertion of an influence on the imaging operation.

Herein, a liquid crystal device may be used for changing the direction of polarization of the infrared light emitted by the third infrared LED lamp unit 840.

Figure 56:
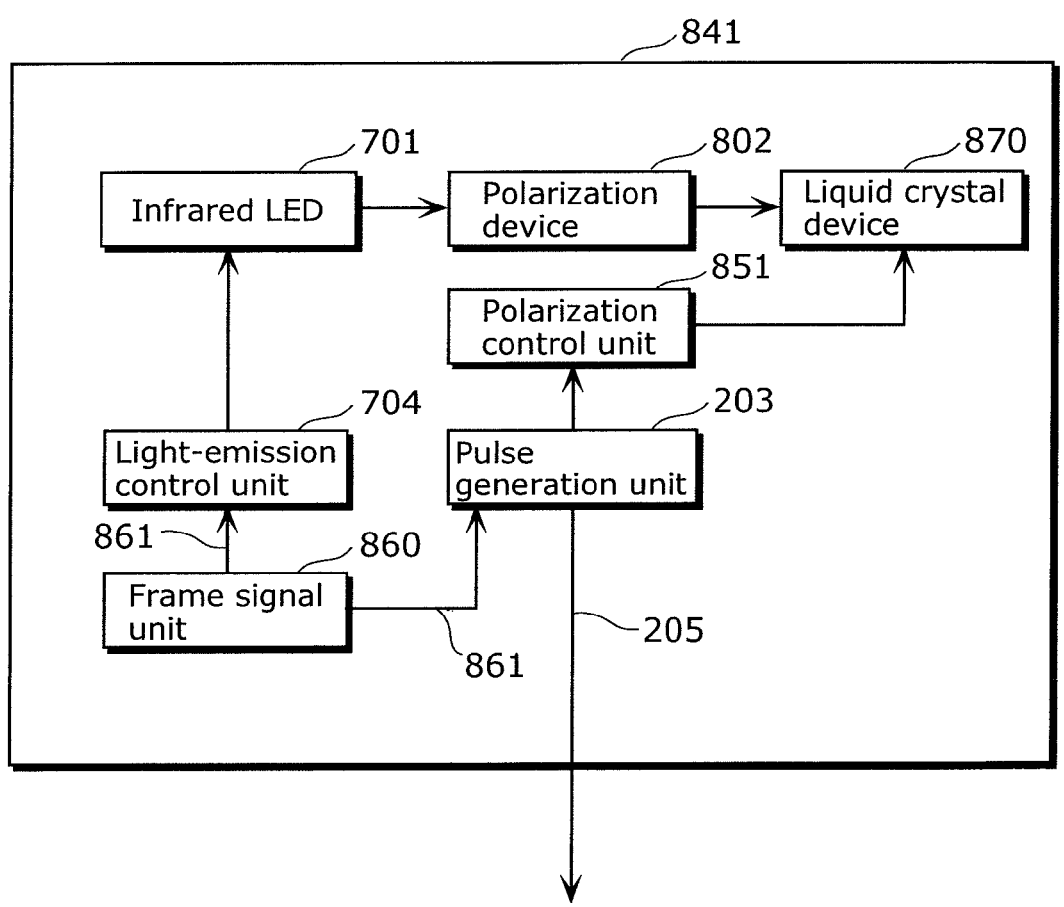
FIG. 56 shows a modified schematic configuration of the third infrared LED lamp unit according to the eighth embodiment of the present invention.

FIG. 56 shows a block diagram of a configuration of a modified third infrared LED lamp unit in the headlight module 800 according to the eighth embodiment of the present invention. In FIG. 56, similar constituent elements to those in FIG. 54 are denoted by identical reference numerals to those in FIG. 54.

The third infrared LED lamp unit 841 shown in FIG. 56 is different from the third infrared LED lamp unit 840 shown in FIG. 54 in the following points. That is, the third infrared LED lamp unit 841 newly includes a liquid crystal device 870, and includes a polarization control unit 851 in place of the polarization control unit 850.

The liquid crystal device 870 shifts a phase of infrared light linearly polarized by a polarization device 802. The liquid crystal device 870 shifts the phase of the infrared light according to a voltage to be applied thereto.

Figure 57:
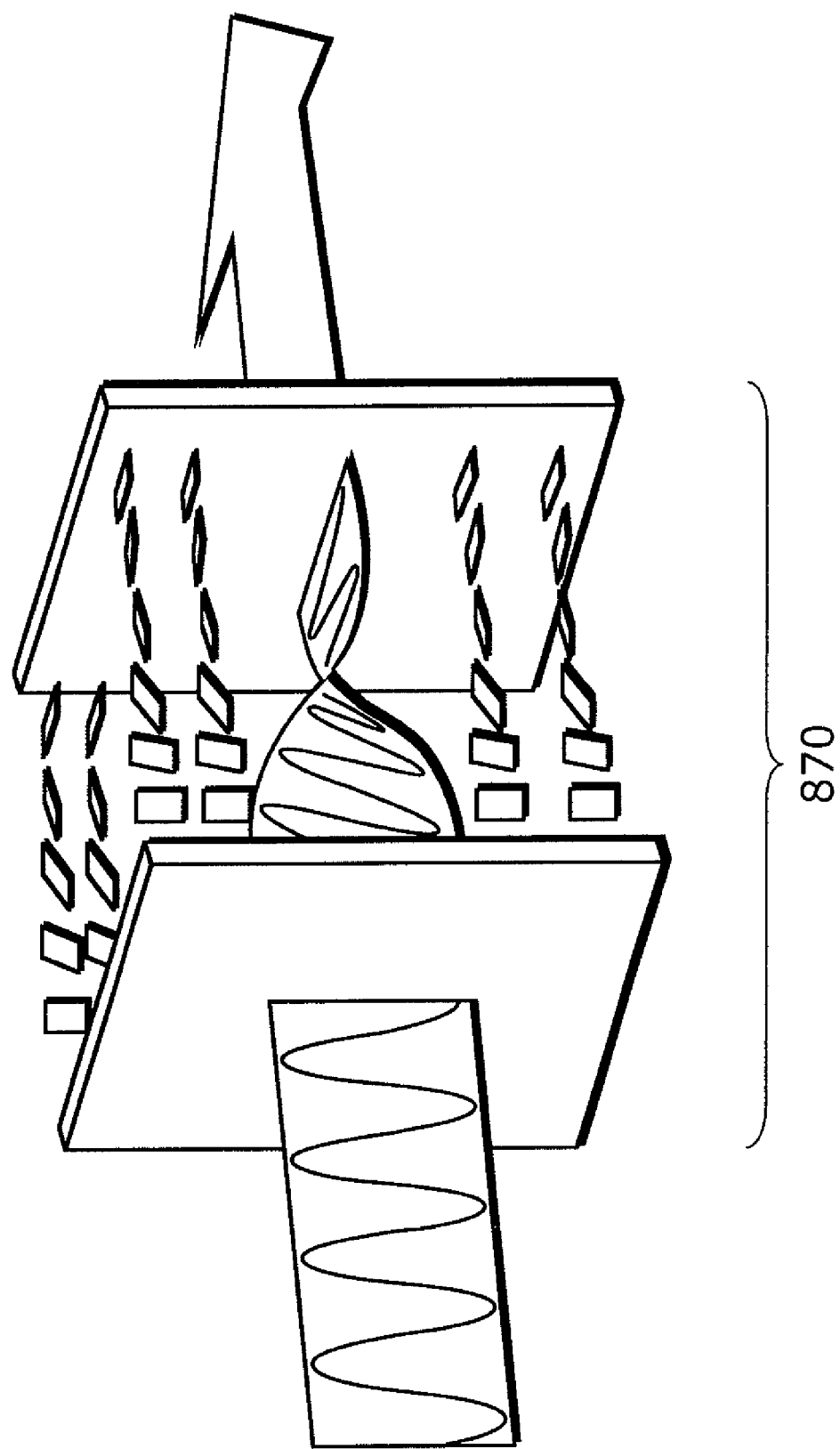
FIG. 57 schematically shows characteristics of a liquid crystal device.
Figure 58:
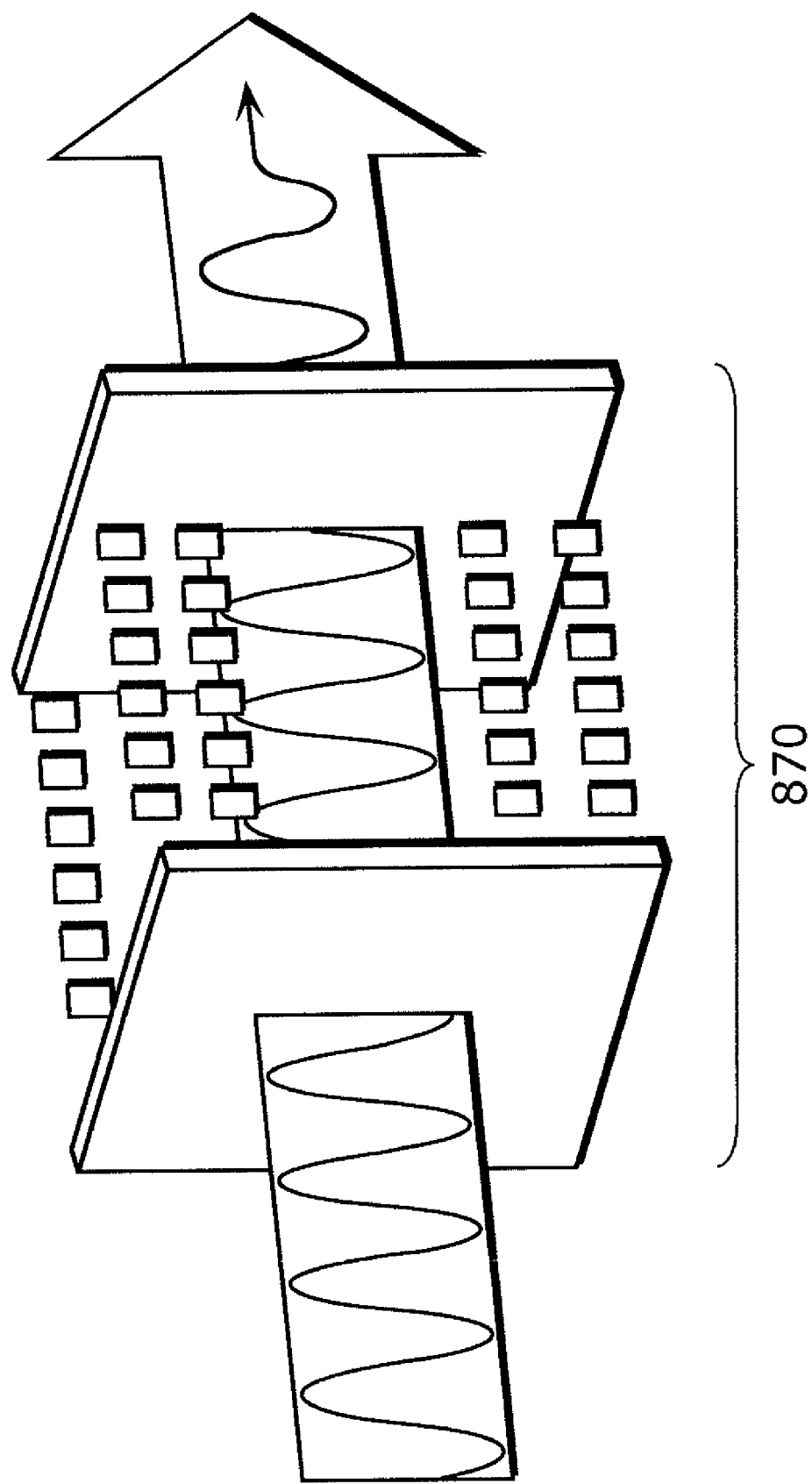
FIG. 58 schematically shows characteristics of the liquid crystal device.

FIG. 57 schematically shows a characteristic of the liquid crystal device 870 in a state that no voltage is applied to the liquid crystal device 870. FIG. 58 schematically shows a characteristic of the liquid crystal device 870 in a state that a voltage is applied to the liquid crystal device 870. As shown in FIG. 57, the liquid crystal device 870, to which no voltage is applied, shifts a phase of incident light by 90 degrees, and then outputs the light. As shown in FIG. 58, the liquid crystal device 870, to which a voltage is applied, outputs incident light without shifting a phase of the incident light.

The polarization control unit 851 changes a voltage to be applied to the liquid crystal device 870, thereby changing an amount of shift of the phase shifted by the liquid crystal device 870. According to the timing indicated by the pulse signal 205 from the pulse generation unit 203, the polarization control unit 851 changes the voltage to be applied to the liquid crystal device 870. Herein, the polarization control unit 851 changes the voltage to be applied to the liquid crystal device 870 at the blanking period T1. Thus, the third infrared LED lamp unit 841 emits third infrared light which is modulated in the temporally pseudo-random manner and is linearly polarized in an almost vertical direction and fourth infrared light which is modulated in the temporally pseudo-random manner and is linearly polarized in an almost horizontal direction.

Figure 59:
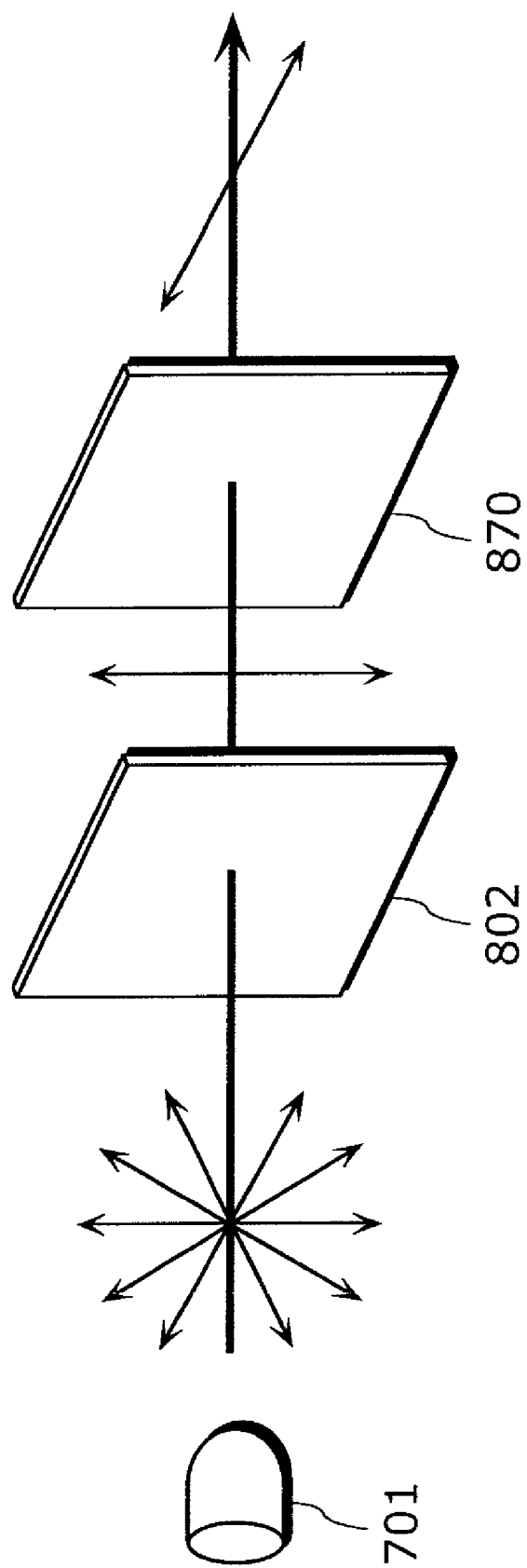
FIG. 59 schematically shows a state that a polarization device and the liquid crystal device polarize light emitted by the infrared LED, in the third infrared LED lamp unit according to the eighth embodiment of the present invention.

FIG. 59 schematically shows a state that the light emitted by the infrared LED 701 is polarized by the polarization device 802 and the liquid crystal device 870 to which no voltage is applied. As shown in FIG. 59, from among the light which is emitted by the infrared LED 701 and is not linearly polarized, the polarization device 802 transmits only light having a polarization component which is almost perpendicular to the ground. The liquid crystal device 870 shifts a phase of the light, which transmits through the polarization device 802 and has the polarization component almost perpendicular to the ground, by 90 degrees, and outputs the infrared light linearly polarized in a direction almost parallel to the ground.

Figure 60:
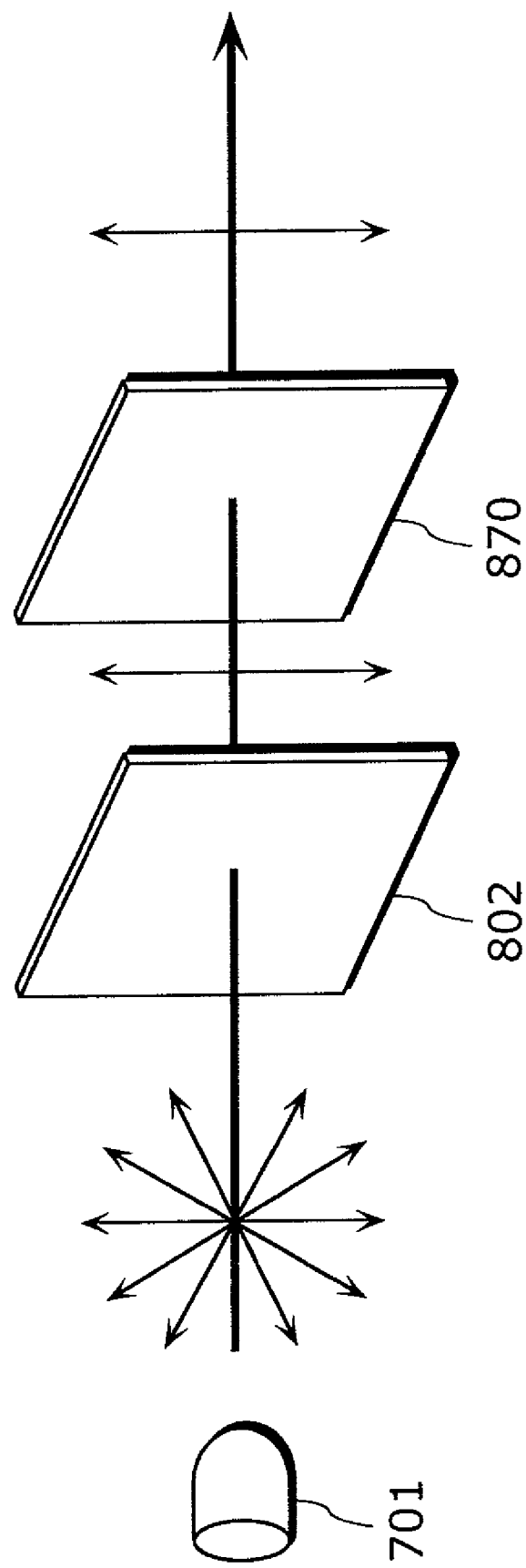
FIG. 60 schematically shows a state that the polarization device and the liquid crystal device polarize light emitted by the infrared LED, in the third infrared LED lamp unit according to the eighth embodiment of the present invention.

FIG. 60 schematically shows a state that the light emitted by the infrared LED 701 is polarized by the polarization device 802 and the liquid crystal device 870 to which a voltage is applied. As shown in FIG. 60, from among the light which is emitted by the infrared LED 701 and is not linearly polarized, the polarization device 802 transmits only light having a polarization component which is almost perpendicular to the ground. The liquid crystal device 870 outputs the infrared light which is linearly polarized in a direction almost perpendicular to the ground, without shifting the phase of the light which transmits through the polarization device 802 and has the polarization component almost perpendicular to the ground.

As described above, the third infrared LED lamp unit 841 can emit the third infrared light and the fourth infrared light which are modulated in the pseudo-random manner. Thus, the third infrared LED lamp unit 841 can bring about advantages similar to those of the third infrared LED lamp unit 840. Furthermore, a direction of polarization is changed by control of a voltage to be applied to the liquid crystal device 870. Therefore, the direction of polarization can be readily changed at a high speed, as compared with a case of physically rotating the polarization device 802.

In the first embodiment of the present invention, a neutral filter or an aperture is used as the light attenuation unit 105. In the eighth embodiment of the present invention, however, the polarization device 802 and the polarization control unit 850, which controls the direction polarized by the polarization device 802, may be used as the light attenuation unit 105. It is possible to optionally change transmissivity of light by control of a direction of polarization and change of a ratio of polarization.

Specifically, the light attenuation unit 105 may include a polarization device which transmits infrared light having a predetermined linear polarization component, and a polarization control unit which rotates the polarization device to attenuate infrared light received by the unit pixels 762 of a solid-state imaging device 160 and linearly polarized in a first direction and infrared light received by the unit pixels 763 of the solid-state imaging device 160 and linearly polarized in a second direction. Thus, it is possible to attenuate light to be received by the solid-state imaging device 160 when a direction of polarization of infrared light by the polarization device is changed. Furthermore, the configuration of the light attenuation unit 105 is made identical to the configuration of the polarization device 802 and the polarization control unit 850 used in the third infrared LED lamp unit 840. As a result, it is possible to readily manage and control a system of the headlight module.

Furthermore, the aforementioned polarization device 802 and liquid crystal device 870 may be used. In other words, the light attenuation unit 105 may include a liquid crystal device for shifting a phase of infrared light to be received by each of the unit pixel 762 and the unit pixel 763 in the solid-state imaging device 160, and a polarization control unit for changing a voltage to be applied to the liquid crystal device to change an amount of shift of the phase shifted by the liquid crystal device. Thus, a direction of polarization can be readily changed at a high speed and light can be attenuated when a voltage to be applied to the liquid crystal device 870 is controlled. In addition, the configuration of the light attenuation 105 is made similar to the configuration of the liquid crystal device 870 and the configuration of the polarization control unit 851 used in the third infrared LED lamp unit 841. Thus, it is possible to manage and control the system of the headlight module.

In the third embodiment of the present invention, the headlight module emits single infrared light modulated using a spread spectrum system. However, the present invention is not limited thereto. In each of the fourth to eighth embodiments of the present invention, for example, the headlight module may emit infrared light modulated using the spread spectrum system.

In the sixth embodiment of the present invention, the headlight module for emitting two pieces of infrared light (first infrared light and second infrared light) which are different in wavelength from each other includes the first headlight module for emitting the first infrared light and receiving the second infrared light and the second headlight module for emitting the second infrared light and receiving the first infrared light, which are mounted on the right front side and the left front side of the vehicle. However, the present invention is not limited thereto. In the seventh embodiment of the present invention, for example, the headlight module for emitting two pieces of infrared light (third infrared light and fourth infrared light) which are different in direction of polarization from each other may include a first headlight module for emitting the third infrared light and receiving the fourth infrared light and a second headlight module for emitting the fourth infrared light and receiving the third infrared light, which are mounted on the right front side and the left front side of the vehicle.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a night-vision imaging apparatus. In particular, the present invention is applicable to a headlight module which is to be mounted on a vehicle such as an automobile and has a night scoping function for a vehicle.

What is claimed is:
1. A night-vision imaging apparatus, comprising:
a light emitter operable to emit infrared light;
a solid-state imager operable to convert the infrared light into a first signal;

a light-emission controller operable to allow said light emitter to emit the infrared light which is modulated according to a temporally pseudo-random first modulation; and an extractor operable to extract, according to the first modulation, a signal corresponding to the infrared light emitted by said light emitter from the first signal, wherein said light emitter is operable to emit first infrared light and second infrared light, said solid-state imager includes:

a first pixel which converts the first infrared light into the first signal; and a second pixel which converts the second infrared light into a second signal, said light-emission controller being operable to allow said light emitter to emit the first infrared light which is modulated according to the temporally pseudo-random first modulation, and is operable to allow said light emitter to emit the second infrared light which is modulated according to a temporally pseudo-random second modulation different from the first modulation, said extractor being operable to extract, according to the first modulation, a signal corresponding to the first infrared light emitted by said light emitter from the first signal, and is operable to extract, according to the second modulation, a signal corresponding to the second infrared light emitted by said light emitter from the second signal.

2. The night-vision imaging apparatus of claim 1, said night-vision imaging apparatus further comprising:

a pulse generator operable to generate a pulse signal modulated in a temporally pseudo-random manner using a spread spectrum system, wherein said light-emission controller is operable to allow said light emitter to emit the infrared light at a timing of change of the pulse signal, and said extractor is operable to extract the signal corresponding to the infrared light emitted by said light emitter from the first signal at the timing of change of the pulse signal.

3. The night-vision imaging apparatus of claim 1, wherein the first modulation and the second modulation are temporally opposite to each other.

4. The night-vision imaging apparatus of claim 1, wherein said light emitter includes:

a first infrared LED which emits the first infrared light which is infrared light at a first wavelength; and a second infrared LED which emits the second infrared light which is infrared light at a second wavelength different from the first wavelength, said first pixel converts infrared light at the first wavelength into the first signal, and said second pixel converts infrared light at the second wavelength into the second signal.

5. The night-vision imaging apparatus of claim 1, wherein said light emitter is operable to emit the first infrared light linearly polarized in a first direction, and the second infrared light linearly polarized in a second direction different from the first direction, said first pixel converts, into the first signal, the infrared light linearly polarized in the first direction, and said second pixel converts, into the second signal, the infrared light linearly polarized in the second direction.

6. The night-vision imaging apparatus of claim 5, wherein the first direction is orthogonal to the second direction.

7. The night-vision imaging apparatus of claim 5, wherein said light emitter includes:

a first infrared LED which emits infrared light;

a first polarizer operable to linearly polarize, in the first direction, the infrared light emitted by said first infrared LED;

a second infrared LED which emits infrared light; and a second polarizer operable to linearly polarize, in the second direction, the infrared light emitted by said second infrared LED.

8. The night-vision imaging apparatus of claim 5, wherein said light emitter includes:

an infrared LED which emits infrared light; and a polarizer operable to linearly polarize, in one of the first direction and the second direction, the infrared light emitted by said infrared LED.

9. The night-vision imaging apparatus of claim 8, wherein said polarizer includes:

a polarization device operable to linearly polarize the infrared light emitted by said infrared LED; and a rotator operable to rotate said polarization device to change a direction polarized by said polarization device to one of the first direction and the second direction.

10. The night-vision imaging apparatus of claim 9, wherein said rotator is operable to rotate said polarization device at a blanking period.

11. The night-vision imaging apparatus of claim 8, wherein said polarizer includes:

a polarization device operable to linearly polarize the infrared light emitted by said infrared LED;

a liquid crystal device operable to shift a phase of the infrared light linearly polarized by said polarization device; and a voltage applicator operable to change a voltage to be applied to said liquid crystal device to change an amount of shift of the phase shifted by said liquid crystal device.

12. The night-vision imaging apparatus of claim 11, wherein said voltage applicator is operable to change the voltage to be applied to said liquid crystal device at a blanking period.

13. The night-vision imaging apparatus of claim 5, said night-vision imaging apparatus further comprising:

a detector operable to determine whether an intensity of at least one of the first signal and the second signal is at least equal to a predetermined intensity; and a light attenuator operable to attenuate infrared light received by said solid-state imager when said detector determines that the intensity of at least one of the first signal and the second signal is at least equal to the predetermined intensity.

14. The night-vision imaging apparatus of claim 13, wherein said light attenuator includes:

a polarization device operable to transmit infrared light having a predetermined linear polarization component; and a rotator operable to rotate said polarization device to attenuate the infrared light received by said solid-state imager.

15. The night-vision imaging apparatus of claim 13, wherein said light attenuator includes:

a liquid crystal device operable to shift a phase of infrared light received by said solid-state imager; and a voltage applicator operable to change a voltage to be applied to said liquid crystal device to change an amount of shift of the phase shifted by said liquid crystal device.

16. The night-vision imaging apparatus of claim 1, said night-vision imaging apparatus further comprising a white LED which emits white light, wherein said light emitter is operable to light up when said white LED is on.

17. The night-vision imaging apparatus of claim 1, wherein said light emitter is used as a light source for a high beam.

18. A night-vision imaging apparatus, comprising:
a light emitter operable to emit infrared light;
a solid-state imager operable to convert the infrared light into a first signal;
a light-emission controller operable to allow said light emitter to emit the infrared light which is modulated according to a temporally pseudo-random first modulation; and
an extractor operable to extract, according to the first modulation, a signal corresponding to the infrared light emitted by said light emitter from the first signal,
wherein said solid-state imager includes:
a first pixel which converts the infrared light into the first signal; and
a second pixel which converts light at a visible wavelength into a second signal.

19. A night-vision imaging apparatus, comprising:
a light emitter operable to emit infrared light;
a solid-state imager operable to convert the infrared light into a first signal;
a light-emission controller operable to allow said light emitter to emit the infrared light which is modulated according to a temporally pseudo-random first modulation; and
an extractor operable to extract, according to the first modulation, a signal corresponding to the infrared light emitted by said light emitter from the first signal,
wherein said solid-state imager includes:
a first pixel which has a sensitivity at a wavelength of infrared light;
a second pixel which has a sensitivity at a wavelength of red light;
a third pixel which has a sensitivity at a wavelength of green light; and
a fourth pixel which has a sensitivity at a wavelength of blue light.

20. A night-vision imaging apparatus, comprising:
a light emitter operable to emit infrared light;
a solid-state imager operable to convert the infrared light into a first signal;
a light-emission controller operable to allow said light emitter to emit the infrared light which is modulated according to a temporally pseudo-random first modulation; and
an extractor operable to extract, according to the first modulation, a signal corresponding to the infrared light emitted by said light emitter from the first signal,
wherein said solid-state imager includes a plurality of pixels, and
each of said pixels includes:
a light receiver operable to receive at least one of infrared light and visible light; and
a light transmitting film having a refractive index distribution formed on said light receiving device.

21. A headlight module, comprising:
a light emitter operable to emit infrared light;
a solid-state imager operable to convert the infrared light into a first signal;
a light-emission controller operable to allow said light emitter to emit the infrared light which is modulated according to a temporally pseudo-random first modulation; and
an extractor operable to extract, according to the first modulation, a signal corresponding to the infrared light emitted by said light emitter from the first signal,
wherein said light emitter includes:
a first infrared LED which emits first infrared light; and
a second infrared LED which emits second infrared light,
said solid-state imager includes:
a first pixel which converts the first infrared light into the first signal; and
a second pixel which converts the second infrared light into a second signal,
said light-emission controller being operable to allow said first infrared LED to emit the first infrared light which is modulated according to the temporally pseudo-random first modulation, and is operable to allow said second infrared LED to emit the second infrared light which is modulated according to a temporally pseudo-random second modulation different from the first modulation, and
said extractor extracts, according to the first modulation, a signal corresponding to the first infrared light emitted by said light emitter from the first signal, and extracts, according to the second modulation, a signal corresponding to the second infrared light emitted by said light emitter from the second signal,
said headlight module further comprising:
a first module which includes said first infrared LED and said second pixel and is installed in one of a right front side and a left front side of a vehicle; and
a second module which includes said second infrared LED and said first pixel and is installed in other than the right front side and the left front side of the vehicle.

* * * * *